United States Patent
Kodama et al.

(10) Patent No.: US 11,834,600 B2
(45) Date of Patent: Dec. 5, 2023

(54) LIQUID CRYSTAL COMPOSITION, OPTICAL FILM, CIRCULARLY POLARIZING PLATE FOR ORGANIC EL DISPLAY, AND METHOD FOR PRODUCING OPTICALLY ANISOTROPIC LAYER

(71) Applicant: FUJIFILM Corporation, Tokyo (JP)

(72) Inventors: Keisuke Kodama, Kanagawa (JP); Yuki Fukushima, Kanagawa (JP); Shunya Katoh, Kanagawa (JP); Yuta Takahashi, Kanagawa (JP); Shinpei Yoshida, Kanagawa (JP); Satoshi Yanokuchi, Kanagawa (JP); Akira Maruyama, Kanagawa (JP); Hiroyuki Hagio, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 125 days.

(21) Appl. No.: 17/670,906

(22) Filed: Feb. 14, 2022

(65) Prior Publication Data

US 2022/0204855 A1 Jun. 30, 2022

Related U.S. Application Data

(63) Continuation of application No. PCT/JP2020/030871, filed on Aug. 14, 2020.

(30) Foreign Application Priority Data

Aug. 16, 2019 (JP) .................................. 2019-149419
Sep. 26, 2019 (JP) .................................. 2019-175987
(Continued)

(51) Int. Cl.
*C09K 19/58* (2006.01)
*G02B 5/30* (2006.01)
(Continued)

(52) U.S. Cl.
CPC ........ *C09K 19/588* (2013.01); *C09K 19/2007* (2013.01); *G02B 5/3016* (2013.01); *H10K 50/86* (2023.02); *C09K 2019/2078* (2013.01)

(58) Field of Classification Search
CPC .............. C09K 19/588; C09K 19/2007; C09K 2019/2078; G02B 5/3016
(Continued)

(56) References Cited

U.S. PATENT DOCUMENTS

2014/0284583 A1 9/2014 Saitoh et al.
2020/0102500 A1* 4/2020 Kodama .............. G03B 21/604
2020/0110202 A1 4/2020 Kodama et al.

FOREIGN PATENT DOCUMENTS

JP 2002-179669 A 6/2002
JP 2002-338575 A 11/2002
(Continued)

OTHER PUBLICATIONS

International Search Report issued in PCT/JP2020/030871 dated Nov. 2, 2020.
(Continued)

*Primary Examiner* — Charles S Chang
(74) *Attorney, Agent, or Firm* — Edwards Neils LLC; Jean C. Edwards, Esq.

(57) ABSTRACT

Provided is a liquid crystal composition capable of forming an optically anisotropic layer, and method thereof, in which a variation in a twisted angle of liquid crystal compound in an in-plane direction is suppressed an optical film, and a circularly polarizing plate for an organic EL display. The liquid crystal composition contains a liquid crystal, optically active compound A which is a photosensitive optically active compound whose helical twisting power changes upon irradiation with light and has a molar absorption coefficient of 5,000 $M^{-1} \cdot cm^{-1}$ or more with respect to light
(Continued)

having a wavelength of 365 nm, and an optically active compound B having a molar absorption coefficient with respect to light having a wavelength of 365 nm smaller than the molar absorption coefficient of the optically active compound A, in which a mass content ratio of the optically active compound A to the liquid crystal compound is less than 0.01.

20 Claims, 8 Drawing Sheets

(30) Foreign Application Priority Data

| | | |
|---|---|---|
| Sep. 27, 2019 | (JP) | 2019-177831 |
| Dec. 26, 2019 | (JP) | 2019-237279 |
| Mar. 9, 2020 | (JP) | 2020-039823 |
| Jun. 1, 2020 | (JP) | 2020-095459 |
| Aug. 4, 2020 | (JP) | 2020-132253 |

(51) Int. Cl.
  *H10K 50/86* (2023.01)
  *C09K 19/20* (2006.01)

(58) Field of Classification Search
  USPC .............. 349/133, 171–172, 179, 184, 194
  See application file for complete search history.

(56) References Cited

FOREIGN PATENT DOCUMENTS

| | | |
|---|---|---|
| JP | 2003-306490 A | 10/2003 |
| JP | 2003-313188 A | 11/2003 |
| JP | 5960743 B2 | 8/2016 |
| WO | 2019/013284 A1 | 1/2019 |
| WO | 2019/013292 A1 | 1/2019 |

OTHER PUBLICATIONS

Written Opinion issued in PCT/JP2020/030871 dated Nov. 2, 2020.
International Preliminary Report on Patentability completed by WIPO dated Nov. 16, 2021 in connection with International Patent Application No. PCT/JP2020/030871.
Office Action, which was issued by the Japanese Patent Office dated Mar. 7, 2023, in connection with Japanese Patent Application No. 2021-540763.

\* cited by examiner

LIQUID CRYSTAL COMPOSITION, OPTICAL FILM, CIRCULARLY POLARIZING PLATE FOR ORGANIC EL DISPLAY, AND METHOD FOR PRODUCING OPTICALLY ANISOTROPIC LAYER

CROSS-REFERENCE TO RELATED APPLICATIONS

This application is a Continuation of PCT International Application No. PCT/JP2020/030871 filed on Aug. 14, 2020, which was published under PCT Article 21(2) in Japanese, and which claims priority under 35 U.S.C. § 119(a) to Japanese Patent Application No. 2019-149419 filed on Aug. 16, 2019, Japanese Patent Application No. 2019-175987 filed on Sep. 26, 2019, Japanese Patent Application No. 2019-177831 filed on Sep. 27, 2019, Japanese Patent Application No. 2019-237279 filed on Dec. 26, 2019, Japanese Patent Application No. 2020-095459 filed on Jun. 1, 2020, Japanese Patent Application No. 2020-039823 filed on Mar. 9, 2020 and Japanese Patent Application No. 2020-132253 filed on Aug. 4, 2020. The above applications are hereby expressly incorporated by reference, in their entirety, into the present application.

BACKGROUND OF THE INVENTION

1. Field of the Invention

The present invention relates to a liquid crystal composition, an optical film, a circularly polarizing plate for an organic EL display, and a method for producing an optically anisotropic layer.

2. Description of the Related Art

A retardation layer having refractive index anisotropy (optically anisotropic layer) is applied to various applications such as an antireflection film of a display device and an optical compensation film of a liquid crystal display device.

A laminated type optically anisotropic layer consisting of a plurality of layers as described in JP5960743B is disclosed as the optically anisotropic layer. In addition, JP5960743B discloses, as an example of a method for producing an optically anisotropic layer, a production method using a composition containing a liquid crystal compound and a non-photosensitive chiral agent (non-photosensitive optically active compound) whose helical twisting power does not change upon irradiation with light.

SUMMARY OF THE INVENTION

By the way, in recent years, an attempt has been made in the production of an optically anisotropic layer to use a photosensitive chiral agent (photosensitive optically active compound) whose helical twisting power changes upon irradiation with light, instead of the non-photosensitive chiral agent.

As a result of studying a method for producing an optically anisotropic layer containing a twist-aligned liquid crystal compound by changing a helical twisting power of a photosensitive chiral agent by exposure to light (for example, irradiation with light having a wavelength of 365 nm), using a liquid crystal composition containing a photosensitive chiral agent, with reference to the method for producing an optically anisotropic layer described in JP5960743B, the present inventors have clarified that a twisted angle of liquid crystal compound that forms a twisted alignment may vary in an in-plane direction of the optically anisotropic layer. In a case where the twisted angle of liquid crystal compound varies in the in-plane direction of the optically anisotropic layer, the expression of desired optical performance of the optically anisotropic layer may be hindered.

Therefore, an object of the present invention is to provide a liquid crystal composition capable of forming an optically anisotropic layer in which a variation in a twisted angle of liquid crystal compound in an in-plane direction is suppressed.

Another object of the present invention is to provide an optical film, a circularly polarizing plate for an organic EL display, and a method for producing an optically anisotropic layer.

As a result of extensive studies on the above objects, the present inventors have found that the above objects can be achieved by the following configuration. The present invention has been completed based on this finding.

[1] A liquid crystal composition comprising:
a liquid crystal compound;
an optically active compound A which is a photosensitive optically active compound whose helical twisting power changes upon irradiation with light and has a molar absorption coefficient of 5,000 $M^{-1} \cdot cm^{-1}$ or more with respect to light having a wavelength of 365 nm; and
an optically active compound B having a molar absorption coefficient with respect to light having a wavelength of 365 nm smaller than the molar absorption coefficient of the optically active compound A,
in which a mass content ratio of the optically active compound A to the liquid crystal compound is less than 0.01.

[2] The liquid crystal composition according to [1], in which the optically active compound A has a molar absorption coefficient of 15,000 $M^{-1} \cdot cm^{-1}$ or more with respect to light having a wavelength of 365 nm.

[3] The liquid crystal composition according to [1] or [2], in which the optically active compound B has a molar absorption coefficient of less than 1,000 $M^{-1} \cdot cm^{-1}$ with respect to light having a wavelength of 365 nm.

[4] The liquid crystal composition according to any one of [1] to [3], in which the liquid crystal compound is a polymerizable liquid crystal compound.

[5] The liquid crystal composition according to any one of [1] to [4], in which a helical direction of a helix induced by the optically active compound A is opposite to a helical direction of a helix induced by the optically active compound B.

[6] The liquid crystal composition according to any one of [1] to [5], in which an absolute value of a weighted average helical twisting power based on all the optically active compounds contained in the liquid crystal composition is 0.0 $\mu m^{-1}$ or more and less than 0.5 $\mu m^{-1}$.

[7] The liquid crystal composition according to any one of [1] to [6], in which the helical twisting power of the optically active compound A changes by 20 $\mu m^{-1}$ or more upon irradiation with light having a wavelength of 365 nm at an illuminance of 30 $mW/cm^2$ for 1 second.

[8] The liquid crystal composition according to any one of [1] to [7], in which the helical twisting power of the optically active compound B does not change by 5 $\mu m^{-1}$ or more upon irradiation with light having a wavelength of 365 nm at an illuminance of 30 $mW/cm^2$ for 1 second.

[9] The liquid crystal composition according to any one of [1] to [8], in which the optically active compound A and the optically active compound B have a partial structure of any one of a binaphthyl partial structure, an isosorbide partial structure, or an isomannide partial structure.

[10] The liquid crystal composition according to any one of [1] to [9], in which the optically active compound A has a group containing a photoisomerizable double bond.

[11] The liquid crystal composition according to [10], in which the group containing a photoisomerizable double bond is a cyanocinnamoyl group.

[12] An optical film comprising:
a substrate; and
an optically anisotropic layer formed of the liquid crystal composition according to any one of [1] to [11] arranged on the substrate.

[13] The optical film according to [12], in which the optically anisotropic layer has, along a thickness direction, a first region in which an alignment state of the liquid crystal compound twist-aligned along a helical axis extending along a thickness direction is fixed, and a second region in which an alignment state of a homogeneously aligned liquid crystal compound is fixed.

[14] A circularly polarizing plate for an organic EL display, comprising:
the optical film according to [12] or [13]; and
a polarizer.

[15] A method for producing an optically anisotropic layer, comprising:
a step 1 of forming a composition layer on a substrate using the liquid crystal composition according to any one of [1] to [11];
a step 2 of subjecting the composition layer to a heat treatment to align a liquid crystal compound in the composition layer;
a step 3 of subjecting the composition layer to light irradiation under a condition of an oxygen concentration of 1% by volume or more, after the step 2; and
a step 4 of subjecting the light-irradiated composition layer to a curing treatment to fix an alignment state of the liquid crystal compound to form an optically anisotropic layer having a plurality of regions having different alignment states of the liquid crystal compound along a thickness direction,
in which a step 5 of carrying out the step 3 under heating conditions, or subjecting the composition layer to a heat treatment between the step 3 and the step 4 is further provided.

[16] The method for producing an optically anisotropic layer according to [15], in which the optically anisotropic layer has, along a thickness direction, a first region in which the alignment state of the liquid crystal compound twist-aligned along a helical axis extending along a thickness direction is fixed, and a second region in which the alignment state of a homogeneously aligned liquid crystal compound is fixed.

According to an aspect of the present invention, it is possible to provide a liquid crystal composition capable of forming an optically anisotropic layer in which a variation in a twisted angle of liquid crystal compound in an in-plane direction is suppressed.

According to another aspect of the present invention, it is also possible to provide an optical film, a circularly polarizing plate for an organic EL display, and a method for producing an optically anisotropic layer.

DESCRIPTION OF THE PREFERRED EMBODIMENTS

Figure 1:
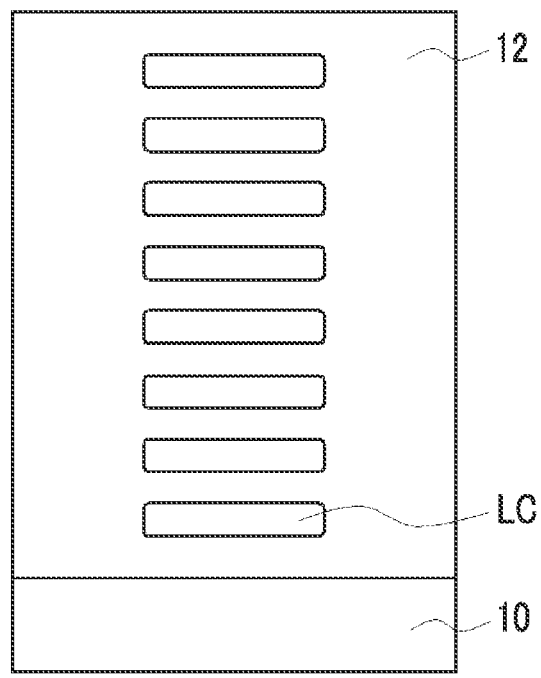
FIG. 1 is a cross-sectional view of a composition layer for explaining an example of steps 1 and 2 in a first embodiment of a method for producing an optically anisotropic layer.

Hereinafter, the present invention will be described in more detail. Any numerical range expressed by using "to" in the present specification means a range including the numerical values before and after the "to" as a lower limit value and an upper limit value, respectively. First, the terms used in the present specification will be described.

The slow axis is defined at a wavelength of 550 nm unless otherwise specified.

In the present invention, Re (λ) and Rth (λ) represent an in-plane retardation and a thickness direction retardation at a wavelength λ, respectively. Unless otherwise specified, the wavelength λ is 550 nm.

In the present invention, Re (λ) and Rth (λ) are values measured at a wavelength λ in AxoScan (manufactured by Axometrics, Inc.). By inputting an average refractive index $((nx+ny+nz)/3)$ and a film thickness (d (μm)) in AxoScan, slow axis direction (°)
Re (λ)=R0 (λ)
Rth (λ)=((nx+ny)/2−nz)×d are calculated.

Although R0 (λ) is displayed as a numerical value calculated by AxoScan, it means Re (λ).

In the present specification, the refractive indexes nx, ny, and nz are measured using an Abbe refractometer (NAR-4T, manufactured by Atago Co., Ltd.) and using a sodium lamp (λ=589 nm) as a light source. In addition, in a case of measuring the wavelength dependence, it can be measured with a multi-wavelength Abbe refractometer DR-M2 (manufactured by Atago Co., Ltd.) in combination with an dichroic filter.

In addition, the values in the Polymer Handbook (JOHN WILEY & SONS, INC) and the catalogs of various optical films can be used. The values of the average refractive index of main optical films are illustrated below: cellulose acylate (1.48), cycloolefin polymer (1.52), polycarbonate (1.59), polymethylmethacrylate (1.49), and polystyrene (1.59).

The "light" in the present specification means an actinic ray or radiation, for example, an emission line spectrum of a mercury lamp, a far ultraviolet ray typified by an excimer laser, an extreme ultraviolet ray (EUV light), an X-ray, an ultraviolet ray, or an electron beam (EB). Of these, an ultraviolet ray is preferable.

The term "visible light" in the present specification refers to light in a wavelength range of 380 to 780 nm. In addition, the measurement wavelength in the present specification is 550 nm unless otherwise specified.

[Liquid Crystal Composition]

The liquid crystal composition according to the embodiment of the present invention contains a liquid crystal compound, an optically active compound A which is a photosensitive optically active compound whose helical twisting power changes upon irradiation with light and has a molar absorption coefficient of 5,000 $M^{-1} \cdot cm^{-1}$ or more with respect to light having a wavelength of 365 nm, and an optically active compound B having a molar absorption coefficient with respect to light having a wavelength of 365 nm smaller than the molar absorption coefficient of the optically active compound A, in which a mass content ratio of the optically active compound A to the liquid crystal compound is less than 0.01.

According to the liquid crystal composition according to the embodiment of the present invention having the above configuration, it is possible to form an optically anisotropic layer in which a variation in a twisted angle of liquid crystal compound in an in-plane direction is suppressed.

Although the mechanism of action of the liquid crystal composition according to the embodiment of the present invention to exert the above effects is not clear, the present inventors speculate as follows.

According to the present studies by the present inventors, it is speculated that an LED light source used for irradiation with light having a wavelength of 365 nm generally has an illuminance variation of about 10%, and this illuminance variation affects an amount of change in helical twisting power of a photosensitive optically active compound, which is an optically active compound whose helical twisting power changes upon irradiation with light, which may cause a variation in a twisted angle of liquid crystal compound. For example, in a case where the photosensitive optically active compound is a compound that is isomerized upon irradiation with light, it is considered that an isomerization rate of the photosensitive optically active compound in an in-plane direction varies due to the influence of the illuminance variation of the LED light source, and as a result, the amount of change in the helical twisting power of the photosensitive optically active compound in an in-plane direction varies (this causes a variation in the twisted angle of liquid crystal compound).

On the other hand, a feature point of the liquid crystal composition according to the embodiment of the present invention is that an optically active compound A having a relatively large molar absorption coefficient with respect to light having a wavelength of 365 nm is used in a small amount. In a case where a composition layer formed of the liquid crystal composition according to the embodiment of the present invention is irradiated with a predetermined irradiation amount of light, light easily reaches deep into the layer since the optically active compound A in the composition layer has excellent light absorption (photosensitivity) and a formulation amount thereof is small. That is, the composition layer formed of the liquid crystal composition according to the embodiment of the present invention makes it possible for the optically active compound A present in the layer of the composition layer to be substantially exposed to light with a predetermined irradiation amount of light, and as a result, the influence of the illuminance variation due to the LED light source cannot occur.

On the other hand, in a case where the content of the optically active compound A in the liquid crystal composition is greater than a predetermined amount (see Comparative Examples 1 to 3 in the column of Examples), or in a case where the molar absorption coefficient of the photosensitive optically active compound in the liquid crystal composition with respect to light having a wavelength of 365 nm is less than a predetermined value (see Comparative Example 4 in the column of Examples), it is susceptible to the influence of the illuminance variation of the LED light source in the in-plane direction of the composition layer upon irradiation of the composition layer formed of the above liquid crystal composition with a predetermined irradiation amount of light, and as a result, the variation in the twisted angle of liquid crystal compound becomes large.

In the following description, the "optically active compound" may be referred to as a "chiral agent". In addition, the "photosensitive optically active compound" may be referred to as a "photosensitive chiral agent", the "optically active compound A" may be referred to as "chiral agent A", and the "optically active compound B" may be referred to as "chiral agent B".

Hereinafter, various components contained in the liquid crystal composition according to the embodiment of the present invention will be described.

[Liquid Crystal Compound]

The liquid crystal composition according to the embodiment of the present invention contains a liquid crystal compound.

The type of the liquid crystal compound is not particularly limited. Generally, the liquid crystal compound can be classified into a rod-like type (rod-like liquid crystal compound) and a disk-like type (discotic liquid crystal compound) depending on the shape thereof. Further, the liquid crystal compound can be classified into a low molecular weight type and a high molecular weight type. The high molecular weight generally refers to having a polymerization degree of 100 or more (Polymer Physics-Phase Transition Dynamics, Masao Doi, p. 2, Iwanami Shoten, Publishers, 1992). Any liquid crystal compound can be used in the present invention, and it is preferable to use a rod-like liquid crystal compound or a discotic liquid crystal compound and it is more preferable to use a rod-like liquid crystal compound. Two or more rod-like liquid crystal compounds, two or more discotic liquid crystal compounds, or a mixture of a rod-like liquid crystal compound and a discotic liquid crystal compound may be used.

For example, rod-like liquid crystal compounds described in claim 1 of JP1999-513019A (JP-H11-513019A) and paragraphs [0026] to [0098] of JP2005-289980A can be preferably used as the rod-like liquid crystal compound.

For example, discotic liquid crystal compounds described in paragraphs [0020] to [0067] of JP2007-108732A and paragraphs [0013] to [0108] of JP2010-244038A can be preferably used as the discotic liquid crystal compound.

Above all, the liquid crystal compound is preferably a liquid crystal compound having at least one polymerizable group (polymerizable liquid crystal compound).

The type of the polymerizable group contained in the liquid crystal compound is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The optically anisotropic layer formed of the liquid crystal composition according to the embodiment of the present invention is preferably a layer formed by fixing a liquid crystal compound having a polymerizable group (a rod-like liquid crystal compound or discotic liquid crystal compound having a polymerizable group) by means of polymerization or the like. The layer formed by fixing a liquid crystal compound having a polymerizable group by means of polymerization or the like no longer needs to exhibit liquid crystallinity after being formed into a layer.

[Optically Active Compound (Chiral Agent)]

The liquid crystal composition according to the embodiment of the present invention contains at least an optically active compound A (chiral agent A) and an optically active compound B (chiral agent B) as an optically active compound (chiral agent).

The chiral agent may contain an optically active compound other than the chiral agent A and the chiral agent B.

The chiral agent A is a photosensitive optically active compound (photosensitive chiral agent) whose helical twisting power changes upon irradiation with light.

The helical twisting power (HTP) of the chiral agent is a factor indicating an helical alignment ability expressed by Expression (X).

HTP=1/(length of helical pitch (unit: μm)×concentration of chiral agent with respect to total solid content in liquid crystal composition (% by mass)) [μm$^{-1}$]   Expression (X)

The length of the helical pitch refers to a length of pitch P (=the period of the helix) of a helical structure of the cholesteric liquid crystalline phase and can be measured by the method described in Handbook of Liquid Crystals (published by Maruzen Co., Ltd.), p. 196.

In addition, the solid content in the liquid crystal composition is intended to mean a component other than a solvent. That is, in a case where it is a component other than a solvent, even a liquid component is regarded as the solid content.

The chiral agent A may be liquid crystalline or non-liquid crystalline. The chiral agent A generally contains an asymmetric carbon atom in many cases. The chiral agent A may be an axial asymmetric compound or planar asymmetric compound that does not contain an asymmetric carbon atom.

The chiral agent A may be a chiral agent whose helical twisting power increases upon irradiation with light, or may be a chiral agent whose helical twisting power decreases upon irradiation with light. Of these, a chiral agent whose helical twisting power decreases upon irradiation with light is preferable.

The "increase and decrease in helical twisting power" in the present specification represent increase/decrease in helical twisting power in a case where an initial helical direction (helical direction before light irradiation) of the chiral agent A is set to "positive". Accordingly, even in a case where the helical twisting power of a chiral agent continues to decrease and goes below zero upon irradiation with light and therefore the helical direction becomes "negative" (that is, even in a case where a chiral agent induces a helix in a helical direction opposite to an initial helical direction (helical direction before light irradiation)), such a chiral agent also corresponds to the "chiral agent whose helical twisting power decreases".

The chiral agent A may be, for example, a so-called photoreactive chiral agent. The photoreactive chiral agent is a compound which has a chiral site and a photoreactive site that undergoes a structural change upon irradiation with light and which greatly changes a twisting power of a liquid crystal compound according to an irradiation amount, for example.

Examples of the photoreactive site that undergoes a structural change upon irradiation with light include photochromic compounds (Kingo Uchida and Masahiro Irie, "Chemical Industry", Vol. 64, p. 640, 1999, and Kingo Uchida and Masahiro Irie, "Fine Chemicals", Vol. 28(9), p. 15, 1999). In addition, the structural change means decomposition, addition reaction, isomerization, racemization, [2+2] photocyclization, dimerization reaction, or the like occurred upon irradiation of a photoreactive site with light, and the structural change may be irreversible. In addition, the chiral site corresponds to the asymmetric carbon described in Chemistry of Liquid Crystals, No. 22, Hiroyuki Nohira, Chemical Reviews, p. 73, 1994.

Examples of the chiral agent A include photoreactive chiral agents described in paragraphs [0044] to [0047] of JP2001-159709A, optically active compounds described in paragraphs [0019] to [0043] of JP2002-179669A, optically active compounds described in paragraphs [0020] to [0044] of JP2002-179633A, optically active compounds described in paragraphs [0016] to [0040] of JP2002-179670A, optically active compounds described in paragraphs [0017] to [0050] of JP2002-179668A, optically active compounds described in paragraphs [0018] to [0044] of JP2002-180051A, optically active isosorbide derivatives described in paragraphs [0016] to [0055] of JP2002-338575A, photoreactive optically active compounds described in paragraphs [0023] to [0032] of JP2002-080478A, photoreactive chiral agents described in paragraphs [0019] to [0029] of JP2002-080851A, optically active compounds described in paragraphs [0022] to [0049] of JP2002-179681A, optically active compounds described in paragraphs [0015] to [0044] of JP2002-302487A, optically active polyesters described in paragraphs [0015] to [0050] of JP2002-338668A, binaphthol derivatives described in paragraphs [0019] to [0041] of JP2003-055315A, optically active fulgide compounds described in paragraphs [0008] to [0043] of JP2003-073381A, optically active isosorbide derivatives described in paragraphs [0015] to [0057] of JP2003-306490A, optically active isosorbide derivatives described in paragraphs

[0015] to [0041] of JP2003-306491A, optically active isosorbide derivatives described in paragraphs [0015] to [0049] of JP2003-313187A, optically active isomannide derivatives described in paragraphs [0015] to [0057] of JP2003-313188A, optically active isosorbide derivatives described in paragraphs [0015] to [0049] of JP2003-313189A, optically active polyesters/amides described in paragraphs [0015] to [0052] of JP2003-313292A, optically active compounds described in paragraphs [0012] to [0053] of WO2018/194157A, and optically active compounds described in paragraphs [0020] to [0049] of JP2002-179682A.

Above all, a compound having at least a photoisomerization site is preferable as the chiral agent A.

The photoisomerization site is preferably a site having a photoisomerizable double bond; and a cinnamoyl site, a chalcone site, an azobenzene site, or a stilbene site is preferable from the viewpoint that photoisomerization is likely to occur and the difference in helical twisting power before and after light irradiation is large; and a cinnamoyl site, a chalcone site, or a stilbene site is more preferable from the viewpoint that the absorption of visible light is small. Above all, a cinnamoyl site is still more preferable, and a cyanocinnamoyl site is particularly preferable. The photoisomerization site corresponds to the above-mentioned photoreactive site that undergoes a structural change upon irradiation with light.

In addition, the chiral agent A more preferably has a trans photoisomerizable double bond from the viewpoint that the initial helical twisting power (helical twisting power before light irradiation) is high and the amount of decrease in the helical twisting power upon irradiation with light is more excellent.

In addition, the chiral agent A preferably has a cis photoisomerizable double bond from the viewpoint that the initial helical twisting power (helical twisting power before light irradiation) is low and the amount of increase in the helical twisting power upon irradiation with light is more excellent.

The chiral agent A preferably has any partial structure selected from a binaphthyl partial structure, an isosorbide partial structure (a partial structure derived from isosorbide), and an isomannide partial structure (a partial structure derived from isomannide). The binaphthyl partial structure, the isosorbide partial structure, and the isomannide partial structure are intended to have the following structures, respectively.

The portion of the binaphthyl partial structure in which the solid line and the broken line are parallel to each other represents a single bond or a double bond. In the structures shown below, * represents a bonding position.

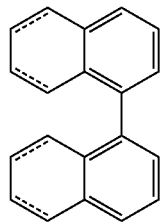

Binaphthyl partial structure

-continued

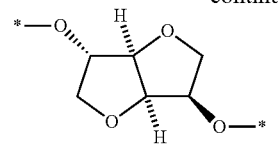

Isosorbide partial structure

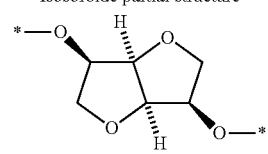

Isomannide partial structure

The chiral agent A may have a polymerizable group. The type of the polymerizable group is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The chiral agent A is preferably a compound having a group containing the above-mentioned photoisomerization site; more preferably a compound having any partial structure selected from the above-mentioned binaphthyl partial structure, isosorbide partial structure, and isomannide partial structure and a group containing the above-mentioned photoisomerization site; still more preferably a compound having any partial structure selected from the above-mentioned binaphthyl partial structure, isosorbide partial structure, and isomannide partial structure and a group containing the above-mentioned photoisomerizable double bond; particularly preferably a compound having any partial structure selected from the above-mentioned binaphthyl partial structure, isosorbide partial structure, and isomannide partial structure and a cinnamoyl group; and most preferably a compound having any partial structure selected from the above-mentioned binaphthyl partial structure, isosorbide partial structure, and isomannide partial structure and a cyanocinnamoyl group.

Above all, the chiral agent A is preferably a compound represented by Formula (C1).

$$X_1-Y-X_2 \qquad \text{Formula (C1):}$$

In the formula, Y represents any partial structure selected from the above-mentioned binaphthyl partial structure, isosorbide partial structure, and isomannide partial structure. Y is preferably an isosorbide partial structure.

$X_1$ and $X_2$ each represent a group containing a photoisomerization site. $X_1$ and $X_2$ are each preferably a group represented by Formula (C1-A). The geometric isomers (cis and trans isomers) that are distinguishable by the double bond specified in Formula (C1-A) are not particularly limited, and a trans isomer is preferable from the viewpoint that the initial helical twisting power (helical twisting power before light irradiation) is high and the amount of decrease in the helical twisting power upon irradiation with light is more excellent. On the other hand, a cis isomer is preferable from the viewpoint that the initial helical twisting power (helical twisting power before light irradiation) is low and the amount of increase in the helical twisting power upon irradiation with light is more excellent.

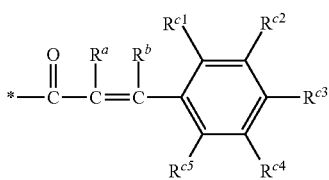

Formula (C1-A)

In the formula, * represents a bonding position. In a case where Y in Formula (C1) represents a binaphthyl structural site, the group represented by Formula (C1-A) is substituted with a ring-constituting carbon atom (a carbon atom constituting a ring specified in the formula) constituting the binaphthyl structural site.

In the formula, $R^a$ and $R^b$ each independently represent a hydrogen atom or a substituent.

The substituent represented by $R^a$ and $R^b$ is not particularly limited, and examples thereof include a cyano group, a halogen atom (for example, a fluorine atom, a chlorine atom, a bromine atom, or an iodine atom), an alkyl group having 1 to 3 carbon atoms, and an alkoxy group having 1 to 3 carbon atoms, among which a cyano group is preferable. In a case where at least one of $R^a$ or $R^b$ in Formula (C1-A) represents a cyano group, the group represented by Formula (C1-A) corresponds to a cyanocinnamoyl group.

In the formula, $R^{c1}$ to $R^{c5}$ each independently represent a hydrogen atom or a substituent.

$R^{c1}$ to $R^{c5}$ may be bonded to each other to form a ring. The ring formed by the above bonding may be either an aromatic ring or an aliphatic ring.

Above all, the aromatic ring is preferably a benzene ring.

The aliphatic ring may be an aliphatic hydrocarbon ring or an aliphatic heterocyclic ring (in which the heteroatom is not particularly limited, and examples thereof include an oxygen atom, a nitrogen atom, and a sulfur atom).

In addition, the ring formed by the above bonding may further have a substituent. The substituent is not particularly limited, and examples thereof include the same substituents represented by $R^{c1}$ to $R^{c5}$ which will be described later.

The substituent represented by $R^{c1}$ to $R^{c5}$ is not particularly limited, and is preferably, for example, an alkylcarbonyl group, an aralkylcarbonyl group, an alkylalkoxy group, an alkylcarbonyloxy group, an alkylalkoxycarbonyl group, or a group represented by Formula (C1-2). The alkylcarbonyl group, aralkylcarbonyl group, alkylalkoxy group, alkylcarbonyloxy group, and alkylalkoxycarbonyl group may further have a substituent (for example, a halogen atom). The alkylalkoxy is intended to mean a group represented by RO— (where R represents a linear, branched, or cyclic alkyl group).

The alkyl moiety in the alkylcarbonyl group, the alkylalkoxy group, the alkylcarbonyloxy group, and the alkylalkoxycarbonyl group may be linear, branched, or cyclic. In addition, the number of carbon atoms in the alkyl moiety is not particularly limited, and is preferably 1 to 15, more preferably 1 to 10, and still more preferably 1 to 6.

The aralkylcarbonyl group is a group in which a hydrogen atom in the alkyl moiety of the alkylcarbonyl group is substituted with an aryl group (for example, a phenyl group), and preferably has 8 to 15 carbon atoms and more preferably 8 to 10.

*-$L_1$-($L_2$-$Ar_1$)$_m$ Formula (C1-2):

In the formula, $L_1$ and $L_2$ each independently represent a single bond or a divalent linking group. In a case where m is 2 or more, a plurality of $L_2$'s and a plurality of $Ar_1$'s may be respectively the same or different from each other.

The divalent linking group represented by $L_1$ and $L_2$ is not particularly limited, and examples thereof include a divalent aliphatic hydrocarbon group (which may be linear, branched, or cyclic and preferably has 1 to 20 carbon atoms, and includes, for example, an alkylene group, an alkenylene group, and an alkynylene group), —O—, —S—, —SO$_2$—, —NR$^D$—, —CO—, —N=N—, —CH=N—, and a group formed by combining two or more of these groups (which includes, for example, —NH—CO— and —CO—O—). Here, $R^D$ represents a hydrogen atom or an alkyl group (preferably having 1 to 10 carbon atoms).

m represents an integer of 1 or more. Above all, m is preferably 2 or more. In addition, the upper limit of m is not particularly limited, and is preferably 6 or less and more preferably 4 or less.

$Ar_1$ represents an aromatic hydrocarbon ring group or an aliphatic hydrocarbon ring group.

The aromatic hydrocarbon ring constituting the aromatic hydrocarbon ring group and the aliphatic hydrocarbon ring constituting the aliphatic hydrocarbon ring group may be either monocyclic or polycyclic, and are preferably monocyclic.

The aromatic hydrocarbon ring preferably has 6 to 15 carbon atoms and is more preferably a benzene ring.

The aliphatic hydrocarbon ring preferably has 6 to 15 carbon atoms and is more preferably a cyclohexane ring.

The aromatic hydrocarbon ring and the aliphatic hydrocarbon ring may further have a substituent. The substituent is not particularly limited, and examples thereof include a halogen atom, an alkyl group, an alkylcarbonyl group, an aralkylcarbonyl group, an alkylalkoxy group, an alkylcarbonyloxy group, and an alkylalkoxycarbonyl group.

Suitable aspects of the alkylcarbonyl group, the aralkylcarbonyl group, the alkylalkoxy group, the alkylcarbonyloxy group, and the alkylalkoxycarbonyl group are the same as those of the alkylcarbonyl group, the aralkylcarbonyl group, the alkylalkoxy group, the alkylcarbonyloxy group, and the alkylalkoxycarbonyl group described as the substituents represented by $R^{c1}$ to $R^{c5}$.

The alkyl group may be linear, branched, or cyclic. In addition, the number of carbon atoms in the alkyl group is not particularly limited, and is preferably 1 to 15, more preferably 1 to 10, and still more preferably 1 to 6.

The molar absorption coefficient of the chiral agent A with respect to light having a wavelength of 365 nm is 5,000 $M^{-1} \cdot cm^{-1}$ (in other words, 5,000 L/(mol·cm)) or more, and from the viewpoint that the effect of the present invention is more excellent, it is more preferably 15,000 $M^{-1} \cdot cm^{-1}$ or more and still more preferably 30,000 $M^{-1} \cdot cm^{-1}$ or more. The upper limit value thereof is not particularly limited, and is preferably 100,000 $M^{-1} \cdot cm^{-1}$ or less.

The amount of change in the helical twisting power of the chiral agent A upon irradiation with light having a wavelength of 365 nm at an illuminance of 30 mW/cm$^2$ for 1 second is preferably 20 $\mu m^{-1}$ or more and more preferably 30 $\mu m^{-1}$ or more. In other words, the chiral agent A is preferably a chiral agent whose helical twisting power changes by 20 $\mu m^{-1}$ or more (preferably 30 $\mu m^{-1}$ or more) upon irradiation with light having a wavelength of 365 nm at an illuminance of 30 mW/cm$^2$ for 1 second.

The mass content ratio of the chiral agent A to the liquid crystal compound (=content (wt) of chiral agent A/content (wt) of liquid crystal compound) in the composition layer is less than 0.01, preferably 0.006 or less, and more preferably 0.005 or less. The lower limit value thereof is not particularly limited, and is preferably 0.0001 or more, more preferably 0.0002 or more, and still more preferably 0.0005 or more.

The chiral agent A may be used alone or in combination of two or more thereof. In a case where two or more of the chiral agents A are used in combination, the total content thereof is preferably within the above range.

Hereinafter, specific examples of the chiral agent A will be shown, but the present invention is not limited thereto. In the following specific examples, "Me" represents a methyl group.

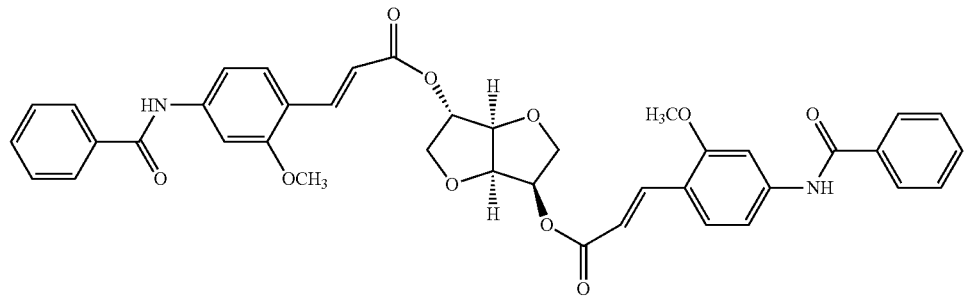

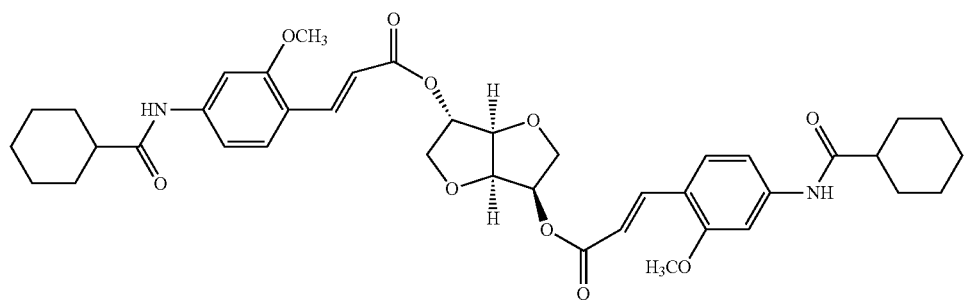

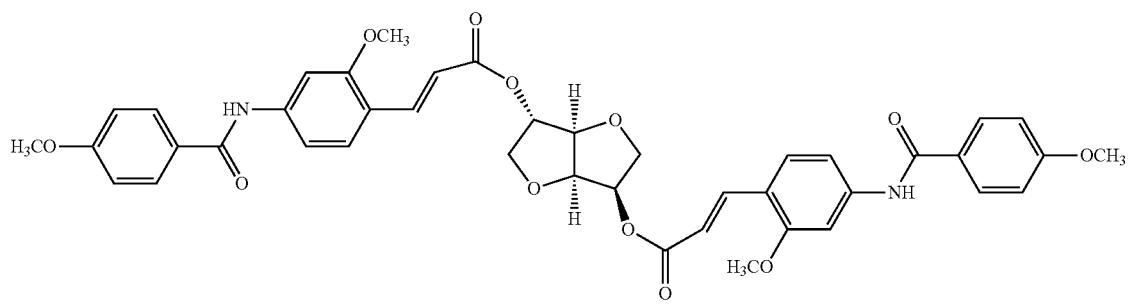

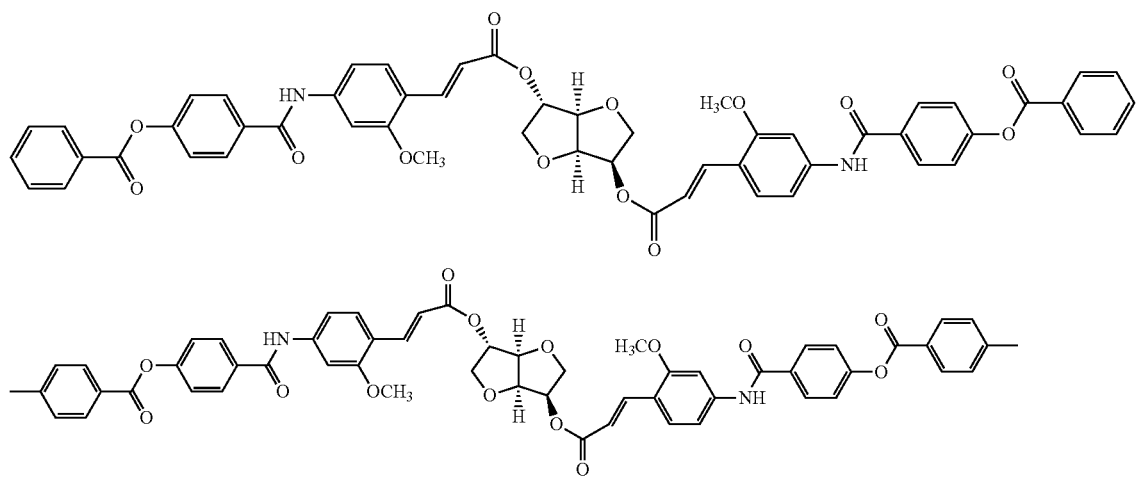

-continued
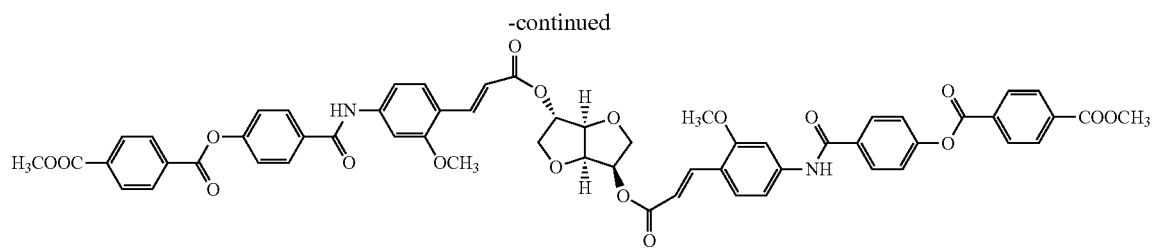
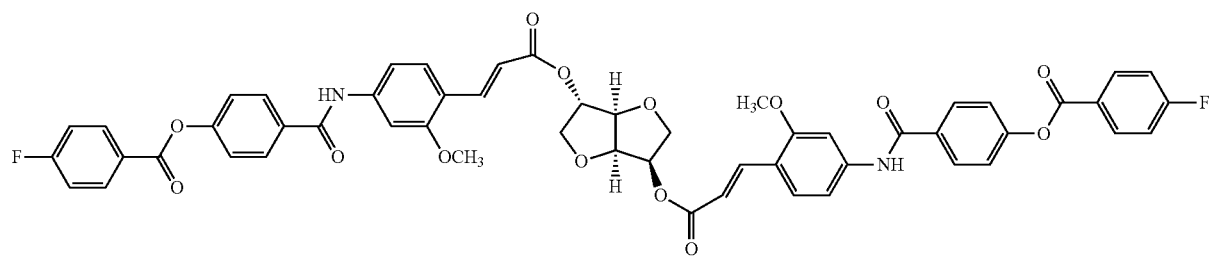
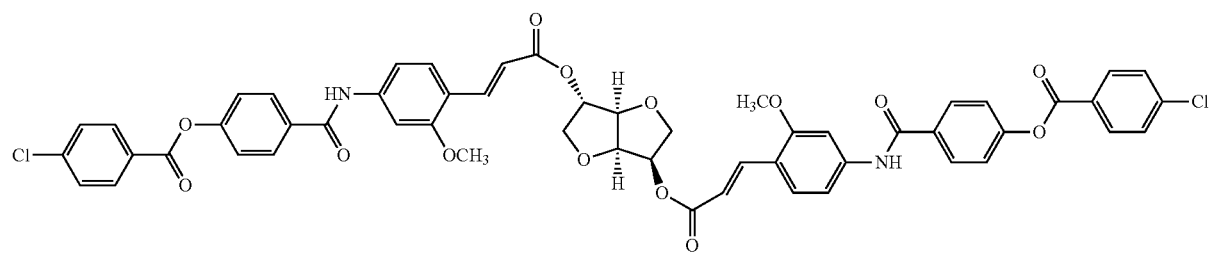
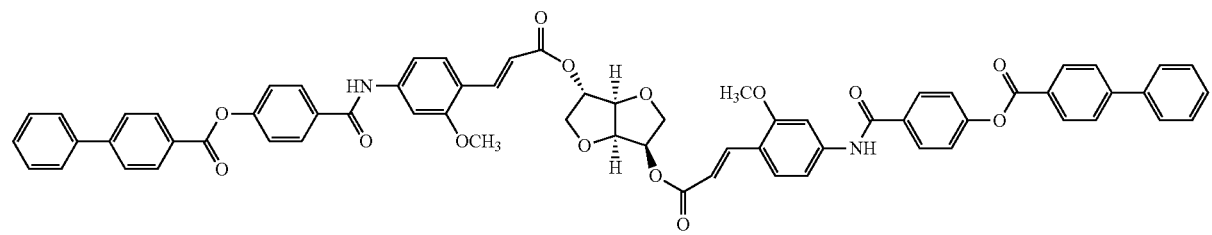
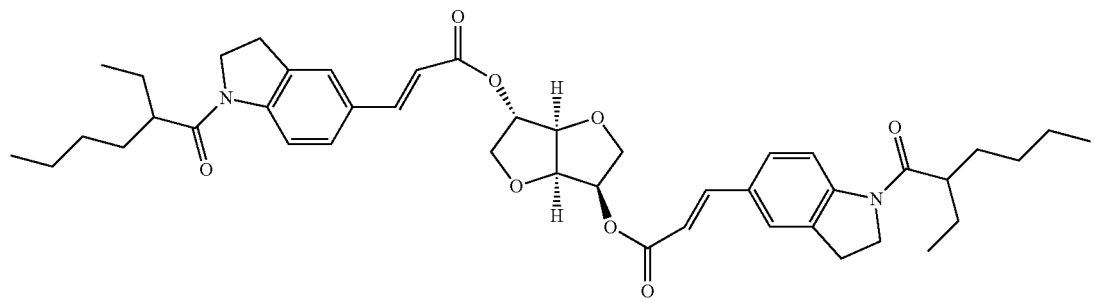
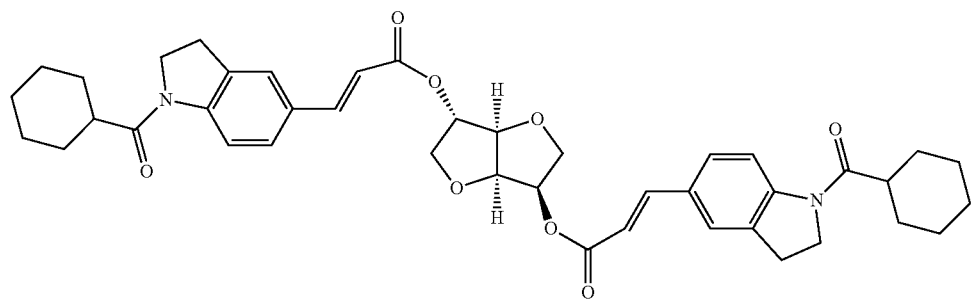

-continued
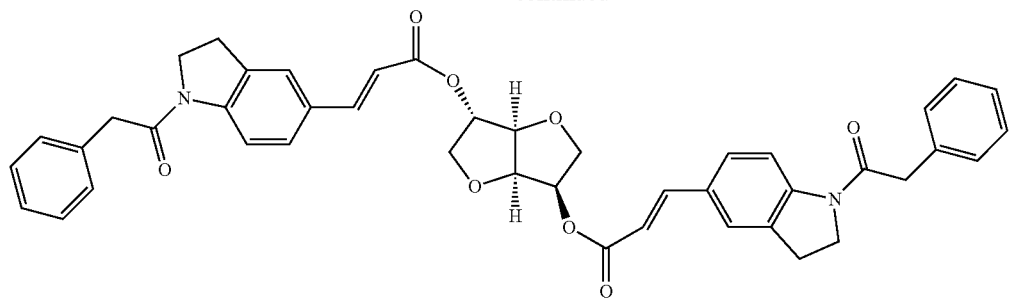
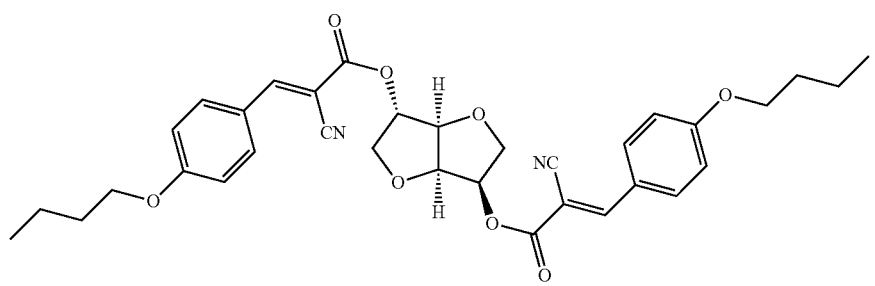
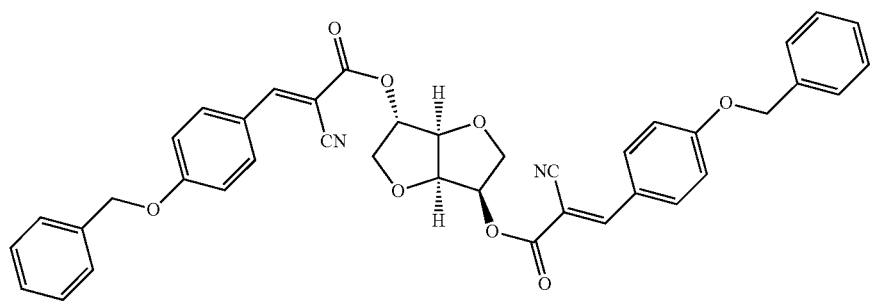
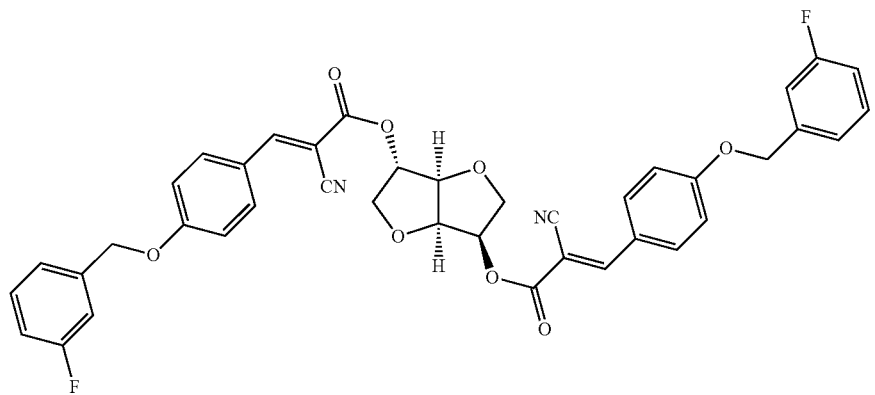
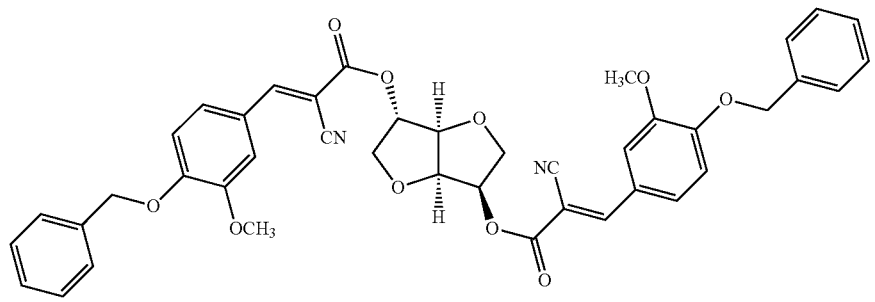

-continued
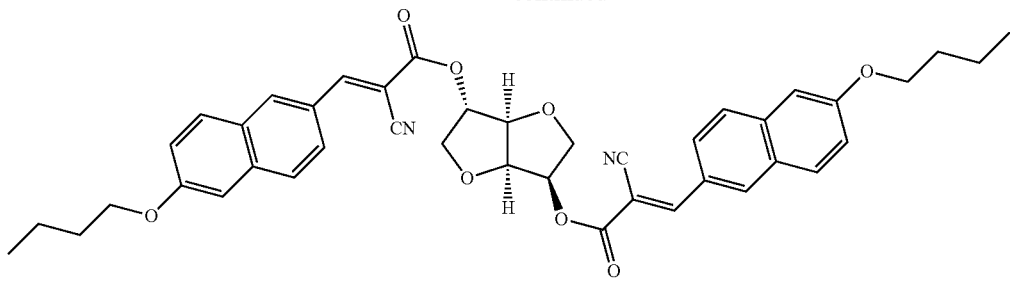
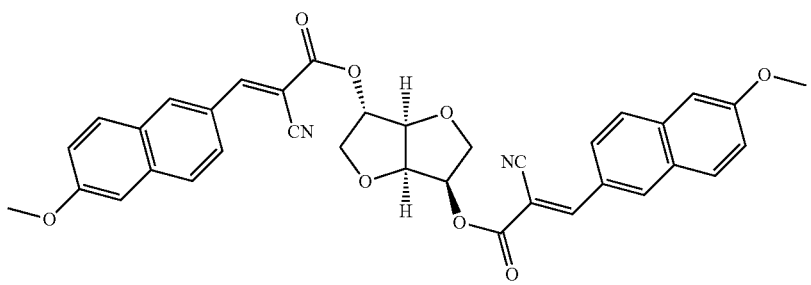
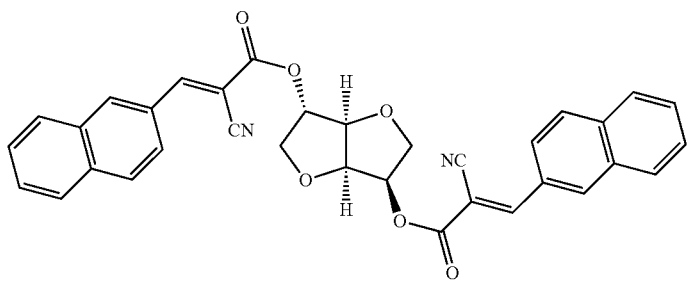
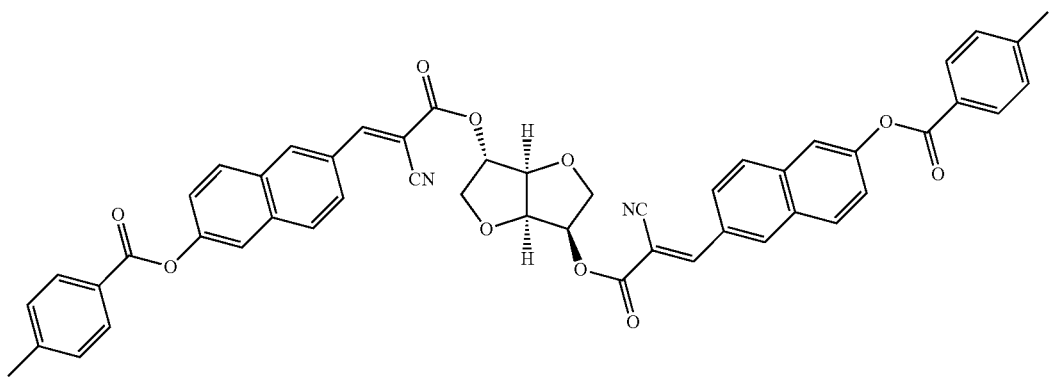
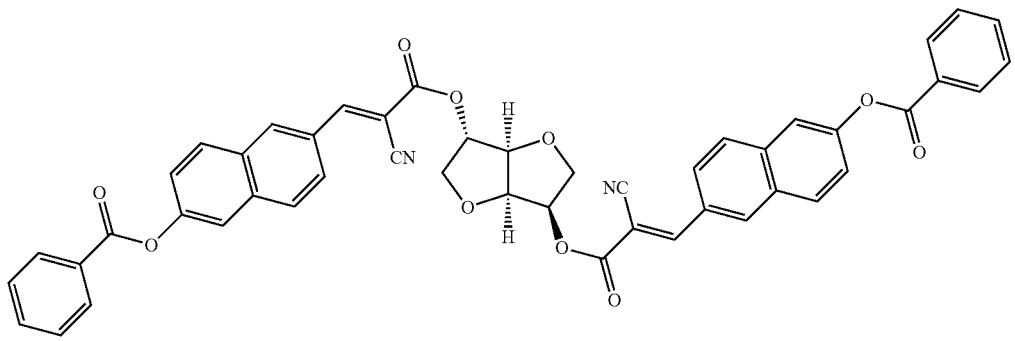

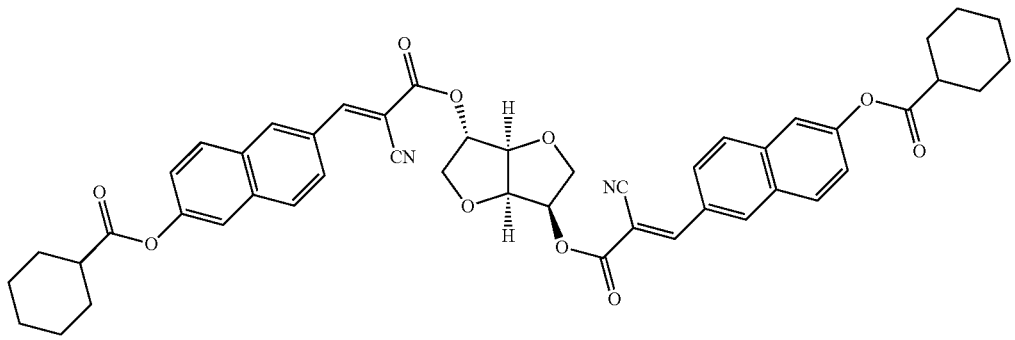
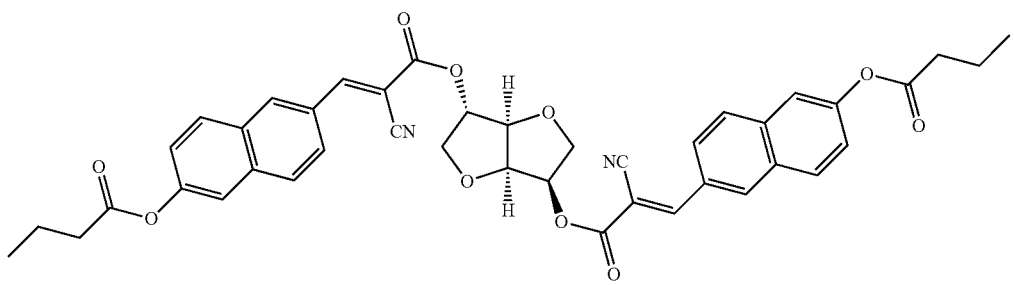 [SMILES: CCCC(=O)Oc1ccc2cc(/C=C(\C#N)C(=O)O[C@H]3CO[C@H]4[C@@H]3OC[C@H]4OC(=O)/C(C#N)=C/c3ccc4cc(OC(=O)CCC)ccc4c3)ccc2c1]
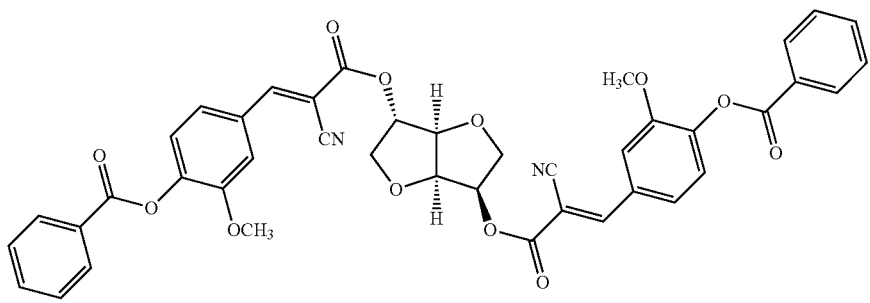
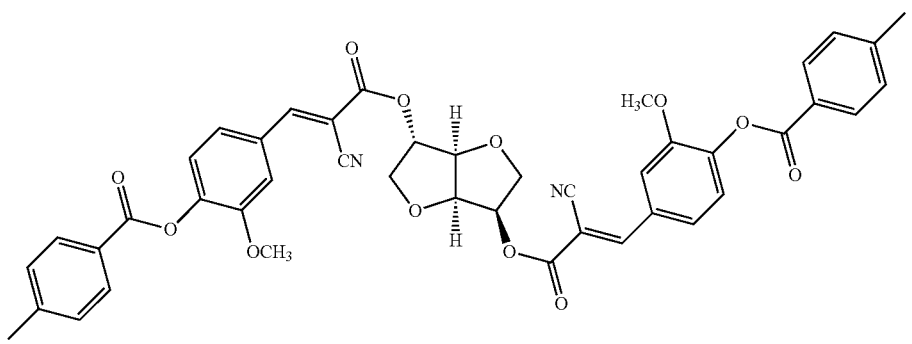
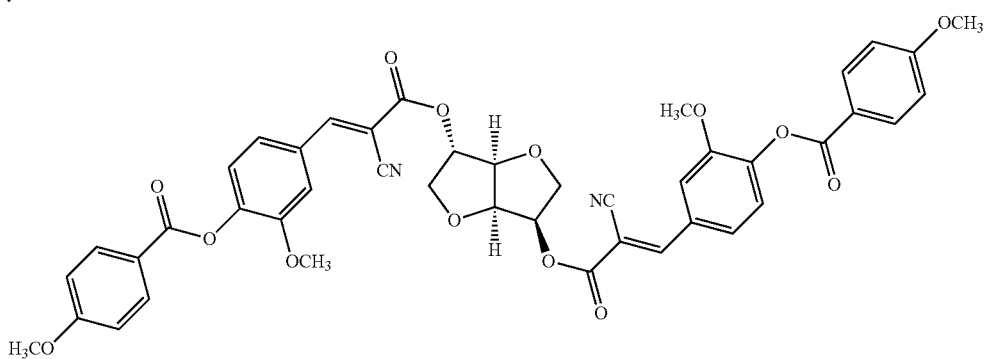

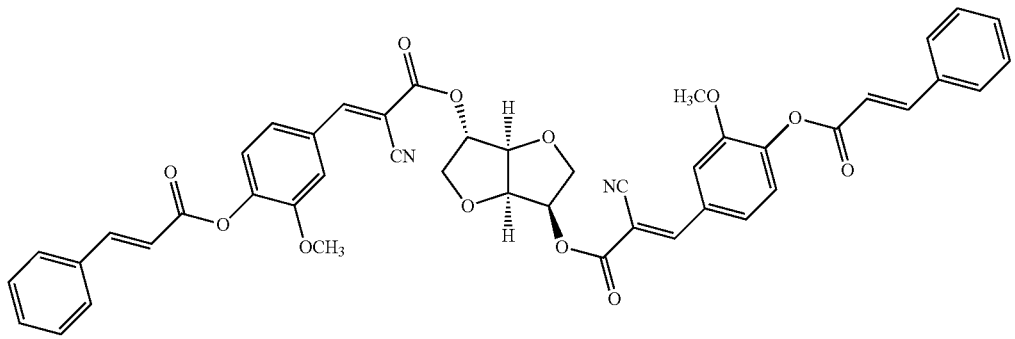
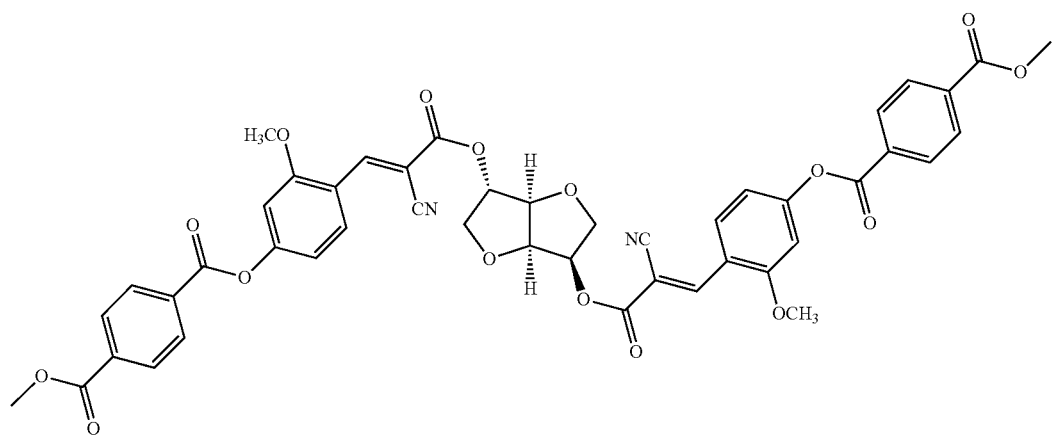
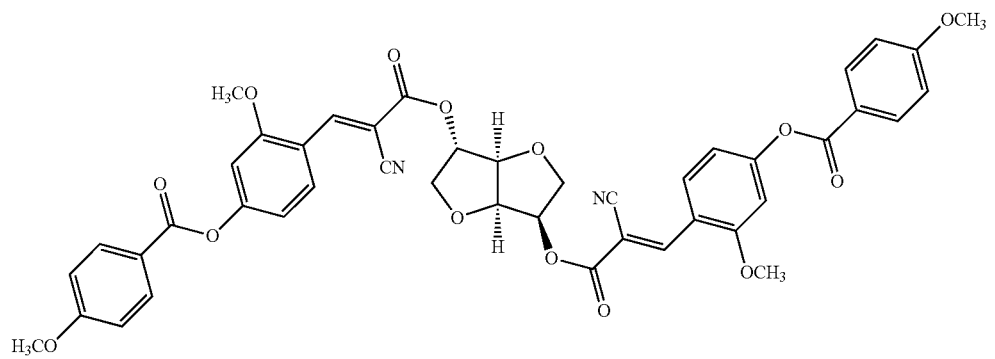
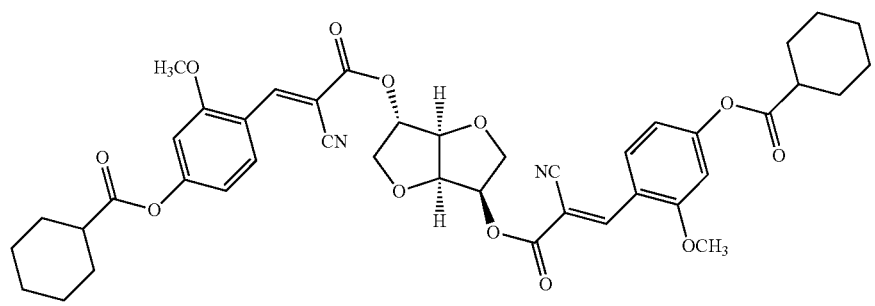

-continued
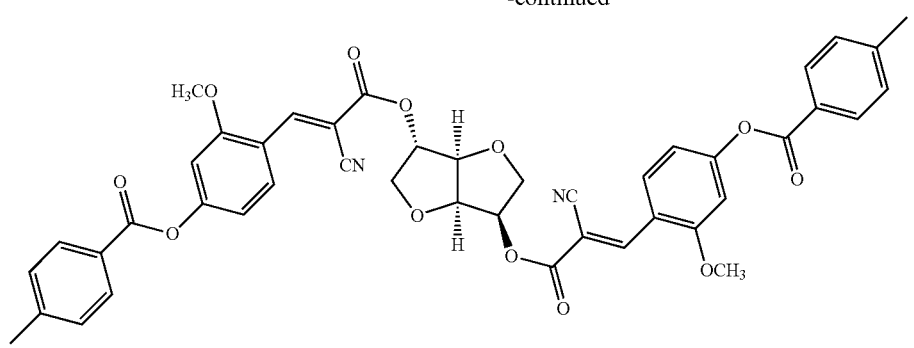
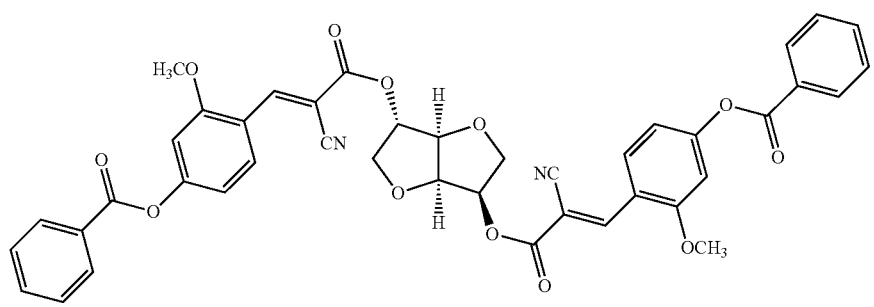
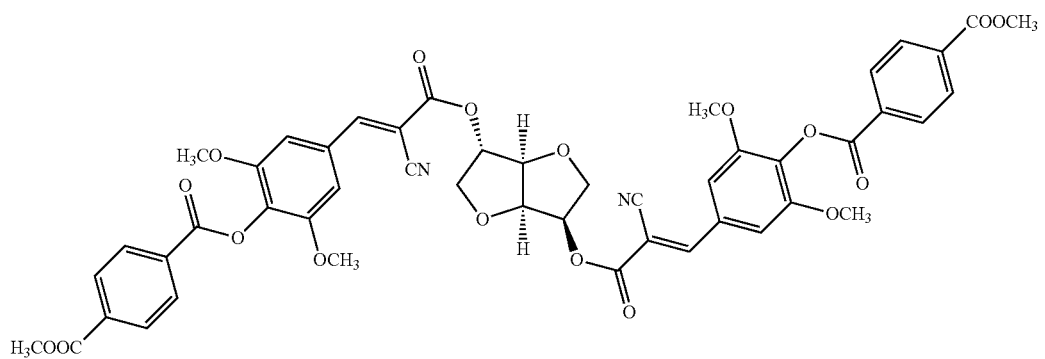
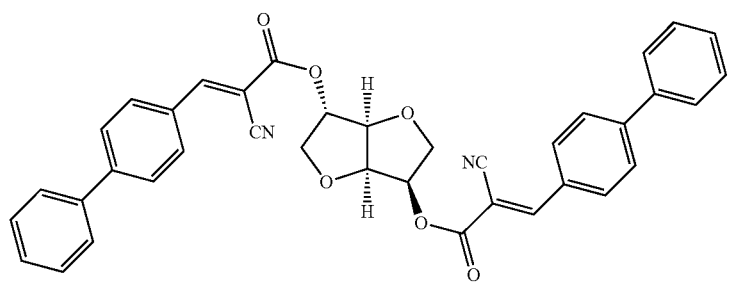
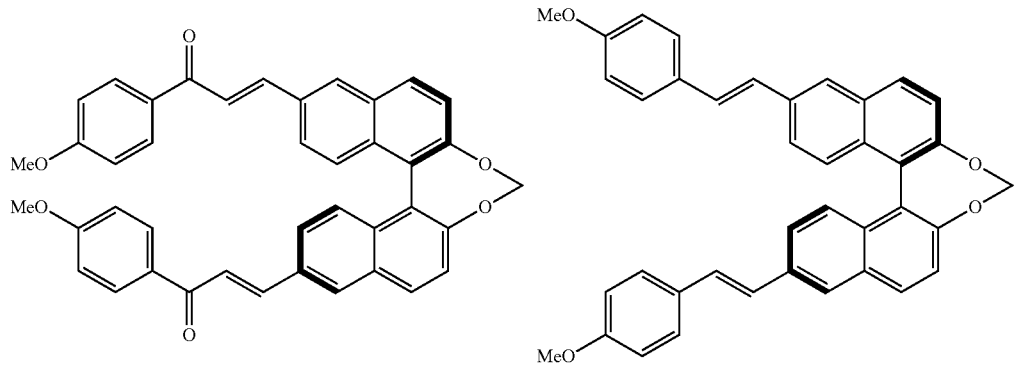

The type of the optically active compound B (chiral agent B) is not particularly limited as long as the molar absorption coefficient of the chiral agent B with respect to light having a wavelength of 365 nm is smaller than the molar absorption coefficient of the chiral agent A with respect to light having a wavelength of 365 nm.

The chiral agent B may be a chiral agent whose helical twisting power changes upon irradiation with light (photosensitive chiral agent), or a chiral agent whose helical twisting power does not change upon irradiation with light (non-photosensitive chiral agent), and is preferably a non-photosensitive chiral agent.

The molar absorption coefficient of the optically active compound B (chiral agent B) with respect to light having a wavelength of 365 nm is preferably less than 1,000 $M^{-1} \cdot cm^{-1}$, more preferably 500 $M^{-1} \cdot cm^{-1}$ or less, and still more preferably 100 $M^{-1} \cdot cm^{-1}$ or less. The lower limit value thereof is preferably 0 $M^{-1} \cdot cm^{-1}$ or more. In a case where the molar absorption coefficient of the chiral agent B with respect to light having a wavelength of 365 nm is 0 $M^{-1} \cdot cm^{-1}$, the helical twisting power does not change even upon irradiation with light having a wavelength of 365 nm.

The amount of change in the helical twisting power of the chiral agent B due to irradiation upon irradiation with light having a wavelength of 365 nm at an illuminance of 30 mW/cm$^2$ for 1 second is preferably 5 $\mu m^{-1}$ or less. In other words, the chiral agent B is preferably a chiral agent whose helical twisting power does not change by 5 $\mu m^{-1}$ or more upon irradiation with light having a wavelength of 365 nm at an illuminance of 30 mW/cm$^2$ for 1 second.

The chiral agent B may be liquid crystalline or non-liquid crystalline. The chiral agent B generally contains an asymmetric carbon atom in many cases. The chiral agent B may be an axial asymmetric compound or planar asymmetric compound that does not contain an asymmetric carbon atom.

The chiral agent B is preferably a chiral agent having any partial structure of a binaphthyl partial structure, an isosorbide partial structure, and an isomannide partial structure. The binaphthyl partial structure, the isosorbide partial structure, and the isomannide partial structure are as described above.

The chiral agent B may have a polymerizable group. Examples of the type of the polymerizable group include polymerizable groups that the chiral agent A may have.

A known chiral agent can be used as the chiral agent B.

The chiral agent B is preferably a chiral agent that induces a helix in a direction opposite to that of a helix induced by the chiral agent A. That is, for example, in a case where the helical direction of the helix induced by the chiral agent A is right-handed, the helical direction of the helix induced by the chiral agent B is left-handed.

The content of the chiral agent B in the composition layer is not particularly limited, and is preferably 1.5% by mass or less and more preferably less than 1.0% by mass with respect to the total mass of the liquid crystal compound, from the viewpoint that the liquid crystal compound is easily aligned uniformly. The lower limit thereof is not particularly limited, and is preferably 0.01% by mass or more, more preferably 0.02% by mass or more, and still more preferably 0.05% by mass.

The chiral agent B may be used alone or in combination of two or more thereof. In a case where two or more of the chiral agents B are used in combination, the total content thereof is preferably within the above range.

Hereinafter, specific examples of the chiral agent B will be described, but the present invention is not limited thereto.

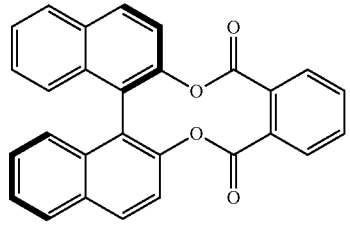

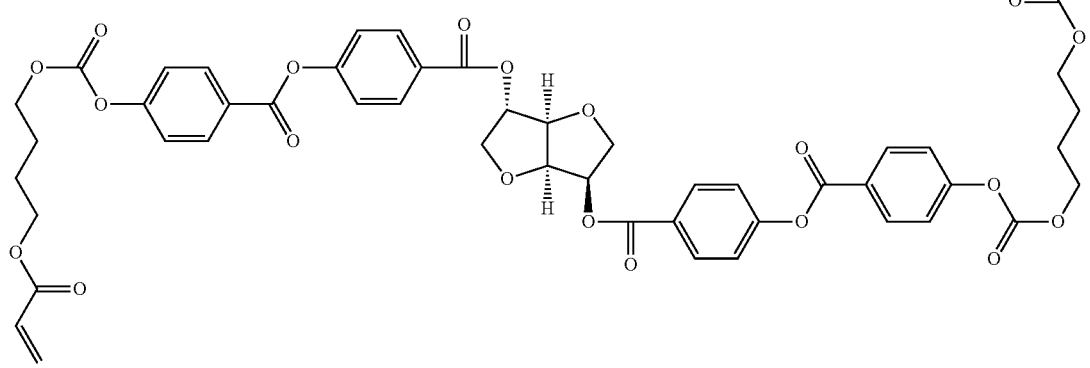

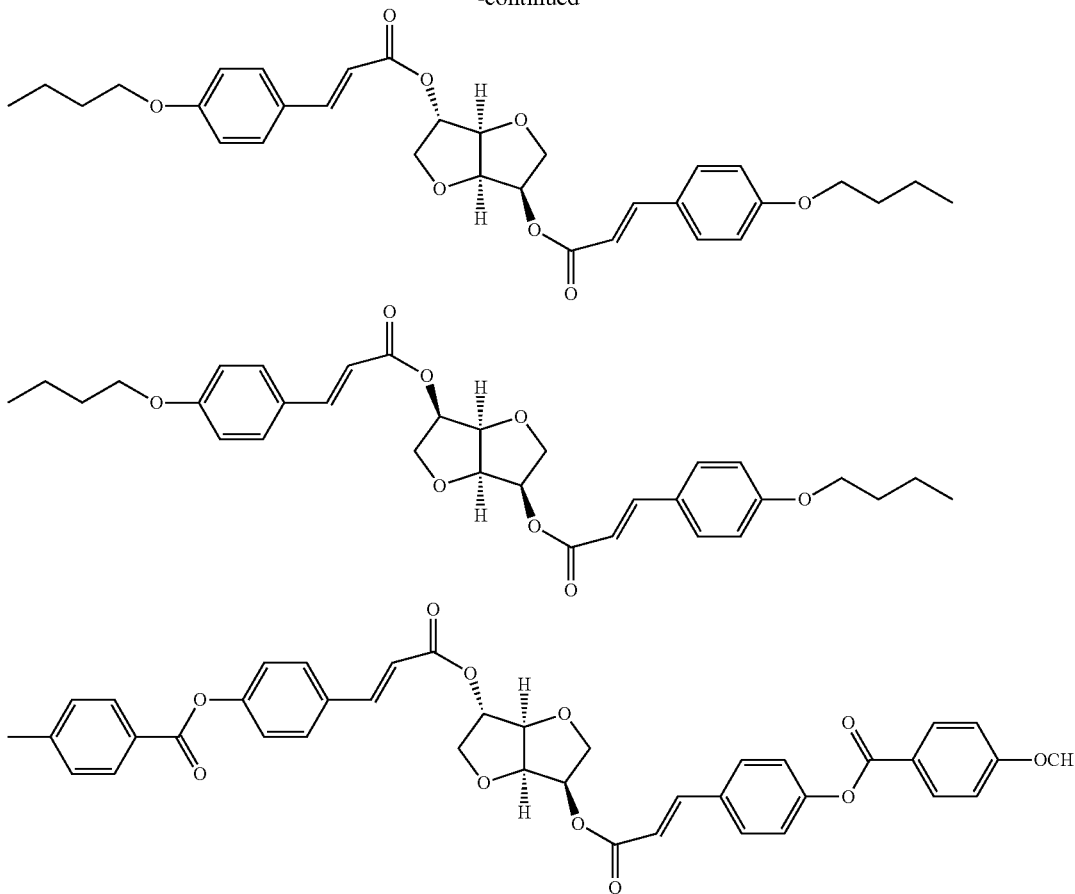

The total content of the chiral agent (total content of all chiral agents) in the composition layer is preferably 3.0% by mass or less, more preferably 2.0% by mass or less, and still more preferably 1.0% by mass or less with respect to the total mass of the liquid crystal compound. The lower limit thereof is not particularly limited, and is preferably 0.01% by mass or more, more preferably 0.02% by mass or more, and still more preferably 0.05% by mass or more.

The contents of the chiral agent A and the chiral agent B in the composition layer can be appropriately set according to the characteristics (for example, retardation and wavelength dispersion) of an optically anisotropic layer to be formed. Since a twisted angle of liquid crystal compound in an optically anisotropic layer largely depends on the types and addition concentrations of the chiral agent A and the chiral agent B, a desired twisted angle can be obtained by adjusting these factors.

The absolute value of the weighted average helical twisting power of the chiral agent contained in the liquid crystal composition is preferably 0.0 to 1.9 $\mu m^{-1}$, more preferably 0.0 to 1.5 $\mu m^{-1}$, still more preferably 0.0 to 1.0 $\mu m^{-1}$, particularly preferably 0.0 $\mu m^{-1}$ or more and less than 0.5 $\mu m^{-1}$, and most preferably zero.

The weighted average helical twisting power of the chiral agent represents a total value of the values obtained by dividing the product of a helical twisting power of each chiral agent contained in a liquid crystal composition and a concentration (% by mass) of each chiral agent with respect to a total solid content in the liquid crystal composition by a total concentration (% by mass) of the chiral agents contained in the liquid crystal composition, in a case where two or more chiral agents are contained in the liquid crystal composition. The weighted average helical twisting power is represented by Expression (Y), for example, in a case where two chiral agents (chiral agent X and chiral agent Y) are used in combination.

Expression (Y) Weighted average helical twisting power ($\mu m^{-1}$)=(helical twisting power ($\mu m^{-1}$) of chiral agent X×concentration (% by mass) of chiral agent X with respect to total solid content in liquid crystal composition+helical twisting power ($\mu m^{-1}$) of chiral agent Y×concentration (% by mass) of chiral agent Y with respect to total solid content in liquid crystal composition)/(concentration (% by mass) of chiral agent X with respect to total solid content in liquid crystal composition+concentration (% by mass) of chiral agent Y with respect to total solid content in liquid crystal composition)

However, in Expression (Y), in a case where the helical direction of the chiral agent is dextrorotatory, the helical twisting power has a positive value. In addition, in a case where the helical direction of the chiral agent is levorotatory, the helical twisting power has a negative value. That is, for example, in a case of a chiral agent having a helical twisting power of 10 $\mu m^{-1}$, the helical twisting power is expressed as 10 $\mu m^{-1}$ in a case where the helical direction of the helix induced by the chiral agent is dextrorotatory. On the other hand, in a case where the helical direction of the helix induced by the chiral agent is levorotatory, the helical twisting power is expressed as −10 $\mu m^{-1}$.

In addition, the weighted average helical twisting power of the chiral agent can also be obtained from Expression (Z).

Weighted average helical twisting power (μm$^{-1}$)=1/{(360/twisted angle [° ])×film thickness [μm]× total concentration (% by mass) of chiral agent added with respect to total solid content in liquid crystal composition}   Expression (Z)

[Other Components]

The liquid crystal composition according to the embodiment of the present invention may contain components other than the liquid crystal compound, the chiral agent A, and the chiral agent B.

<Polymerization Initiator>

The liquid crystal composition according to the embodiment of the present invention may contain a polymerization initiator. In a case where the liquid crystal composition according to the embodiment of the present invention contains a polymerization initiator, the polymerization of a polymerizable liquid crystal compound proceeds more efficiently.

The polymerization initiator is preferably a photopolymerization initiator capable of initiating a polymerization reaction upon irradiation with ultraviolet rays (preferably light having a wavelength of 365 nm). Examples of the photopolymerization initiator include α-carbonyl compounds (as described in U.S. Pat. Nos. 2,367,661A and 2,367,670A), acyloin ethers (as described in U.S. Pat. No. 2,448,828A), α-hydrocarbon-substituted aromatic acyloin compounds (as described in U.S. Pat. No. 2,722,512A), polynuclear quinone compounds (as described in U.S. Pat. Nos. 3,046,127A and 2,951,758A), combinations of triarylimidazole dimer and p-aminophenyl ketone (as described in U.S. Pat. No. 3,549,367A), acridine and phenazine compounds (as described in JP1985-105667A (JP-S60-105667A) and U.S. Pat. No. 4,239,850A), and oxadiazole compounds (as described in U.S. Pat. No. 4,212,970A).

The content of the polymerization initiator in the liquid crystal composition according to the embodiment of the present invention (the total amount of polymerization initiators in a case where a plurality of polymerization initiators are contained) is not particularly limited, and is preferably 0.1% to 20% by mass and more preferably 0.5% to 10% by mass with respect to the total mass of the liquid crystal compound.

<Surfactant>

The liquid crystal composition according to the embodiment of the present invention preferably contains a surfactant.

The surfactant is not particularly limited, and examples thereof include a fluorine-based surfactant, a boronic acid compound, and an ionic surfactant. Above all, the liquid crystal composition according to the embodiment of the present invention preferably contains a fluorine-based surfactant.

The surfactants may be used alone or in combination of two or more thereof.

The content of the surfactant in the liquid crystal composition according to the embodiment of the present invention (the total amount of surfactants in a case where a plurality of surfactants are contained) is not particularly limited, and is preferably 0.01% to 10% by mass, more preferably 0.01% to 5.0% by mass, and still more preferably 0.01% to 2.0% by mass with respect to the total mass of the liquid crystal compound.

<Solvent>

The liquid crystal composition according to the embodiment of the present invention may contain a solvent.

The solvent may be, for example, water or an organic solvent. Examples of the organic solvent include amides such as N,N-dimethylformamide; sulfoxides such as dimethylsulfoxide; heterocyclic compounds such as pyridine; hydrocarbons such as benzene and hexane; alkyl halides such as chloroform and dichloromethane; esters such as methyl acetate, butyl acetate, and propylene glycol monoethyl ether acetate; ketones such as acetone, methyl ethyl ketone, cyclohexanone, and cyclopentanone; ethers such as tetrahydrofuran and 1,2-dimethoxyethane; and 1,4-butanediol diacetate.

The solvents may be used alone or in combination of two or more thereof.

In a case where the liquid crystal composition contains a solvent, it is preferable to adjust the content of the solvent such that the concentration of solid contents is 20% to 50% by mass.

<Polymerizable Monomer>

The liquid crystal composition according to the embodiment of the present invention may contain a polymerizable monomer different from the polymerizable liquid crystal compound.

Examples of the polymerizable monomer include a radically polymerizable compound and a cationically polymerizable compound, among which a polyfunctional radically polymerizable monomer is preferable. Examples of the polymerizable monomer include polymerizable monomers described in paragraphs [0018] to [0020] of JP2002-296423A.

The content of the polymerizable monomer in the liquid crystal composition according to the embodiment of the present invention is not particularly limited, and is preferably 1% to 50% by mass and more preferably 5% to 30% by mass with respect to the total mass of the liquid crystal compound.

<Polymer>

The liquid crystal composition according to the embodiment of the present invention may contain a polymer.

Examples of the polymer include cellulose esters. Examples of the cellulose ester include cellulose esters described in paragraph [0178] of JP2000-155216A.

The content of the polymer in the liquid crystal composition according to the embodiment of the present invention is not particularly limited, and is preferably 0.1% to 10% by mass and more preferably 0.1% to 8% by mass with respect to the total mass of the liquid crystal compound.

<Polymerization Inhibitor>

The liquid crystal composition according to the embodiment of the present invention may contain a polymerization inhibitor.

Examples of the polymerization inhibitor include a hindered phenol-based antioxidant.

The content of the polymer in the liquid crystal composition according to the embodiment of the present invention is not particularly limited, and is preferably 0.1% to 8% by mass and more preferably 0.1% to 5% by mass with respect to the total mass of the liquid crystal compound.

<Other Additives>

The liquid crystal composition according to the embodiment of the present invention may contain components other than the foregoing components. Examples of other components include other additives such as an antioxidant, an ultraviolet absorber, a sensitizer, a stabilizer, a plasticizer, a chain transfer agent, an antifoaming agent, a leveling agent, a thickener, a flame retardant, a dispersant, and a coloring material such as a dye or a pigment.

In addition, the liquid crystal composition according to the embodiment of the present invention may contain an additive (alignment control agent) that promotes horizontal alignment or vertical alignment in order to bring a liquid crystal compound into a horizontal alignment state or a vertical alignment state.

[Method for Producing Optically Anisotropic Layer Using Liquid Crystal Composition]

Hereinafter, an example of a method for producing an optically anisotropic layer using the liquid crystal composition according to the embodiment of the present invention will be described.

As described above, the liquid crystal composition according to the embodiment of the present invention contains a chiral agent containing at least a chiral agent A and a chiral agent B. The liquid crystal composition according to the embodiment of the present invention is capable of forming an optically anisotropic layer having various characteristics by appropriately setting the types of the chiral agent A and the chiral agent B to be introduced into the liquid crystal composition and the concentrations thereof added.

Hereinafter, a specific embodiment of the liquid crystal composition according to the embodiment of the present invention and a method for producing an optically anisotropic layer using the liquid crystal composition according to the above-described embodiment will be described.

<Liquid Crystal Composition of First Embodiment and Method for Producing Optically Anisotropic Layer Using Same>

(Liquid Crystal Composition of First Embodiment)

The liquid crystal composition of the first embodiment contains a chiral agent containing at least a chiral agent A and a chiral agent B. In the liquid crystal composition of the first embodiment, the chiral agent B is a chiral agent that induces a helix in a helical direction opposite to a helical direction of a helix induced by the chiral agent A, and whose helical twisting power does not change even upon irradiation with light having a wavelength of 365 nm (non-photosensitive chiral agent).

In the liquid crystal composition of the first embodiment, aspects other than the above-mentioned characteristics of the chiral agent B are as described above.

In the following, a specific example of a method for producing an optically anisotropic layer using the liquid crystal composition of the first embodiment is shown below. In the first and second embodiments of the method for producing an optically anisotropic layer, the liquid crystal compound is preferably a polymerizable liquid crystal compound.

(First Embodiment of Method for Producing Optically Anisotropic Layer)

The first embodiment of the method for producing an optically anisotropic layer has the following steps 1 to 5.

Step 1: a step of forming a composition layer on a substrate using the liquid crystal composition of the first embodiment Step 2: a step of subjecting the composition layer to a heat treatment to align the liquid crystal compound in the composition layer Step 3: a step of subjecting the composition layer to light irradiation under a condition of an oxygen concentration of 1% by volume or more, after the step 2

Step 5: a step of subjecting the composition layer to a heat treatment between the step 3 and the step 4 which will be described later Step 4: a step of subjecting the light-irradiated composition layer to a curing treatment to fix an alignment state of the liquid crystal compound to form an optically anisotropic layer Hereinafter, the procedure of each of the above steps will be described in detail with reference to the accompanying drawings.

The first embodiment has the step 5, but as will be described later, it may be an aspect in which the step 3 is carried out under heating conditions without carrying out the step 5.

In addition, in the following, an aspect of forming an optically anisotropic layer which has, along a thickness direction, a plurality of regions in which alignment states of the liquid crystal compound are different by steps 1 to 5 will be mainly described; but as will be described later, for example, depending on various conditions such as formulating a polymerization inhibitor in the liquid crystal composition (composition layer), it is also possible to form a composition layer in which the alignment state in which the liquid crystal compound is twist-aligned along a helical axis extending along the thickness direction of the composition layer is continuous in the entire region in a thickness direction.

In the following, the state in which the liquid crystal compound is twist-aligned along a helical axis extending along a thickness direction may be referred to as "twisted alignment".

<<Step 1>>

The step 1 is a step of forming a composition layer on a substrate using the liquid crystal composition of the first embodiment. Carrying out this step leads to the formation of a composition layer to be subjected to a light irradiation treatment which will be described later. The liquid crystal composition of the first embodiment is as described above.

Substrate

The substrate is a plate that supports the composition layer.

The substrate is preferably a transparent substrate. The transparent substrate is intended to refer to a substrate having a visible light transmittance of 60% or more, which preferably has a visible light transmittance of 80% or more and more preferably 90% or more.

The retardation value (Rth (550)) of the substrate in a thickness direction at a wavelength of 550 nm is not particularly limited, and is preferably −110 to 110 nm and more preferably −80 to 80 nm.

The in-plane retardation value (Re (550)) of the substrate at a wavelength of 550 nm is not particularly limited, and is preferably 0 to 50 nm, more preferably 0 to 30 nm, and still more preferably 0 to 10 nm.

A polymer having excellent optical performance transparency, mechanical strength, heat stability, moisture shielding property, isotropy, and the like is preferable as the material for forming the substrate.

Examples of the polymer film that can be used as the substrate include a cellulose acylate film (for example, a cellulose triacetate film (refractive index: 1.48), a cellulose diacetate film, a cellulose acetate butyrate film, or a cellulose acetate propionate film), a polyolefin film such as polyethylene or polypropylene, a polyester film such as polyethylene terephthalate or polyethylene naphthalate, a polyether sulfone film, a polyacrylic film such as polymethylmethacrylate, a polyurethane film, a polycarbonate film, a poly-sulfone film, a polyether film, a polymethylpentene film, a polyether ketone film, a (meth)acrylic nitrile film, and a film of a polymer having an alicyclic structure (a norbornene-based resin (ARTON: trade name, manufactured by JSR Corporation), or an amorphous polyolefin (ZEONEX: trade name, manufactured by Zeon Corporation)).

Above all, the material for the polymer film is preferably triacetyl cellulose, polyethylene terephthalate, or a polymer having an alicyclic structure, and more preferably triacetyl cellulose.

The substrate may contain various additives (for example, an optical anisotropy adjuster, a wavelength dispersion adjuster, a fine particle, a plasticizer, an ultraviolet inhibitor, a deterioration inhibitor, and a release agent).

The thickness of the substrate is not particularly limited, and is preferably 10 to 200 m, more preferably 10 to 100 μm, and still more preferably 20 to 90 μm. In addition, the substrate may consist of a plurality of layers laminated. In order to improve the adhesion of the substrate to the layer provided thereon, the surface of the substrate may be subjected to a surface treatment (for example, a glow discharge treatment, a corona discharge treatment, an ultraviolet (UV) treatment, or a flame treatment).

In addition, an adhesive layer (undercoat layer) may be provided on the substrate.

In addition, in order to impart slipperiness in a transport step and prevent a back surface and a front surface from sticking to each other after winding, a polymer layer in which inorganic particles having an average particle diameter of about 10 to 100 nm are mixed in a solid content mass ratio of 5% to 40% by mass may be arranged on one side of the substrate.

The substrate may be a so-called temporary support. That is, the substrate may be peeled off from the optically anisotropic layer after carrying out the method for producing an optically anisotropic layer of this embodiment.

In addition, the surface of the substrate may be directly subjected to a rubbing treatment. That is, a substrate that has been subjected to a rubbing treatment may be used. The direction of the rubbing treatment is not particularly limited, and an optimum direction is appropriately selected according to the direction in which the liquid crystal compound is desired to be aligned.

A treatment method widely adopted as a liquid crystal alignment treatment step of a liquid crystal display (LCD) can be applied for the rubbing treatment. That is, a method of obtaining alignment by rubbing the surface of the substrate in a certain direction with paper, gauze, felt, rubber, nylon fiber, polyester fiber, or the like can be used.

An alignment film may be arranged on the substrate.

The alignment film can be formed by means such as rubbing treatment of an organic compound (preferably a polymer), oblique vapor deposition of an inorganic compound, formation of a layer having microgrooves, or accumulation of an organic compound (for example, ω-tricosanoic acid, dioctadecylmethylammonium chloride, or methyl stearate) by the Langmuir-Blodgett (LB) film method.

Further, there is also known an alignment film capable of expressing an alignment function by application of an electric field, application of a magnetic field, or light (preferably polarized light) irradiation.

The alignment film is preferably formed by a rubbing treatment of a polymer.

Examples of the polymer contained in the alignment film include a methacrylate-based copolymer, a styrene-based copolymer, a polyolefin, a polyvinyl alcohol and a modified polyvinyl alcohol, a poly(N-methylolacrylamide), a polyester, a polyimide, a vinyl acetate copolymer, a carboxymethyl cellulose, and a polycarbonate described in paragraph [0022] of JP1996-338913A (JP-H08-338913A). In addition, a silane coupling agent can also be used as the polymer.

Above all, a water-soluble polymer (for example, a poly(N-methylolacrylamide), a carboxymethyl cellulose, a gelatin, a polyvinyl alcohol, or a modified polyvinyl alcohol) is preferable; a gelatin, a polyvinyl alcohol, or a modified polyvinyl alcohol is more preferable; and a polyvinyl alcohol or a modified polyvinyl alcohol is still more preferable.

As described above, the alignment film can be formed by applying a solution containing the above-mentioned polymer which is an alignment film forming material and an optional additive (for example, a crosslinking agent) onto a substrate, followed by heat-drying (crosslinking) and a rubbing treatment.

Procedure of Step 1

In the step 1, a composition layer is formed on a substrate using the liquid crystal composition of the first embodiment, but the procedure is not particularly limited. For example, a method of applying the liquid crystal composition of the first embodiment onto a substrate, followed by a drying treatment if necessary (hereinafter, also simply referred to as "coating method"), and a method of separately forming a composition layer and transferring the formed layer onto a substrate can be mentioned. Among them, the coating method is preferable from the viewpoint of productivity.

The application method is not particularly limited, and examples thereof include a wire bar coating method, an extrusion coating method, a direct gravure coating method, a reverse gravure coating method, and a die-coating method.

If necessary, a treatment for drying the coating film applied onto the substrate may be carried out after application of the composition. The solvent can be removed from the coating film by carrying out the drying treatment.

The film thickness of the coating film is not particularly limited and is preferably 0.1 to 20 μm, more preferably 0.2 to 15 μm, and still more preferably 0.5 to 10 μm.

<<Step 2>>

The step 2 is a step of subjecting the composition layer to a heat treatment to align the liquid crystal compound in the composition layer. Carrying out this step brings the liquid crystal compound in the composition layer into a predetermined alignment state.

With regard to heat treatment conditions, the optimum conditions are selected according to the liquid crystal compound used.

Above all, the heating temperature is often 10° C. to 250° C., more often 40° C. to 150° C., and still more often 50° C. to 130° C.

The heating time is often 0.1 to 60 minutes and more often 0.2 to 5 minutes.

The alignment state of the liquid crystal compound obtained in the step 2 changes according to the helical twisting power of the chiral agent described above. For example, in order to form an optically anisotropic layer in which the alignment state of the liquid crystal compound twist-aligned along a helical axis extending along a thickness direction is fixed, the absolute value of the weighted average helical twisting power of the chiral agent in the composition layer formed in the step 1 is preferably 0.0 to 1.9 $\mu m^{-1}$, more preferably 0.0 to 1.5 $\mu m^{-1}$, still more preferably 0.0 to 1.0 $\mu m^{-1}$, particularly preferably 0.0 $\mu m^{-1}$ or more and less than 0.5 $\mu m^{-1}$, and most preferably zero.

In a case where the absolute value of the weighted average helical twisting power of the chiral agent in the composition layer formed in the step 1 is less than 0.5 µm$^{-1}$, a composition layer 12 in which a liquid crystal compound LC is homogeneously aligned can be formed on a substrate 10, as shown in FIG. 1. It should be noted that FIG. 1 is a schematic cross-sectional view of the substrate 10 and the composition layer 12. It is assumed that the chiral agent A and the chiral agent B are present in the composition layer 12 shown in FIG. 1 at the same concentration, the helical direction induced by the chiral agent A is levorotatory, the helical direction induced by the chiral agent B is dextrorotatory, and the helical direction is right-handed and the absolute value of the weighted average helical twisting power of the chiral agent in the composition layer before light irradiation is less than 0.5 m$^{-1}$.

The homogeneous alignment in the present specification refers to a state in which a molecular axis of a liquid crystal compound (for example, a major axis in a case of a rod-like liquid crystal compound) is arranged horizontally and in the same direction with respect to the surface of the composition layer (optical uniaxiality).

Here, "horizontal" does not require that the molecular axis of the liquid crystal compound is strictly horizontal with respect to the surface of the composition layer, but is intended to mean an alignment in which the tilt angle of the average molecular axis of the liquid crystal compound in the composition layer with the surface of the composition layer is less than 20 degrees.

In addition, the same direction does not require that the molecular axis of the liquid crystal compound is arranged strictly in the same direction with respect to the surface of the composition layer, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

On the other hand, although an aspect in which the liquid crystal compound LC is homogeneously aligned has been described in FIG. 1, the aspect is not limited as long as the liquid crystal compound is brought into a predetermined alignment state. For example, in a case where the absolute value of the weighted average helical twisting power of the chiral agent in the composition layer formed in the step 1 is 0.5 µm$^{-1}$ or more, a composition layer in an alignment state in which the liquid crystal compound is twist-aligned along a helical axis extending along a thickness direction can be formed through the step 2, as will be described in detail later. The alignment state of the liquid crystal compound in the composition layer formed in the step 2 may be as described above.

<<Step 3>>

The step 3 is a step of subjecting the composition layer to light irradiation under a condition of an oxygen concentration of 1% by volume or more, after the step 2. In a case where the composition layer is irradiated with light, the chiral agent A in the light-irradiated region is exposed to light and therefore a helical twisting power thereof changes. In the following, the mechanism of this step will be described with reference to the accompanying drawings. In the following, an example in which the step 3 is carried out on the composition layer 12 shown in FIG. 1 will be described as a representative example.

Figure 2:
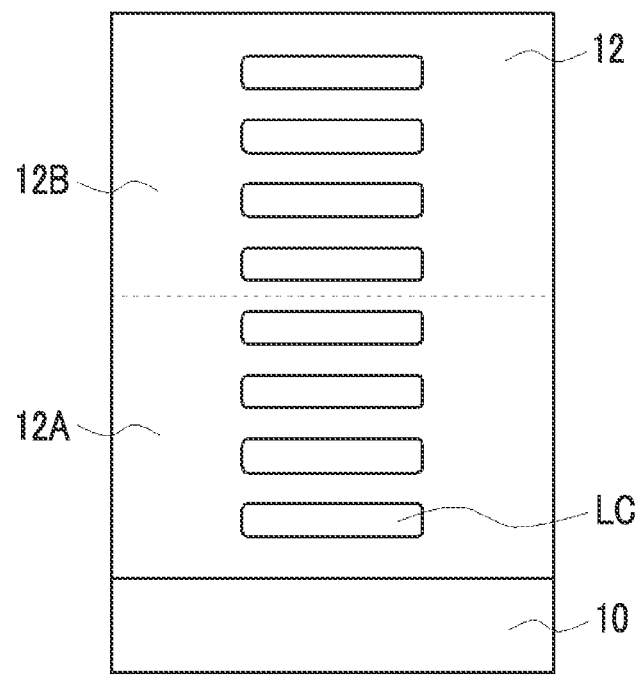
FIG. 2 is a cross-sectional view of a composition layer for explaining an example of a step 3 in the first embodiment of the method for producing an optically anisotropic layer.
Figure 2:
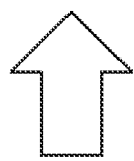

As shown in FIG. 2, in the step 3, light irradiation is carried out from the direction opposite to the composition layer 12 side of the substrate 10 (the direction of the white arrow in FIG. 2) under the condition that the oxygen concentration is 1% by volume or more. Although the light irradiation is carried out from the substrate 10 side in FIG. 2, the light irradiation may be carried out from the composition layer 12 side.

At that time, in a case where a lower region 12A of the composition layer 12 on the substrate 10 side and an upper region 12B on the side opposite to the substrate 10 side are compared, the surface of the upper region 12B is on the air side, so that the oxygen concentration in the upper region 12B is high and the oxygen concentration in the lower region 12A is low. Therefore, in a case where the composition layer 12 is irradiated with light, the polymerization of the liquid crystal compound easily proceeds in the lower region 12A, and the alignment state of the liquid crystal compound is fixed. The chiral agent A is also present in the lower region 12A, and the chiral agent A is also exposed to light and therefore the helical twisting power changes. However, since the alignment state of the liquid crystal compound is fixed in the lower region 12A, there is no change in the alignment state of the liquid crystal compound even in a case where the step 4 of subjecting the light-irradiated composition layer to a heat treatment, which will be described later, is carried out.

In addition, since the oxygen concentration is high in the upper region 12B, the polymerization of the liquid crystal compound is inhibited by oxygen and therefore the polymerization does not proceed easily even in a case where light irradiation is carried out. Since the chiral agent A is also present in the upper region 12B, the chiral agent A is exposed to light and therefore the helical twisting power changes. Therefore, in a case where the step 4 (heat treatment) which will be described later is carried out, the alignment state of the liquid crystal compound changes along with the changed helical twisting power.

That is, the immobilization of the alignment state of the liquid crystal compound is likely to proceed in the substrate-side region (lower region) of the composition layer by carrying out the step 3. In addition, the immobilization of the alignment state of the liquid crystal compound is difficult to proceed in the region of the composition layer (upper region) opposite to the substrate side, and the helical twisting power changes according to the exposed chiral agent A.

The step 3 is carried out under the condition that the oxygen concentration is 1% by volume or more. Above all, the oxygen concentration is preferably 2% by volume or more and more preferably 5% by volume or more from the viewpoint that regions having different alignment states of the liquid crystal compound are likely to be formed in the optically anisotropic layer. The upper limit of the oxygen concentration is not particularly limited and may be, for example, 100% by volume. It is also preferable that the step 3 is carried out in the atmosphere.

The irradiation intensity of the light irradiation in the step 3 is not particularly limited and can be appropriately determined based on the helical twisting power of the chiral agent A. The irradiation amount of light irradiation in the step 3 is not particularly limited, and is preferably 300 mi/cm$^2$ or less and more preferably 200 mJ/cm$^2$ or less from the viewpoint that a predetermined optically anisotropic layer is easily formed. The lower limit of the irradiation amount is preferably 10 mJ/cm$^2$ or more and more preferably 30 mJ/cm$^2$ or more from the viewpoint that a predetermined optically anisotropic layer is easily formed.

The light irradiation in the step 3 in the first embodiment is preferably carried out at 15° C. to 70° C. (preferably 15° C. to 50° C.).

The light used for the light irradiation is the light that the chiral agent A is exposed to, and is preferably an ultraviolet ray (preferably light having a wavelength of 365 nm).

On the other hand, although an aspect in which the alignment state of the liquid crystal compound is different between the alignment state of the liquid crystal compound is different between the region (lower region) of the composition layer on the substrate side and the region (upper region) of the composition layer opposite to the substrate side has been described in FIG. 2, this aspect is not limited as long as the liquid crystal compound is brought into a twist-aligned alignment state in the composition layer that has undergone the step 3. For example, depending on various conditions such as formulating a polymerization inhibitor in the composition layer, it is possible to suppress the progress of polymerization in the region (lower region) of the composition layer on the substrate side in the step 3, and as a result, it is also possible to form a composition layer with an aspect in which the alignment state of the liquid crystal compound is uniform between the region (lower region) of the composition layer on the substrate side and the region (upper region) of the composition layer opposite to the substrate side. In other words, it is also possible to form a composition layer in which the alignment state in which the liquid crystal compound is twist-aligned along a helical axis extending along the thickness direction of the composition layer is continuous in the entire region in a thickness direction, and the composition layer that has undergone the step 3 may have such an aspect.

<<Step 5>>

The step 5 is a step of subjecting the composition layer to a heat treatment between the step 3 and the step 4 which will be described later. Carrying out this step leads to a change in the alignment state of the liquid crystal compound in the region where the helical twisting power of the chiral agent A in the composition layer subjected to light irradiation changes.

In the following, the mechanism of this step will be described with reference to the accompanying drawings. In the following, a case where the step 5 is carried out after the step 3 is carried out on the composition layer 12 shown in FIG. 1 will be described as a representative example.

As described above, in a case where the step 3 is carried out on the composition layer 12 shown in FIG. 1, the alignment state of the liquid crystal compound is fixed in the lower region 12A, whereas the polymerization of the liquid crystal compound is difficult to proceed and the alignment state of the liquid crystal compound is not fixed in the upper region 12B. In addition, the helical twisting power of the chiral agent A changes in the upper region 12B. In a case where such a change in the helical twisting power of the chiral agent A occurs, the force of twisting the liquid crystal compound changes in the upper region 12B, as compared with the state before light irradiation. This point will be described in more detail.

As described above, the chiral agent A and the chiral agent B are present in the composition layer 12 shown in FIG. 1 at the same concentration, the helical direction induced by the chiral agent A is levorotatory, the helical direction induced by the chiral agent B is dextrorotatory, and the helical direction is right-handed and the absolute value of the weighted average helical twisting power of the chiral agent in the composition layer before light irradiation is less than 0.5 μm.

Figure 4:
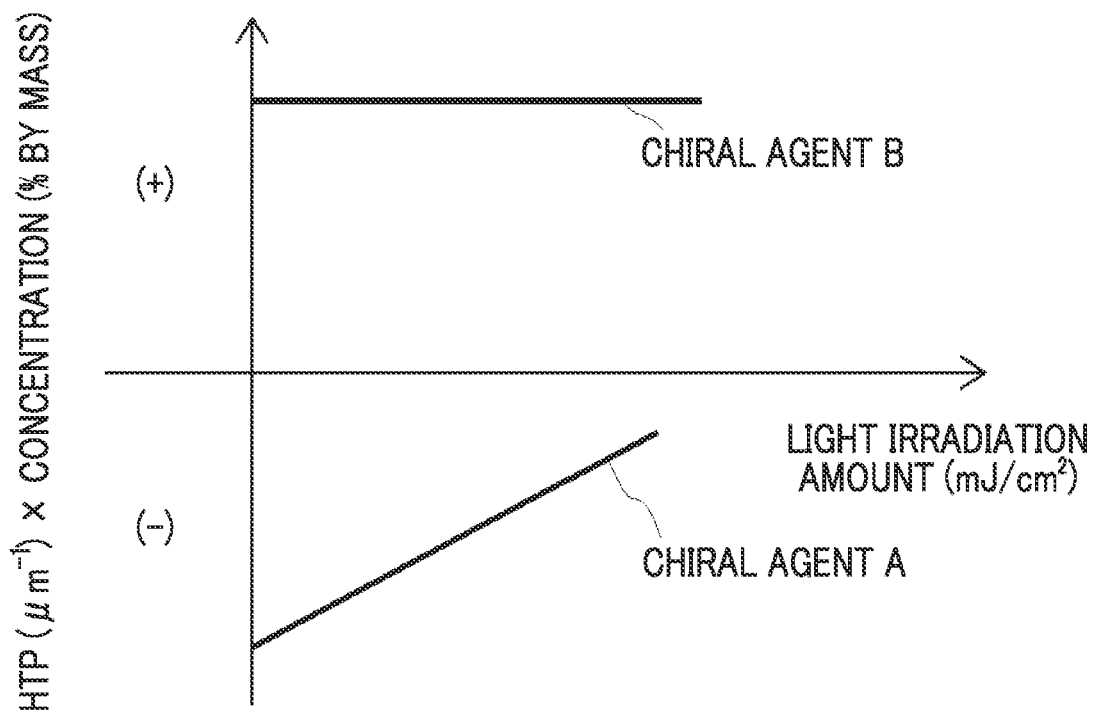
FIG. 4 is a schematic diagram of a graph plotting a relationship between a helical twisting power (HTP) ($\mu m^{-1}$)×a concentration (% by mass) and a light irradiation amount ($mJ/cm^2$) for each of an optically active compound A (chiral agent A) and an optically active compound B (chiral agent B).

The above aspect is shown in FIG. 4. In FIG. 4, the vertical axis represents the "helical twisting power (μm$^{-1}$) of chiral agent x concentration (% by mass) of chiral agent", the helical twisting power increases as the value thereof deviates from zero. First, the relationship between the chiral agent A and the chiral agent B in the composition layer before light irradiation corresponds to the time in a case where the light irradiation amount is zero, and therefore corresponds to a state in which the absolute value of "helical twisting power (μm$^{-1}$) of chiral agent A×concentration (% by mass) of chiral agent A" and the absolute value of "helical twisting power (μm$^{-1}$) of chiral agent B×concentration (% by mass) of chiral agent B" are equal. That is, the helical twisting powers of both the chiral agent A that induces levorotatory turning and the chiral agent B that induces dextrorotatory turning are offset.

Figure 5:
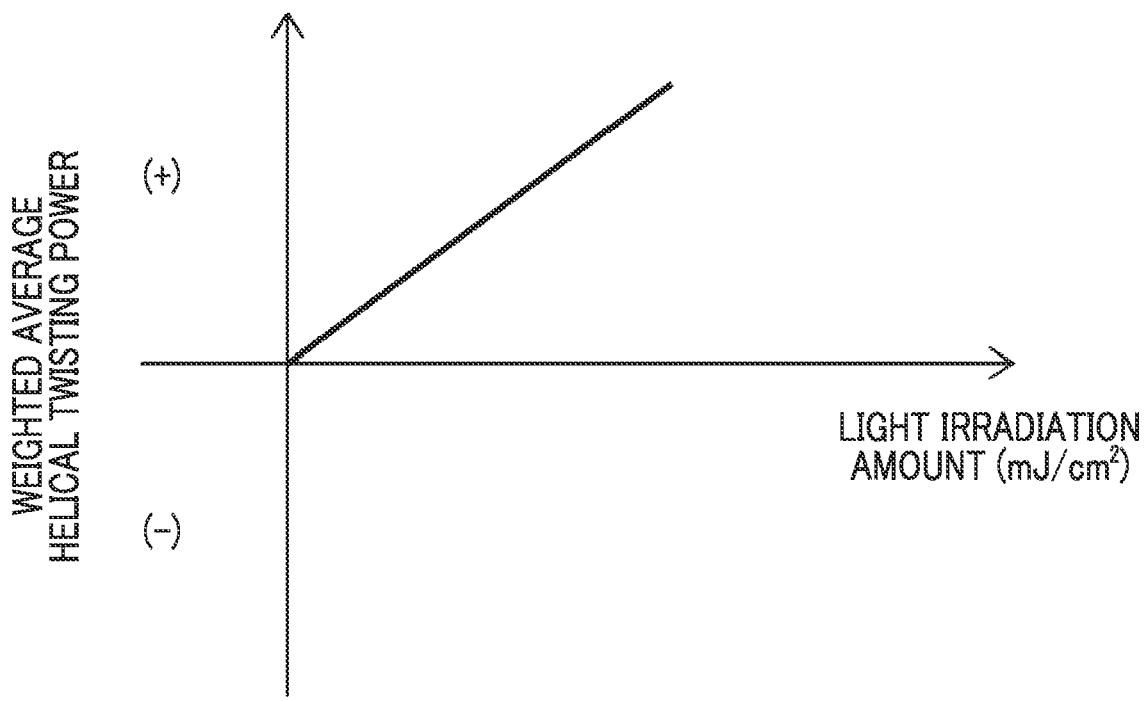
FIG. 5 is a schematic diagram of a graph plotting a relationship between a weighted average helical twisting power ($\mu m^{-1}$) and a light irradiation amount ($mJ/cm^2$) in a system in which chiral agent A and chiral agent B are used in combination.

In a case where light irradiation is carried out in the upper region 12B in such a state and the helical twisting power of the chiral agent A decreases with the light irradiation amount as shown in FIG. 4, the weighted average helical twisting power of the chiral agent in the upper region 12B becomes large and therefore the dextrorotatory helical twisting power becomes strong, as shown in FIG. 5. That is, as for the helical twisting power that induces the helix of the liquid crystal compound, an increase in the irradiation amount leads to an increase in the helical twisting power in the direction (+) of the helix induced by the chiral agent B.

Figure 3:
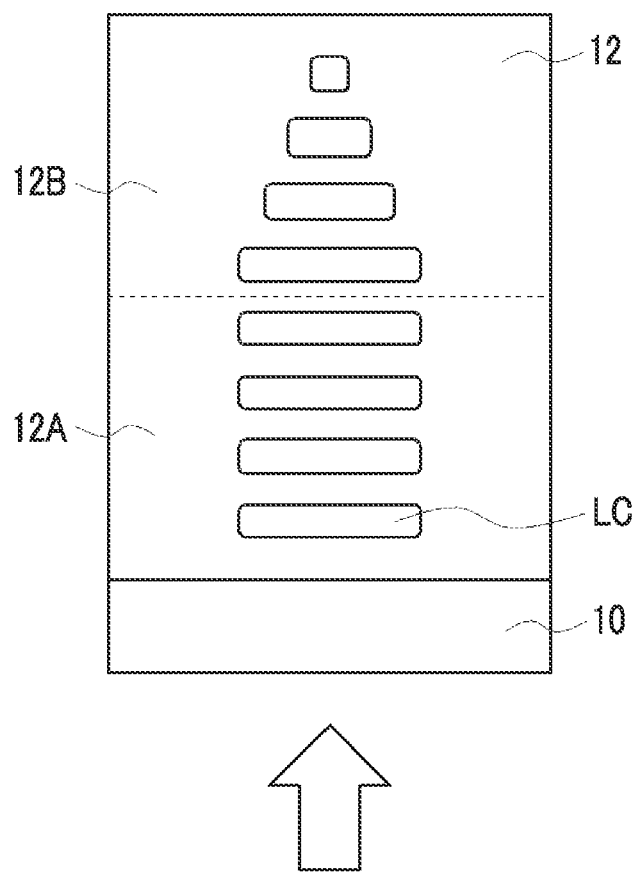
FIG. 3 is a cross-sectional view of a composition layer for explaining an example in a case where a step 5 in the first embodiment of the method for producing an optically anisotropic layer is carried out.

Therefore, in a case where the composition layer 12 after the step 3 in which such a change in the weighted average helical twisting power occurred is subjected to a heat treatment to promote the realignment of the liquid crystal compound, the liquid crystal compound LC is twist-aligned along a helical axis extending along the thickness direction of the composition layer 12 in the upper region 12B, as shown in FIG. 3.

On the other hand, as described above, the polymerization of the liquid crystal compound proceeds to fix the alignment state of the liquid crystal compound during the step 3 in the lower region 12A of the composition layer 12, so that the realignment of the liquid crystal compound does not proceed.

As described above, carrying out the step 5 leads to the formation of a plurality of regions having different alignment states of the liquid crystal compound along the thickness direction of the composition layer.

The aspect in which a chiral agent whose helical twisting power decreases upon irradiation with light is used as the chiral agent A has been described in FIGS. 4 and 5, but the present invention is not limited to this aspect. For example, a chiral agent whose helical twisting power increases upon irradiation with light may be used as the chiral agent A. In that case, the helical twisting power induced by the chiral agent A increases upon irradiation with light and therefore the liquid crystal compound is twist-aligned in the turning direction induced by the chiral agent A.

With regard to heat treatment conditions, the optimum conditions are selected according to the liquid crystal compound used.

Above all, the heating temperature is preferably a temperature for heating from the state of the step 3, often 35° C. to 250° C., more often 50° C. to 150° C., still more often higher than 50° C. and 150° C. or lower, and particularly often 60° C. to 130° C.

The heating time is often 0.01 to 60 minutes and more often 0.03 to 5 minutes.

In addition, the absolute value of the weighted average helical twisting power of the chiral agent in the composition layer after light irradiation is not particularly limited, and the absolute value of the difference between the weighted average helical twisting power of the chiral agent in the composition layer after light irradiation and the weighted average helical twisting power of the chiral agent in the composition layer before light irradiation is preferably 10 $\mu m^{-1}$ or more and more preferably 15 $\mu m^{-1}$. The upper limit value thereof is not particularly limited and is often 50 $\mu m^{-1}$ or less.

<<Step 4>>

The step 4 is a step of subjecting the light-irradiated composition layer to a curing treatment to fix an alignment state of the liquid crystal compound to form an optically anisotropic layer having a plurality of regions having different alignment states of the liquid crystal compound along a thickness direction, after the step 5. By carrying out this step, the alignment state of the liquid crystal compound in the composition layer is fixed, and as a result, a predetermined optically anisotropic layer is formed. For example, in a case where the composition layer 12 shown in FIG. 3 is subjected to a curing treatment, an optically anisotropic layer is formed which has, along a thickness direction, a first region in which the alignment state of the liquid crystal compound twist-aligned along a helical axis extending along a thickness direction is fixed and a second region in which the alignment state of the homogeneously aligned liquid crystal compound is fixed.

The method of the curing treatment is not particularly limited, and examples thereof include a photocuring treatment and a thermal curing treatment. Above all, a light irradiation treatment is preferable, and an ultraviolet irradiation treatment is more preferable.

For ultraviolet irradiation, a light source such as an ultraviolet lamp is used.

The irradiation amount of light (for example, ultraviolet rays) is not particularly limited, and is generally preferably about 100 to 800 mJ/cm$^2$.

The alignment state of the liquid crystal compound is fixed in the optically anisotropic layer obtained by carrying out the curing treatment.

The "fixed" state is the most typical and preferable aspect of a state in which the alignment of the liquid crystal compound is maintained. The "fixed" state is not limited thereto and is specifically more preferably a state in which, in a temperature range of usually 0° C. to 50° C. or in a temperature range of −30° C. to 70° C. under more severe conditions, the layer has no fluidity and a fixed alignment morphology can be maintained stably without causing a change in the alignment morphology due to an external field or an external force.

In the optically anisotropic layer, it is no longer necessary for the composition in the layer to finally exhibit liquid crystallinity.

In the aspect shown in FIG. 3, an optically anisotropic layer is prepared which has, along a thickness direction, a first region in which the alignment state of the liquid crystal compound right-handed twist-aligned along a helical axis extending along a thickness direction is fixed and a second region in which the alignment state of the homogeneously aligned liquid crystal compound is fixed, but the present invention is not limited to the above aspect.

For example, the twisted alignment of the liquid crystal compound may be a left-handed twist. That is, the direction of the twisted alignment of the liquid crystal compound may be a left-handed twist (counterclockwise twist) or a right-handed twist (clockwise twist).

A known method can be mentioned as a method for specifying the alignment state of the liquid crystal compound. For example, there is a method of observing the cross section of the optically anisotropic layer with a polarization microscope to specify the alignment state of the liquid crystal compound.

In addition, in the aspect shown in FIG. 3, the optically anisotropic layer has two regions in which the alignment states of the liquid crystal compound are different, but the present invention is not limited to the above aspect, and the optically anisotropic layer may have three or more regions in which the alignment states of the liquid crystal compound are different.

In a case where the optically anisotropic layer has two regions in which the alignment states of the liquid crystal compound are different, the ratio of the thickness of the thick region of the two regions to the thickness of the thin region of the two regions is not particularly limited and is preferably 0.1 to 9 and more preferably 0.2 to 4.

In a case where the thicknesses of the two regions are the same, the above ratio is 1.

In addition, the optically anisotropic layer may be an optically anisotropic layer which has, along a thickness direction, a first region in which the alignment state of the liquid crystal compound twist-aligned along a helical axis extending along a thickness direction is fixed and a second region in which the alignment state of the twist-aligned liquid crystal compound is fixed at a twisted angle different from that of the first region along a helical axis extending along a thickness direction.

Figure 6:
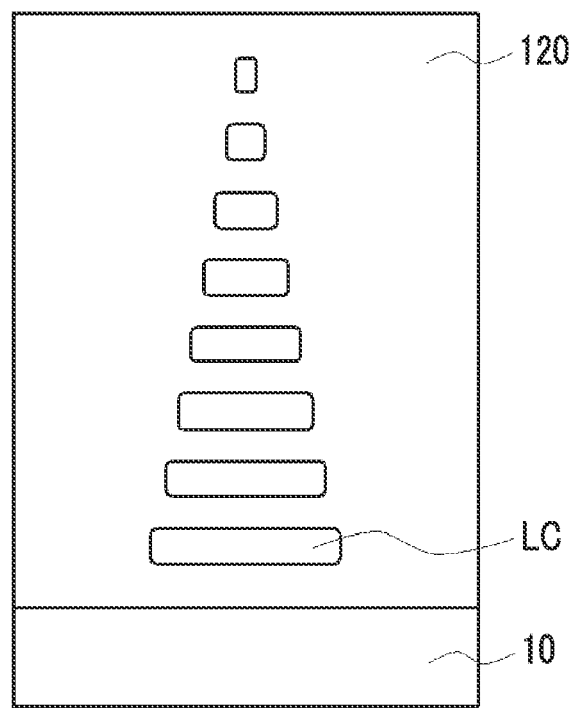
FIG. 6 is a cross-sectional view of a composition layer for explaining another example of the step 1 of the first embodiment of the method for producing an optically anisotropic layer.

As a method for forming regions having different twisted angles of liquid crystal compound as described above, for example, a method of increasing (for example, 0.5 $\mu m^{-1}$ or more, preferably more than 1.9 $\mu m^{-1}$) the absolute value of the weighted average helical twisting power of the chiral agent in the composition layer formed in the step 1 described above can be mentioned. In a case where the absolute value of the weighted average helical twisting power of the chiral agent in the composition layer formed in the step 1 is large, first, the liquid crystal compound is twist-aligned along a helical axis extending along a thickness direction in a composition layer 120 in which the step 2 is carried out, as shown in FIG. 6. In a case where the above-mentioned steps (particularly, the step 3) are carried out on such a composition layer, the twisted alignment of the liquid crystal compound is fixed as it is in the region having a low oxygen concentration (a lower region 120A in FIG. 7) in the composition layer; whereas the helical twisting power changes in the region having a high oxygen concentration (an upper region 120B in FIG. 7) in the composition layer, and as a result, a region having a different twisted angle of liquid crystal compound can be formed after the step 5 is carried out.

Hereinafter, the mechanism of action of the chiral agent will be supplemented with reference to FIGS. 8 and 9 regarding the method of forming regions in which twisted angles of the liquid crystal compound are different. In the description according to FIGS. 8 and 9, for the sake of convenience, it is assumed that a chiral agent A that induces a levorotatory helix and a chiral agent B that induces a dextrorotatory helix are present in the composition layer; the relationship between the absolute value of the helical twisting power of the chiral agent A in a case of being not exposed to light and the absolute value of the helical twisting power of the chiral agent B in a case of being not exposed to light is that the absolute value of the helical twisting power of the chiral agent A in a case of being not exposed to light>the absolute value of the helical twisting power of the chiral agent B in a case of being not exposed to light; and the chiral agent A is a chiral agent whose absolute value of the helical twisting power decreases upon exposure to light.

Figure 7:
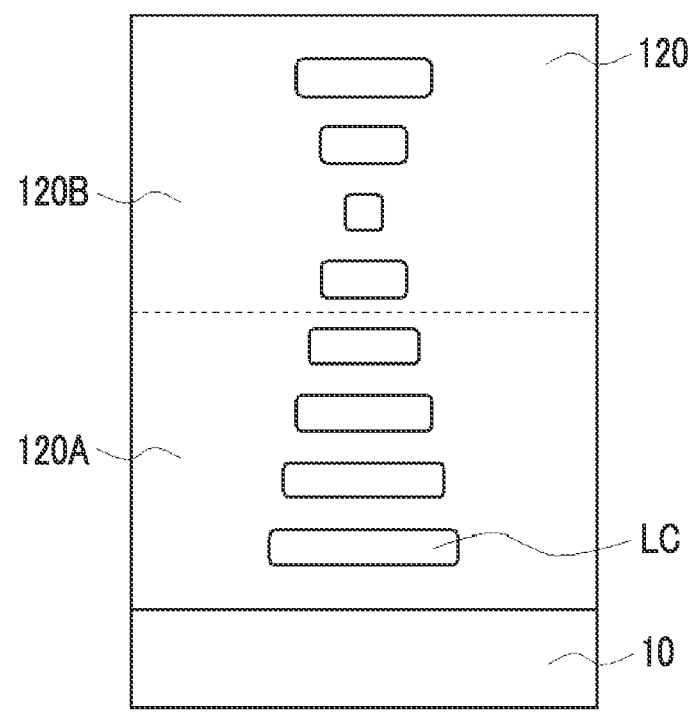
FIG. 7 is a cross-sectional view of a composition layer for explaining another example of the step 5 of the first embodiment of the method for producing an optically anisotropic layer.
Figure 8:
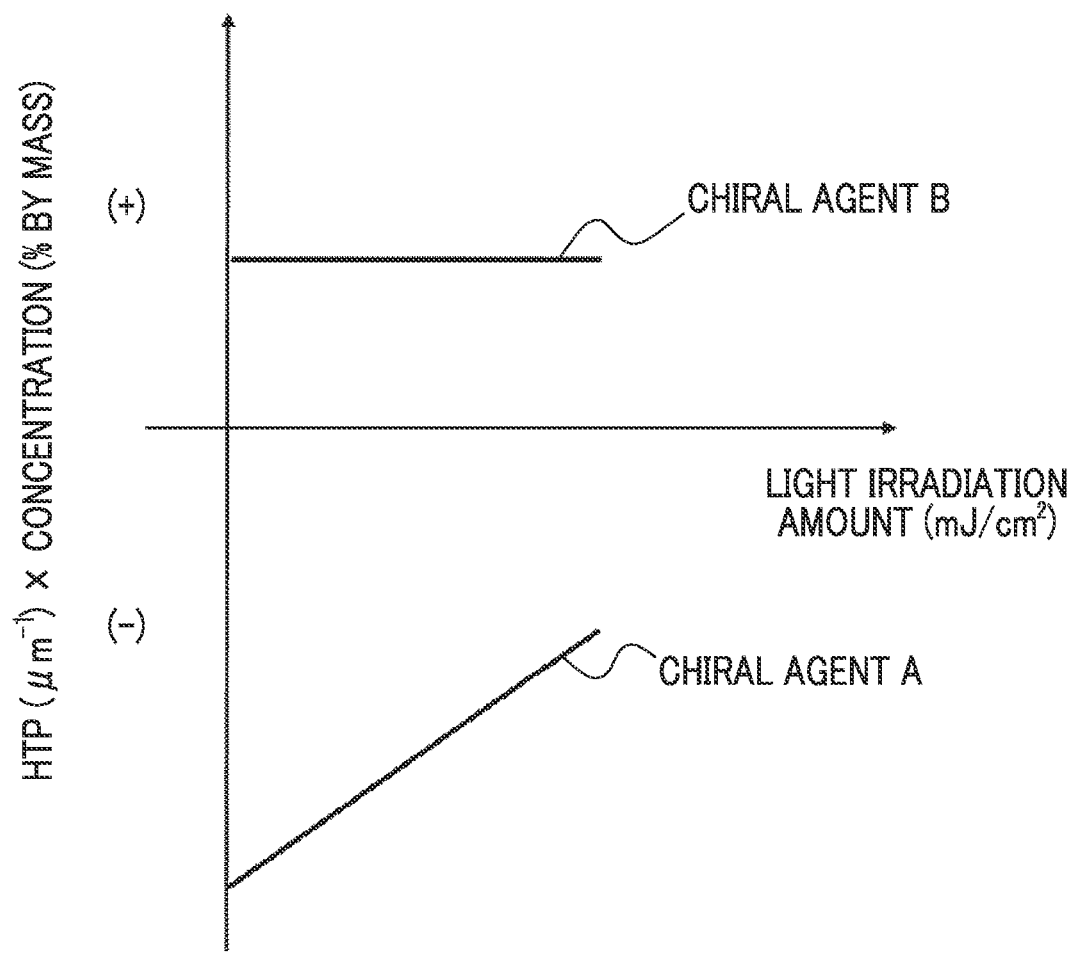
FIG. 8 is a schematic diagram of a graph plotting a relationship between a helical twisting power ($\mu m^{-1}$)×a concentration (% by mass) and a light irradiation amount ($mJ/cm^2$) for each of chiral agent A and chiral agent B.
Figure 9:
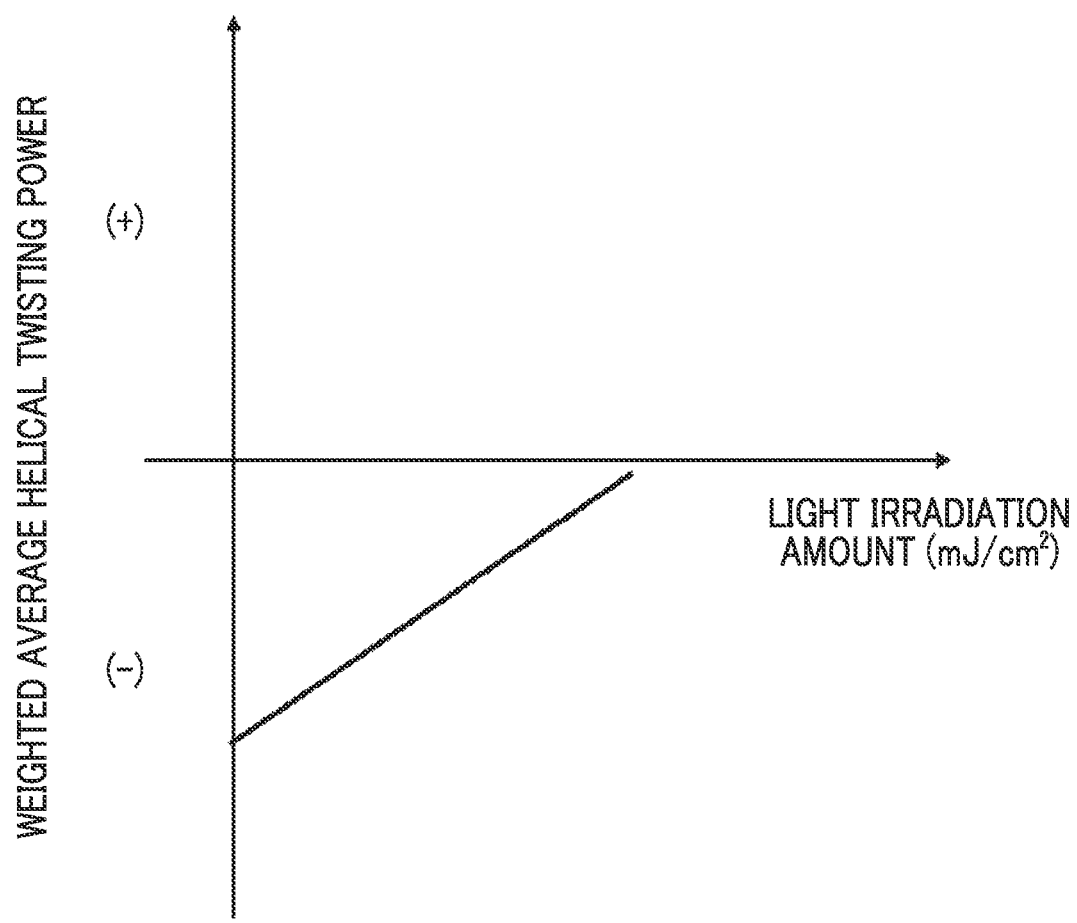
FIG. 9 is a schematic diagram of a graph plotting a relationship between a weighted average helical twisting power ($\mu m^{-1}$) and a light irradiation amount ($mJ/cm^2$) in a system in which chiral agent A and chiral agent B are used in combination.

In FIGS. 8 and 9, the relationship between the chiral agent A and the chiral agent B in the composition layer before light irradiation corresponds to the time in a case where the light irradiation amount is zero, and is therefore a state in which the absolute value of "helical twisting power ($\mu m^{-1}$) of chiral agent A×concentration (% by mass) of chiral agent A">the absolute value of "helical twisting power ($\mu m^{-1}$) of chiral agent B×concentration (% by mass) of chiral agent B". That is, the liquid crystal compound in the composition layer that has undergone the step 2 is in a state of being twist-aligned in the direction (−) of the helix induced by the chiral agent A along a helical axis extending along a thickness direction by the helical twisting power corresponding to the difference between the absolute value of "helical twisting power ($\mu m^{-1}$) of chiral agent A×concentration (% by mass) of chiral agent A" and the absolute value of "helical twisting power ($\mu m^{-1}$) of chiral agent B×concentration (% by mass) of chiral agent B". In a case where the step 3 is carried out on the composition layer in such a state and then, as shown in FIG. 8, in a case where the helical twisting power of the chiral agent A decreases depending on the light irradiation amount, the helical twisting power in the direction (+) of the helix induced by the chiral agent B increases as the irradiation amount increases, as shown in FIG. 9. As a result, as described above, the twisted alignment of the liquid crystal compound is fixed as it is in the region having a low oxygen concentration (a lower region 120A in FIG. 7) in the composition layer; whereas the helical twisting power changes in the region having a high oxygen concentration (an upper region 120B in FIG. 7) in the composition layer, and as a result, a region having a different twisted angle of liquid crystal compound can be formed after the step 5 is carried out.

The aspect in which a chiral agent whose helical twisting power decreases upon irradiation with light is used as the chiral agent A has been described in FIGS. 8 and 9, but the present invention is not limited to this aspect. For example, a chiral agent whose helical twisting power increases upon irradiation with light may be used as the chiral agent A. In that case, the helical twisting power induced by the chiral agent A increases upon irradiation with light and therefore the liquid crystal compound may take a state of more twisted twisted alignment in the turning direction induced by the chiral agent A.

The optical properties in the formed optically anisotropic layer are not particularly limited, and an optimum value is selected according to the application. Hereinafter, as an example, the case of an optically anisotropic layer which is prepared by the above-mentioned procedure and which has, along a thickness direction, a first region in which the alignment state of the liquid crystal compound twist-aligned along a helical axis extending along a thickness direction is fixed and a second region in which the alignment state of the homogeneously aligned liquid crystal compound is fixed will be described in detail.

In a case where the thickness of the first region of the optically anisotropic layer is defined as d1 and the refractive index anisotropy of the first region measured at a wavelength of 550 nm is defined as Δn1, the first region preferably satisfies Expression (1-1) from the viewpoint that an optically anisotropic layer can be suitably applied to a circularly polarizing plate.

100 nm≤Δn1d1≤240 nm     Expression (1-1)

Above all, the first region more preferably satisfies Expression (1-2) and still more preferably satisfies Expression (1-3).

120 nm≤Δn1d1≤220 nm     Expression (1-2)

140 nm≤Δn1d1≤200 nm     Expression (1-3)

The refractive index anisotropy Δn1 means the refractive index anisotropy of the first region.

The absolute value of the twisted angle of liquid crystal compound in the first region is not particularly limited and is preferably 60° to 120° and more preferably 70° to 110° from the viewpoint that an optically anisotropic layer can be suitably applied to a circularly polarizing plate.

First, the twisted alignment of the liquid crystal compound is intended to mean that the liquid crystal compound from one surface (the surface on the substrate 10 side in FIG. 3) to the other surface (the surface on the side opposite to the substrate 10 side in FIG. 3) of the first region is twisted about the thickness direction of the first region. Therefore, the twisted angle means an angle formed by the molecular axis of the liquid crystal compound on one surface of the first region (major axis in a case of a rod-like liquid crystal compound) and the molecular axis of the liquid crystal compound on the other surface of the first region.

The twisted angle is measured using Axoscan of Axometrics, Inc. and using device analysis software of Axometrics, Inc.

In addition, in a case where the thickness of the second region of the optically anisotropic layer is defined as d2 and the refractive index anisotropy of the second region measured at a wavelength of 550 nm is defined as Δn2, the second region preferably satisfies Expression (2-1) from the viewpoint that an optically anisotropic layer can be suitably applied to a circularly polarizing plate.

100 nm≤Δn2d2≤240 nm     Expression (2-1)

Above all, the second region more preferably satisfies Expression (2-2) and still more preferably satisfies Expression (2-3).

120 nm≤Δn2d2≤220 nm     Expression (2-2)

140 nm≤Δn2d2≤200 nm     Expression (2-3)

The refractive index anisotropy Δn2 means the refractive index anisotropy of the second region.

The second region is a region in which the alignment state of the homogeneously aligned liquid crystal compound is fixed. The definition of homogeneous alignment is as described above.

The difference between Δn1d1 and Δn2d2 is not particularly limited and is preferably −50 to 50 nm and more preferably −30 to 30 nm from the viewpoint that an optically anisotropic layer can be suitably applied to a circularly polarizing plate.

In addition, as in the above aspect, in a case where the optically anisotropic layer formed by the present production method has two regions in which the alignment states of the liquid crystal compound are different along a thickness direction (hereinafter, the two regions are referred to as region X and region Y), the slow axis on the surface of the region X on the region Y side and the slow axis on the surface of the region Y on the region X side are often parallel.

The optical properties in the optically anisotropic layer are not limited to the above-mentioned aspects. For example, in a case where the optically anisotropic layer has two regions in which the alignment states of the liquid crystal compound are different along a thickness direction, it is preferable that the two regions each satisfy the optical properties (relationship between twisted angle, Δnd, ReB, and slow axis of liquid crystal compound) of the first optically anisotropic layer and the second optically anisotropic layer according to claim 1 of JP5960743B.

In addition, in another aspect, in a case where the optically anisotropic layer has two regions in a thickness direction, it is preferable that the two regions satisfy the optical properties (relationship between twisted angle, Δn1d1, Δn2d2, and slow axis of liquid crystal compound) of the first optically anisotropic layer and the second optically anisotropic layer described in JP5753922B.

The optically anisotropic layer preferably exhibits reverse wavelength dispersibility. That is, it is preferable that Re (450), which is the in-plane retardation of the optically anisotropic layer measured at a wavelength of 450 nm, Re (550), which is the in-plane retardation of the optically anisotropic layer measured at a wavelength of 550 nm, and Re (650), which is the in-plane retardation of the optically anisotropic layer measured at a wavelength of 650 nm, have a relationship of Re (450)≤Re (550)≤Re (650).

The optical properties of the optically anisotropic layer are not particularly limited, and it is preferable that the optically anisotropic layer functions as a λ/4 plate.

The λ/4 plate is a plate having a function of converting linearly polarized light having a certain specific wavelength into circularly polarized light (or converting circularly polarized light into linearly polarized light), and refers to a plate (optically anisotropic layer) in which an in-plane retardation Re (λ) at a specific wavelength) nm satisfies Re (λ)=λ/4.

This expression may be achieved at any wavelength in a visible light range (for example, 550 nm), and the in-plane retardation Re (550) at a wavelength of 550 nm preferably satisfies a relationship of 110 nm≤Re (550)≤180 nm.

(Second Embodiment of Method for Producing Optically Anisotropic Layer)

The second embodiment of the method for producing an optically anisotropic layer includes the following step 1, step 2, step 3, and step 4. However, in the second embodiment, the step 3 is carried out under heating conditions.

Step 1: a step of forming a composition layer on a substrate using the liquid crystal composition of the first embodiment Step 2: a step of subjecting the composition layer to a heat treatment to align the liquid crystal compound in the composition layer Step 3: a step of subjecting the composition layer to light irradiation under a condition of an oxygen concentration of 1% by volume or more and under heating conditions, after the step 2

Step 4: a step of subjecting the light-irradiated composition layer to a curing treatment to fix an alignment state of the liquid crystal compound to form an optically anisotropic layer having a plurality of regions having different alignment states of the liquid crystal compound along a thickness direction The second embodiment and the first embodiment carry out the same treatment, except that the step 3 is carried out under heating conditions without carrying out the step 5 in the second embodiment.

Hereinafter, only the step 3 (particularly, heat treatment) of the second embodiment will be described.

In the second embodiment, the step 3 is carried out under heating conditions.

With regard to heat treatment conditions, the optimum conditions are selected according to the liquid crystal compound used.

Above all, the heating temperature is often 35° C. to 250° C., more often 50° C. to 150° C., still more often higher than 50° C. and 150° C. or lower, and particularly often 60° C. to 130° C.

The heating time is often 0.01 to 60 minutes and more often 0.03 to 5 minutes.

In the second embodiment, the composition layer as shown in FIG. 3 can be formed without carrying out a separate heating step, by carrying out the heat treatment in the step 3.

<Liquid Crystal Composition of Second Embodiment and Method for Producing Optically Anisotropic Layer Using Same>

(Liquid Crystal Composition of Second Embodiment)

The liquid crystal composition of the second embodiment contains a chiral agent containing at least a chiral agent A and a chiral agent B. In the liquid crystal composition of the first embodiment, the chiral agent B is a chiral agent that induces a helix in the same helical direction as the helical direction of a helix induced by the chiral agent A, and whose helical twisting power does not change even upon irradiation with light having a wavelength of 365 nm (non-photosensitive chiral agent).

In the liquid crystal composition of the second embodiment, aspects other than the above-mentioned characteristics of the chiral agent B are as described above.

The method for producing an optically anisotropic layer using the liquid crystal composition of the second embodiment is the same as the method for producing an optically anisotropic layer using the liquid crystal composition of the first embodiment described above, except that the liquid crystal composition is different.

In the following, only the mechanism of action of the chiral agent in a case of producing an optically anisotropic layer using the liquid crystal composition of the second embodiment will be described.

In the following description according to FIGS. 10 and 11, for the sake of convenience, it is assumed that a chiral agent A that induces a levorotatory helix and a chiral agent B that induces a dextrorotatory helix are present in the composition layer, and the chiral agent A is a chiral agent whose absolute value of the helical twisting power decreases upon exposure to light.

In a case where the first and second embodiments of the method for producing an optically anisotropic layer using the liquid crystal composition of the first embodiment described above are carried out using the liquid crystal composition of the second embodiment, the liquid crystal compound in the composition layer that has undergone the step 2 is in a state of being twist-aligned in the helical direction (−) induced by the chiral agents A and B along a helical axis extending along a thickness direction by the helical twisting power corresponding to the addition of the absolute value of "helical twisting power ($\mu m^{-1}$) of chiral agent A×concentration (% by mass) of chiral agent A" and the absolute value of "helical twisting power ($\mu m^{-1}$) of chiral agent B×concentration (% by mass) of chiral agent B".

Figure 10:
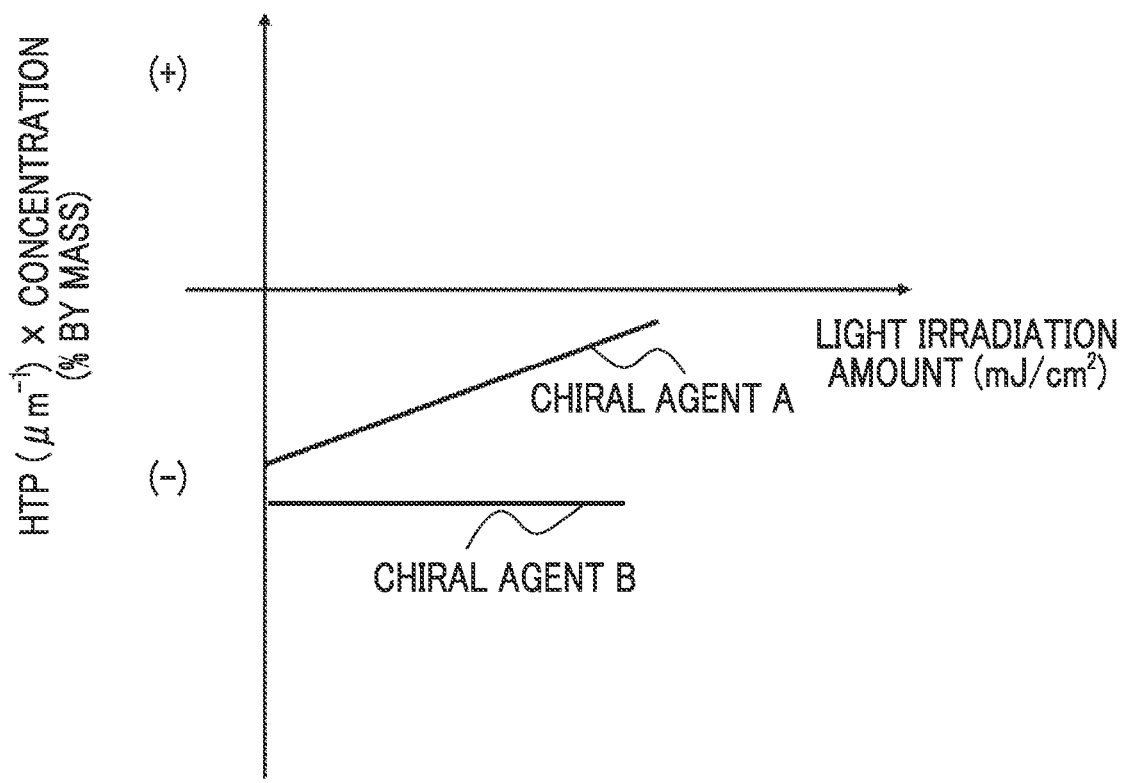
FIG. 10 is a schematic diagram of a graph plotting a relationship between a helical twisting power ($\mu m^{-1}$)×a concentration (% by mass) and a light irradiation amount ($mJ/cm^2$) for each of chiral agent A and chiral agent B.
Figure 11:
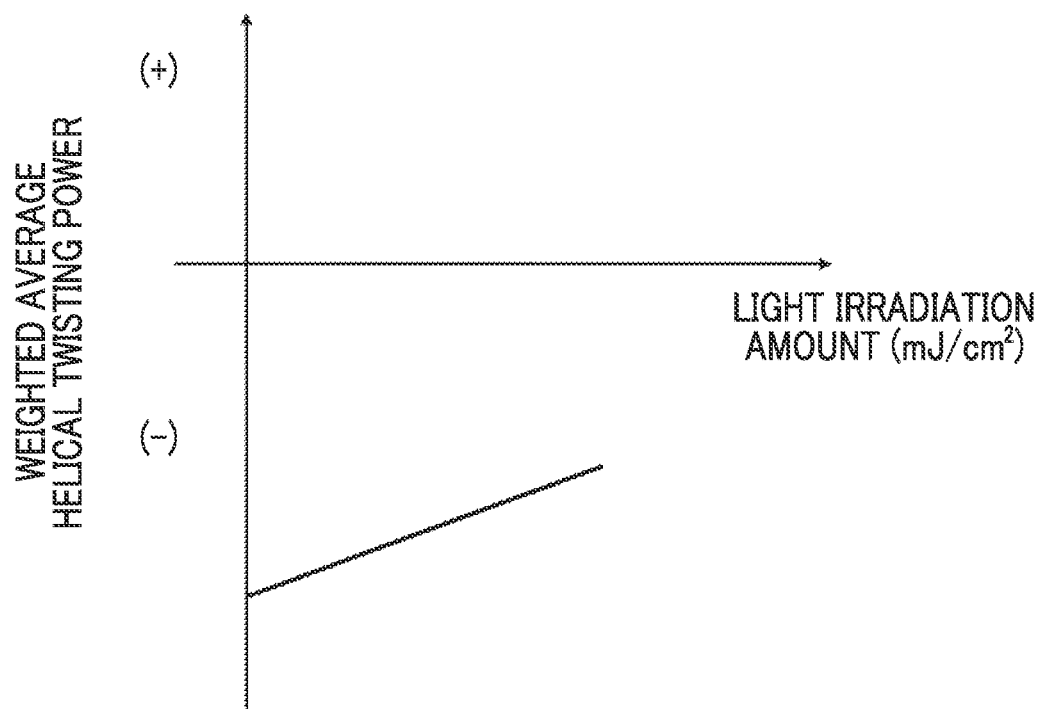
FIG. 11 is a schematic diagram of a graph plotting a relationship between a weighted average helical twisting power ($\mu m^{-1}$) and a light irradiation amount ($mJ/cm^2$) in a system in which chiral agent A and chiral agent B are used in combination.

In a case where the step 3 is carried out on the composition layer in such a state and then, as shown in FIG. 10, in a case where the helical twisting power of the chiral agent A decreases depending on the light irradiation amount, the helical twisting power in a helical direction (+) opposite to the direction of the helix induced by the chiral agents A and B increases as the irradiation amount increases, as shown in FIG. 11. As a result, it is possible to form a region in which the twisted angle of liquid crystal compound is different as shown in FIG. 7. That is, the twisted alignment of the liquid crystal compound is fixed as it is in the region having a low oxygen concentration (a lower region 120A in FIG. 7) in the composition layer; whereas the helical twisting power changes in the region having a high oxygen concentration (an upper region 120B in FIG. 7) in the composition layer, and as a result, a region having a different twisted angle of liquid crystal compound can be formed after the step 5 is carried out.

The aspect in which a chiral agent whose helical twisting power decreases upon irradiation with light is used as the chiral agent A has been described in FIGS. 10 and 11, but the present invention is not limited to this aspect. For example, a chiral agent whose helical twisting power increases upon irradiation with light may be used as the chiral agent A. In that case, the helical twisting power induced by the chiral agent A increases upon irradiation with light and therefore the liquid crystal compound may take a state of more twisted twisted alignment in the same helical direction (−) as the direction of a helix induced by the chiral agents A and B.

[Use]

The optically anisotropic layer can be applied to various applications.

[Laminate]

The optically anisotropic layer can be combined with a variety of members.

Figure 12:
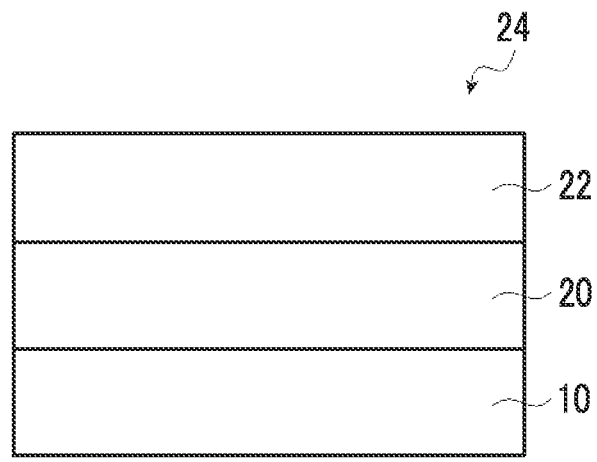
FIG. 12 is a cross-sectional view showing an embodiment of a laminate.

For example, the optically anisotropic layer may be combined with another optically anisotropic layer. That is, a laminate 24 including a substrate 10, an optically anisotropic layer 20 produced by the above-mentioned production method, and another optically anisotropic layer 22 may be prepared as shown in FIG. 12. Although the laminate 24 shown in FIG. 12 includes the substrate 10, the laminate may not include the substrate.

The other optically anisotropic layer is not particularly limited, and examples thereof include A-plates (a positive A-plate and a negative A-plate) and C-plates (a positive C-plate and a negative C-plate). Among them, the C-plate is preferable from the viewpoint that it can be easily applied to various applications (for example, a circularly polarizing plate) which will be described later.

The range of the absolute value of the retardation of the C-plate in a thickness direction at a wavelength of 550 nm is not particularly limited and is preferably 5 to 300 nm and more preferably 10 to 200 nm.

In the present specification, the A-plate and the C-plate are defined as follows.

There are two types of A-plates, a positive A-plate (A-plate which is positive) and a negative A-plate (A-plate which is negative). The positive A-plate satisfies the relationship of Expression (A1) and the negative A-plate satisfies the relationship of Expression (A2) in a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz. In addition, the positive A-plate has an Rth showing a positive value and the negative A-plate has an Rth showing a negative value.

$$nx > ny \approx nz \quad \text{Expression (A1)}$$

$$ny < nx \approx nz \quad \text{Expression (A2)}$$

It should be noted that the symbol "≈" encompasses not only a case where the both sides are completely the same as each other but also a case where the both sides are substantially the same as each other. The expression "substantially the same" means that, for example, a case where (ny−nz)×d (in which d is a thickness of a film) is −10 to 10 nm and preferably −5 to 5 nm is also included in "ny≈nz"; and a case where (nx−nz)×d is −10 to 10 nm and preferably −5 to 5 nm is also included in "nx≈nz".

There are two types of C-plates, a positive C-plate (C-plate which is positive) and a negative C-plate (C-plate which is negative). The positive C-plate satisfies the relationship of Expression (C1) and the negative C-plate satisfies the relationship of Expression (C2). In addition, the positive C-plate has an Rth showing a negative value and the negative C-plate has an Rth showing a positive value.

$$nz > nx \approx ny \quad \text{Expression (C1)}$$

$$nz < nx \approx ny \quad \text{Expression (C2)}$$

It should be noted that the symbol "≈" encompasses not only a case where the both sides are completely the same as each other but also a case where the both sides are substantially the same as each other. The expression "substantially the same" means that, for example, a case where (nx−ny)×d (in which d is a thickness of a film) is 0 to 10 nm and preferably 0 to 5 nm is also included in "nx≈ny".

The method for producing the above-mentioned laminate is not particularly limited, and a known method can be mentioned. For example, there is a method of laminating an optically anisotropic layer obtained by the above-mentioned production method and another optically anisotropic layer (for example, a C-plate) to obtain a laminate. As the method of laminating, another separately prepared optically anisotropic layer may be bonded onto the optically anisotropic layer obtained by the above-mentioned production method, or a composition for forming another optically anisotropic layer may be applied onto the optically anisotropic layer obtained by the above-mentioned production method to form another optically anisotropic layer.

Figure 13:
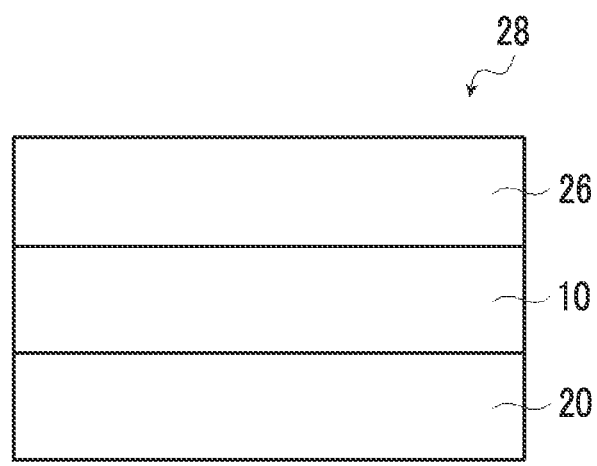
FIG. 13 is a cross-sectional view showing an embodiment of an optically anisotropic layer with a polarizer.

In addition, the optically anisotropic layer formed by the above-mentioned production method may be combined with a polarizer. That is, an optically anisotropic layer 28 with a polarizer, which includes a substrate 10, an optically anisotropic layer 20 formed by the above-mentioned production method, and a polarizer 26, may be prepared as shown in FIG. 13. In FIG. 13, the polarizer 26 is arranged on the substrate 10, but the present invention is not limited to this aspect and the polarizer 26 may be arranged on the optically anisotropic layer 20.

In addition, although the optically anisotropic layer 28 with a polarizer shown in FIG. 13 includes the substrate 10, the substrate may not be included in the optically anisotropic layer with a polarizer.

The positional relationship in a case where the optically anisotropic layer and the polarizer are laminated is not particularly limited. In a case where the optically anisotropic layer has, along a thickness direction, a first region in which the alignment state of the liquid crystal compound twist-aligned along a helical axis extending along a thickness direction is fixed and a second region in which the alignment state of the homogeneously aligned liquid crystal compound is fixed, the absolute value of the angle formed by the in-plane slow axis of the second region and the absorption axis of the polarizer is preferably 5° to 25° and more preferably 10° to 20° from the viewpoint that an optically anisotropic layer can be suitably applied to a circularly polarizing plate or the like.

In addition, it is preferable that, in a case where the angle formed by the in-plane slow axis of the second region and the absorption axis of the polarizer is negative, the twisted angle of liquid crystal compound in the first region is also negative; and it is preferable that, in a case where the angle formed by the in-plane slow axis of the second region and the absorption axis of the polarizer is positive, the twisted angle of liquid crystal compound in the first region is also preferably positive.

The case where the angle formed by the in-plane slow axis and the polarizer is negative means that the rotation angle of the in-plane slow axis is clockwise with reference to the absorption axis of the polarizer in a case of being visually recognized from the polarizer side; and the case where the angle formed by the in-plane slow axis and the polarizer is positive means that the rotation angle of the in-plane slow axis is counterclockwise with reference to the absorption axis of the polarizer in a case of being visually recognized from the polarizer side.

In addition, regarding the twisted angle of liquid crystal compound, in a case where the alignment axis direction of the liquid crystal compound on the back side is clockwise (right-hand turning) with reference to the alignment axis direction of the liquid crystal compound on the surface side (front side), it is expressed as negative; and in a case where such an alignment axis direction of the liquid crystal compound is counterclockwise (left-hand turning), it is expressed as positive.

The polarizer may be a member having a function of converting natural light into specific linearly polarized light, and examples thereof include an absorption type polarizer.

The type of the polarizer is not particularly limited, and a commonly used polarizer can be used. Examples of the polarizer include an iodine-based polarizer, a dye-based polarizer using a dichroic dye, and a polyene-based polarizer. The iodine-based polarizer and the dye-based polarizer are generally prepared by adsorbing iodine or a dichroic dye on a polyvinyl alcohol, followed by stretching.

A protective film may be arranged on one side or both sides of the polarizer.

The method for producing the optically anisotropic layer with a polarizer is not particularly limited, and a known method can be mentioned. For example, there is a method of laminating an optically anisotropic layer obtained by the above-mentioned production method and a polarizer to obtain an optically anisotropic layer with a polarizer.

Although the aspect in which an optically anisotropic layer and a polarizer are laminated has been described above, the above-mentioned laminate and a polarizer may be laminated to produce a laminate with a polarizer in the present invention.

The optically anisotropic layer can be applied to various applications. For example, the optically anisotropic layer can be suitably applied to a circularly polarizing plate, and the above-mentioned optically anisotropic layer with a polarizer can also be used as a circularly polarizing plate.

The circularly polarizing plate having the above configuration can be suitably used for antireflection applications of an image display apparatus such as a liquid crystal display device (LCD), a plasma display panel (PDP), an electroluminescent display (ELD), or a cathode tube display device (CRT) to improve a contrast ratio of display light.

For example, an aspect in which the circularly polarizing plate according to the embodiment of the present invention is used on a light extraction surface side of an organic EL display device can be mentioned. In a case where the circularly polarizing plate according to the embodiment of the present invention is applied to a light extraction surface side of an organic EL display device, the circularly polarizing plate according to the embodiment of the present invention functions as a circularly polarizing plate for an organic EL display. In this case, the external light is linearly polarized by a polarizing film and then passes through the optically anisotropic layer to become circularly polarized light. In a case where this circularly polarized light is reflected by a metal electrode, the circularly polarized state is reversed, and in a case where the circularly polarized light in the reversed state passes through the optically anisotropic layer again, the passed light becomes linearly polarized light tilted by 90° from the time of incidence, reaches the polarizing film, and is absorbed. As a result, the influence of external light can be suppressed.

Above all, the above-mentioned optically anisotropic layer with a polarizer or the above-mentioned laminate with a polarizer is preferably applied to an organic EL display device. That is, it is preferable that the optically anisotropic layer with a polarizer or the laminate with a polarizer is arranged on an organic EL panel of the organic EL display device and applied for antireflection applications.

The organic EL panel is a member in which a light emitting layer or a plurality of organic compound thin films including a light emitting layer are formed between a pair of electrodes of an anode and a cathode, and may have a hole injection layer, a hole transport layer, an electron injection layer, an electron transport layer, a protective layer, and the like in which each of these layers may have other functions, in addition to the light emitting layer. Various materials can be used to form each layer.

[Optical Film]

The present invention also relates to an optical film.

The optical film according to the embodiment of the present invention includes a substrate and an optically anisotropic layer formed of the liquid crystal composition according to the embodiment of the present invention arranged on the substrate.

The substrate is not particularly limited, and the substrate 10 described in the foregoing section of [Method for producing optically anisotropic layer using liquid crystal composition] is preferably used.

The optical film according to the embodiment of the present invention may have a configuration other than the substrate and the optically anisotropic layer.

Specific configurations of the optical film according to the embodiment of the present invention include a laminate consisting of a substrate and an optically anisotropic layer formed of the liquid crystal composition according to the embodiment of the present invention, and the same configuration as the above-mentioned laminate, and suitable embodiments thereof are also the same.

Examples

Hereinafter, the present invention will be described in more detail with reference to Examples. The materials, the used amount, the ratio, the contents of a treatment, and the procedures of a treatment described in Examples below may be suitably modified without departing from the spirit of the present invention. Therefore, the scope of the present invention should not be construed as being limited to the Examples set forth below.

[Preparation of Liquid Crystal Composition]

A liquid crystal composition was prepared by mixing the components shown in Table 1 with methyl ethyl ketone (MEK) such that the concentration of solid contents was 30% by mass. The solid content is intended to mean a component other than a solvent, and even in a case where the property of the component is liquid, it is regarded as a solid content.

TABLE 1

| | | Physical properties of chiral agent | | | Mass ratio in composition [phr] | | | | | | | |
| | | Molar absorption coefficient at wavelength of 365 nm [$M^{-1} \cdot cm^{-1}$] | Helical sense | Amount of change in helical twisting power | Example | | | | | | | |
| Various components | Details of components | | | | 1 | 3 | 4 | 5 | 6 | 7 | 8 | |
|---|---|---|---|---|---|---|---|---|---|---|---|---|
| Liquid crystal | Compound LC-1 | — | — | — | 100 | 100 | 100 | 100 | 100 | 100 | 100 | |
| Initiator | Omnirad 907 (manufactured by IGM Resins B.V.) | — | — | — | 0.5 | 0.5 | 0.5 | 0.5 | 0.5 | 0.5 | 0.5 | |
| Polymerization inhibitor | Irganox 1010 (manufactured by BASF SE) | — | — | — | 1 | 1 | 1 | 1 | 1 | 1 | 1 | |
| Alignment agent | Compound S-1 | — | — | — | 0.10 | 0.10 | 0.10 | 0.10 | 0.10 | 0.10 | 0.10 | |
| Chiral agent B | Compound B-1 | E | Left | D | 0.50 | 0.90 | 0.52 | — | — | — | 0.51 | |
| | Compound B-2 | E | Left | D | — | — | — | 0.27 | — | — | — | |
| | PALIOCOLOR LC 756 (manufactured by BASF SE) | E | Bight | D | — | — | — | — | 0.35 | 0.70 | — | |
| | Compound B-3 | D | Left | C | — | — | — | — | — | — | 0.25 | |
| Chiral agent A | Compound A-1 | A | Right | A | 0.42 | 0.76 | — | 0.42 | 0.42 | 0.42 | 0.42 | — |
| | Compound A-2 | A | Right | A | — | — | 0.35 | — | — | — | — | |
| | Compound A-3 | B | Right | A | — | — | — | — | — | — | — | 0.35 |
| | Compound A-4 | C | Right | A | — | — | — | — | — | — | — | |
| | Compound A-5 | C | Right | C | — | — | — | — | — | — | — | |
| | Compound A-6 | B | Right | B | — | — | — | — | — | — | — | |
| | Compound A-7 | A | Left | A | — | — | — | — | — | — | — | |

| | | Physical properties of chiral agent | | | Mass ratio in composition [phr] | | | | | | | |
| | | Molar absorption coefficient at wavelength of 365 nm [$M^{-1} \cdot cm^{-1}$] | Helical sense | Amount of change in helical twisting power | Example | | | | Comparative Example | | | |
| Various components | Details of components | | | | 9 | 10 | 11 | 12 | 1 | 2 | 3 | 4 |
|---|---|---|---|---|---|---|---|---|---|---|---|---|
| Liquid crystal | Compound LC-1 | — | — | — | 100 | 100 | 100 | 100 | 100 | 100 | 100 | 100 |
| Initiator | Omnirad 907 (manufactured by IGM Resins B.V.) | — | — | — | 0.5 | 0.5 | 0.5 | 0.5 | 0.5 | 0.5 | 0.5 | 0 5 |
| Polymerization inhibitor | Irganox 1010 (manufactured by BASF SE) | — | — | — | 1 | 1 | 1 | 1 | 1 | 1 | 1 | 1 |
| Alignment agent | Compound S-1 | — | — | — | 0.10 | 0.10 | 0.10 | 0.10 | 0.10 | 0.10 | 0.10 | 0.10 |
| Chiral agent B | Compound B-1 | E | Left | D | 0.70 | 0.42 | 0.42 | 0.30 | 1.70 | 3.90 | 1.80 | — |
| | Compound B-2 | E | Left | D | — | — | — | — | — | — | — | — |
| | PALIOCOLOR LC 756 (manufactured by BASF SE) | E | Bight | D | — | — | — | — | — | — | — | 0.60 |
| | Compound B-3 | D | Left | C | — | — | — | — | — | — | — | 0.42 |
| Chiral agent A | Compound A-1 | A | Right | A | — | — | — | — | 0.09 | 1.43 | 3.27 | — |
| | Compound A-2 | A | Right | A | — | — | — | — | — | — | — | — |
| | Compound A-3 | B | Right | A | — | — | — | — | — | — | — | — |
| | Compound A-4 | C | Right | A | 0.43 | — | — | — | — | — | 1.09 | — |
| | Compound A-5 | C | Right | C | — | 0.43 | — | — | — | — | — | — |
| | Compound A-6 | B | Right | B | — | — | 0.53 | — | — | — | — | — |
| | Compound A-7 | A | Left | A | — | — | — | 0.50 | — | — | — | — |

Hereinafter, various components contained in the liquid crystal composition shown in Table 1 are shown.

[Liquid Crystal Compound]

The liquid crystal compound (Compound LC-1) used in the liquid crystal composition shown in Table 1 is shown below.

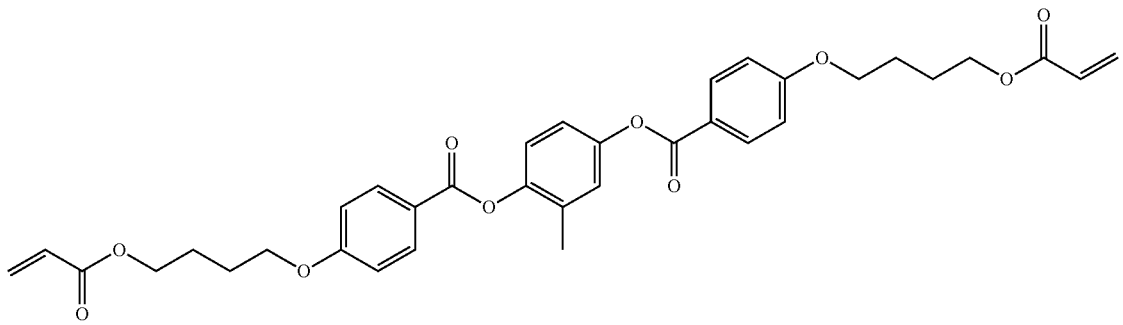
(Compound LC-1)

[Alignment Agent]

The alignment agent (Compound S-1) used in the liquid crystal composition shown in Table 1 is shown below.

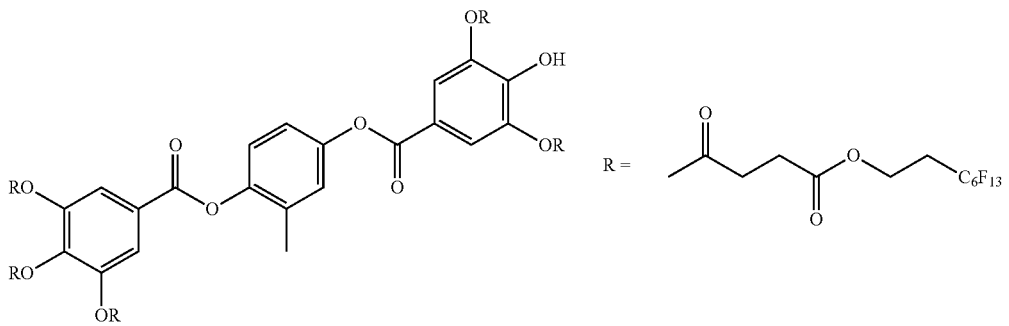
(Compound S-1)

[Chiral Agent B]

The chiral agents B (Compounds B-1 to B-3) used in the liquid crystal composition shown in Table 1 are shown below.

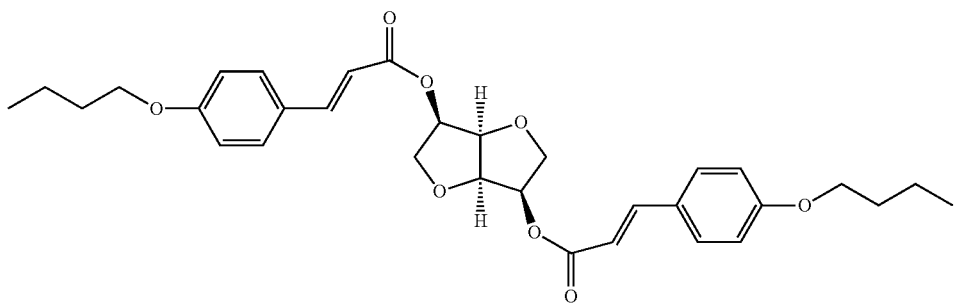
B-1

-continued
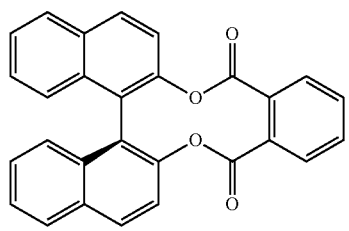
B-2
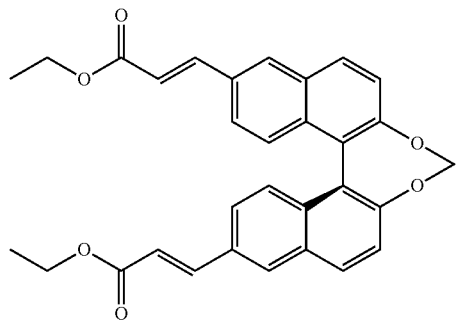
B-3
[Chiral Agent A]
The chiral agents A (Compounds A-1 to A-7) used in the liquid crystal composition shown in Table 1 are shown below.
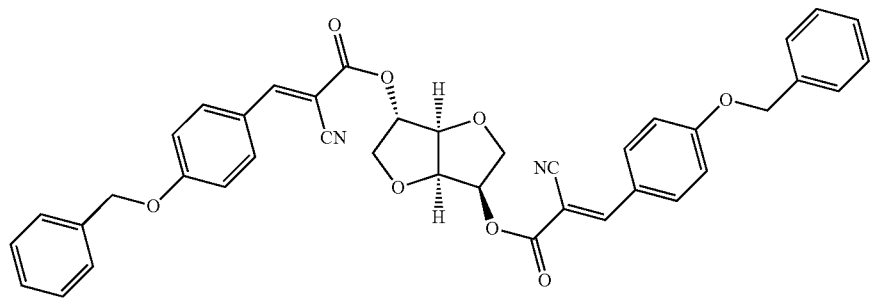
A-1
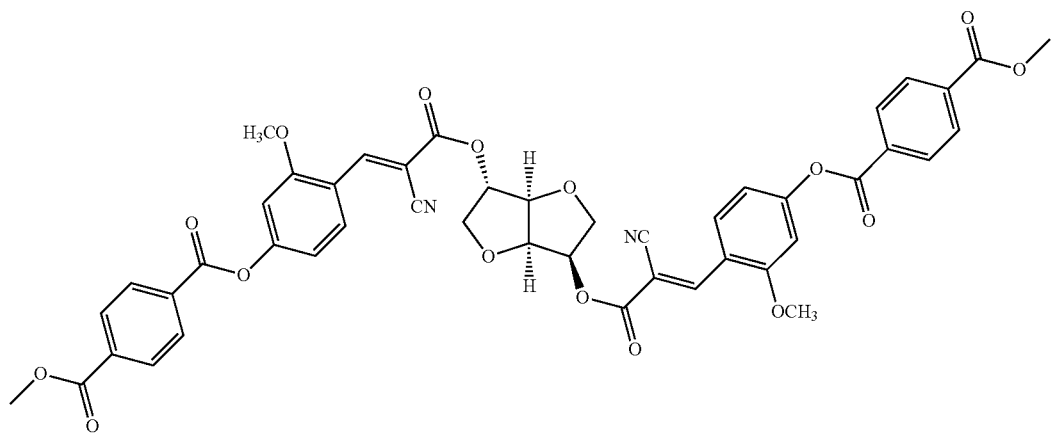
A-2

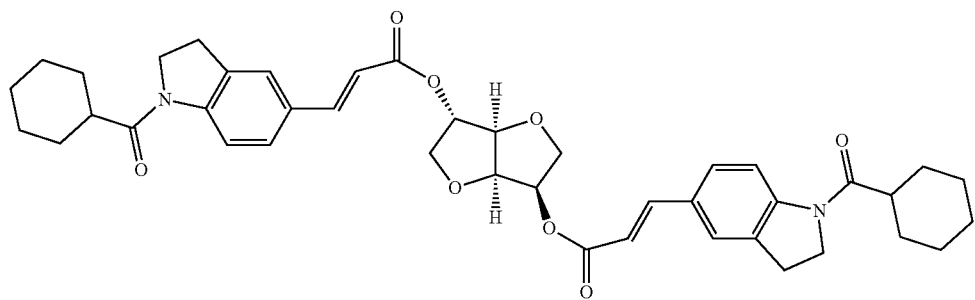
A-3
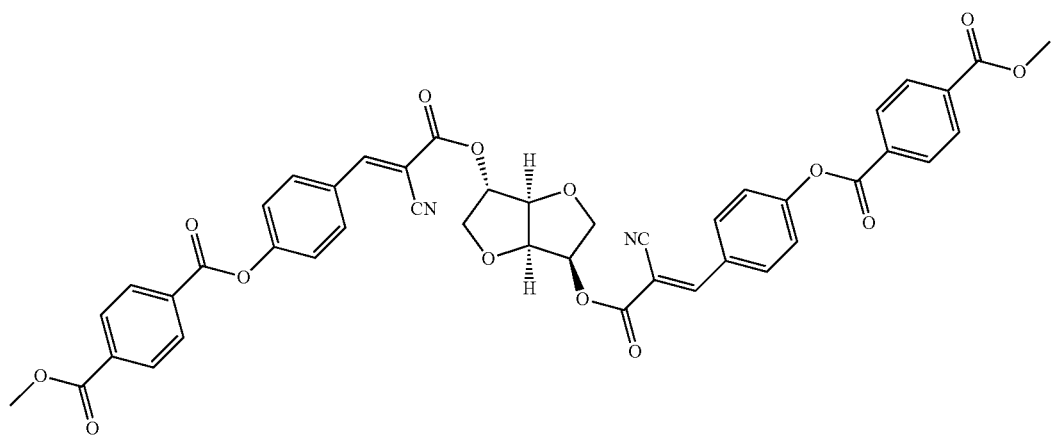
A-4
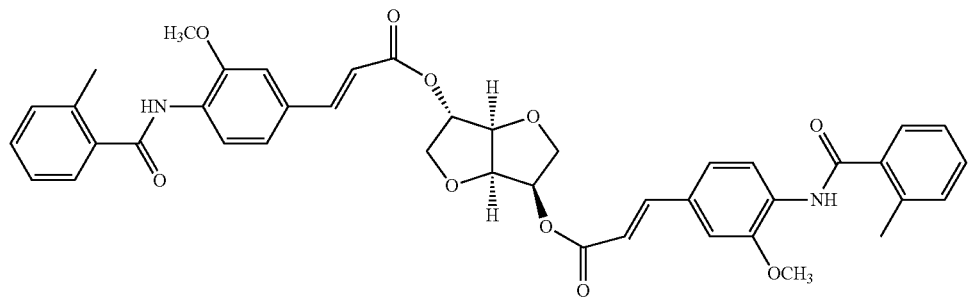
A-5
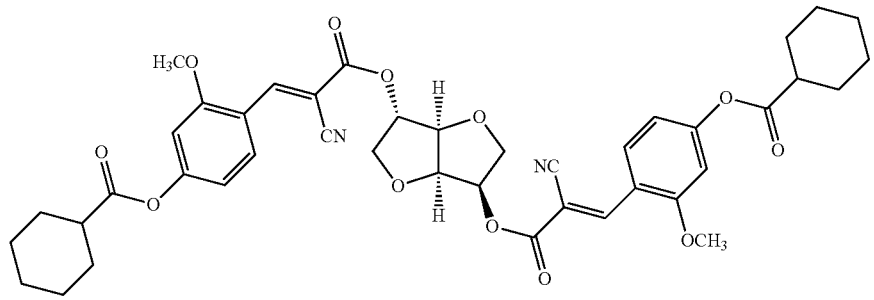
A-6

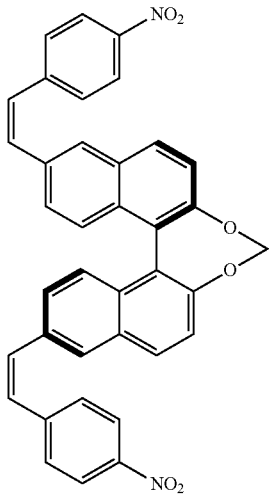

A-7

[Measurement of Physical Properties of Chiral Agent]

The following physical properties were measured for each chiral agent used in the liquid crystal composition shown in Table 1.

[Measurement of Molar Absorption Coefficient with Respect to Light Having Wavelength of 365 nm]

1.00 mg of the chiral agent was accurately weighed and dissolved in acetonitrile to make a volume of 100 mL. The molar absorption coefficient with respect to light having a wavelength of 365 nm (hereinafter abbreviated as "$\varepsilon_{365}$") [$M^{-1} \cdot cm^{-1}$] was measured using a spectroscope (UV-3100, manufactured by Shimadzu Corporation).

<<Molar Absorption Coefficient>>

"A": $\varepsilon_{365}$ is 30,000 [$M^{-1} \cdot cm^{-1}$] or more.

"B": $\varepsilon_{365}$ is 15,000 [$M^{-1} \cdot cm^{-1}$] or more and less than 30,000 [$M^{-1} \cdot cm^{-1}$].

"C": $\varepsilon_{365}$ is 5,000 [$M^{-1} \cdot cm^{-1}$] or more and less than 15,000 [$M^{-1} \cdot cm^{-1}$].

"D": $\varepsilon_{365}$ is 1,000 [$M^{-1} \cdot cm^{-1}$] or more and less than 5,000 [$M^{-1} \cdot cm^{-1}$].

"E": $\varepsilon_{365}$ is less than 1,000 [$M^{-1} \cdot cm^{-1}$].

[Measurement of Helical Sense and Amount of Change in Helical Twisting Power]

The liquid crystal compound LC-1 and the chiral agent were mixed. Then, a solvent was added to the obtained mixture to prepare a sample solution having the following composition.

| | |
|---|---|
| Liquid crystal compound (Compound LC-1 described above) | 100 parts by mass |
| Chiral agent (each chiral agent listed in Table 1) | 5.0 parts by mass |
| Solvent (MEK/cyclohexanone = 90/10 (mass ratio)) | added to make a solute concentration of 30% by mass |

Next, a polyimide alignment film SE-130 (manufactured by Nissan Chemical Corporation) was applied onto a washed glass substrate to form a coating film. The obtained coating film was baked and then subjected to a rubbing treatment to prepare a substrate with an alignment film. 30 μL of the sample solution was spin-coated on the rubbing-treated surface of this alignment film under the conditions of a rotation speed of 1000 rpm for 10 seconds, followed by aging at 90° C. for 1 minute to obtain a liquid crystal layer.

The central reflection wavelength of the liquid crystal layer was measured using a spectroscope (UV-3100, manufactured by Shimadzu Corporation) (central reflection wavelength before exposure to light). In addition, the helical sense of the chiral agent was confirmed from the difference in reflectivity in a case where the left-handed circularly polarized light and right-handed circularly polarized light were incident.

Subsequently, the liquid crystal layer was irradiated with light having a wavelength of 365 nm at an illuminance of 30 mW/cm² for 1 second, and then the central reflection wavelength was measured (central reflection wavelength after exposure to light).

The amount of change in helical twisting power [μm⁻¹] was calculated by Expression (1).

Amount of change in helical twisting power=(average refractive index of liquid crystal compound)/{(concentration (% by mass) of chiral agent with respect to total solid content in liquid crystal composition)×(central reflection wavelength (nm) before exposure to light))−(average refractive index of liquid crystal compound)/((concentration (% by mass) of chiral agent with respect to total solid content in liquid crystal composition)×(central reflection wavelength (nm) after exposure to light)} [μm⁻¹]   Expression (1)

In Expression (1), the HTP was calculated on the assumption that the "average refractive index of liquid crystal compound" was 1.55.

<<Amount of Change in Helical Twisting Power>>

"A": The amount of change in the helical twisting power is 30 [μm⁻¹] or more.

"B": The amount of change in the helical twisting power is 20 [μm⁻¹] or more and less than 30 [μm⁻¹].

"C": The amount of change in the helical twisting power is 5 [μm⁻¹] or more and less than 20 [μm⁻¹].

"D": The amount of change in the helical twisting power is less than 5 [μm⁻¹].

[Measurement of Physical Properties of Liquid Crystal Composition]

[Measurement of Weighted Average Helical Twisting Power (Weighted Average HTP), Amount of Change in Weighted Average Helical Twisting Power, and Coefficient of Variation in Twisted Angle]

<Preparation of Optically Anisotropic Layer>

A polyimide alignment film SE-130 (manufactured by Nissan Chemical Corporation) was applied and baked on a washed glass substrate and then subjected to a rubbing treatment to prepare a substrate with an alignment film. On the rubbing-treated surface of this alignment film, 30 µL of the liquid crystal composition shown in Table 1 was spin-coated on a glass substrate under the conditions of 1,000 rpm and 10 seconds to form a composition layer 1 (corresponding to a step 1).

Next, the obtained composition layer was aged at 90° C. for 1 minute to form a liquid crystal layer 1 (corresponding to a step 2). This heating resulted in alignment of the rod-like liquid crystal compound of the composition layer in a predetermined direction.

Here, the film thickness and the twisted angle of the obtained liquid crystal layer 1 were measured using AxoScan (manufactured by Axometrics, Inc.).

In addition, the weighted average helical twisting power before exposure to light was calculated by Expression (2).

(Weighted average helical twisting power)=1/{(360/twisted angle [°])×film thickness [µm]×concentration (% by mass) of chiral agent with respect to total solid content in liquid crystal composition} [µm$^{-1}$]   Expression (2)

<<Weighted Average Helical Twisting Power Before Exposure to Light>>

"A": The weighted average helical twisting power is less than 0.5 µm$^{-1}$ [µm$^{-1}$].

"B": The weighted average helical twisting power is 0.5 µm$^{-1}$ or more [µm$^{-1}$].

Then, in the atmosphere, the liquid crystal layer 1 was irradiated with ultraviolet rays (exposure to light for 1 second at an illuminance of 30 mW/cm$^2$) using a 365 nm LED lamp (manufactured by AcroEdge Co., Ltd.) (corresponding to a step 3).

Subsequently, the liquid crystal layer 1 after exposure to light was heated at 90° C. for 60 seconds (corresponding to a step 5).

An optical film having a substrate and an optically anisotropic layer arranged on the substrate was prepared by the above procedure.

Here, using AxoScan (manufactured by Axometrics, Inc.), the film thickness and the twisted angle were measured at any 10 points in the in-plane direction of the optically anisotropic layer formed by the above procedure. In addition, an average value and a standard deviation were calculated from the obtained measured values of the twisted angle. The AVERAGE function of Excel was used to calculate the average value, and the STDEVP function was used to calculate the standard deviation.

Next, the amount of change in the weighted average helical twisting power was calculated by Expression (3), based on the obtained average value of the twisted angle.

(Amount of change in weighted average helical twisting power)=|1/{(360/twisted angle before exposure to light)×film thickness [µm] before exposure to light×concentration (% by mass) of chiral agent with respect to total solid content in liquid crystal composition}−1/{(360/twisted angle after exposure to light)×film thickness [µm] after exposure to light×concentration (% by mass) of chiral agent with respect to total solid content in liquid crystal composition}| [µm$^{-1}$]   Expression (3)

<<Amount of Change in Weighted Average Helical Twisting Power>>

"A": The amount of change is 15 [µm$^{-1}$] or more.

"B": The amount of change is 10 [µm$^{-1}$] or more and less than 15 [µm$^{-1}$].

"C": The amount of change is less than 10 [µm$^{-1}$].

Further, the coefficient of variation of the twisted angle after exposure to light was calculated by Expression (4), based on the obtained average value and standard deviation of the twisted angle.

Coefficient of variation=standard deviation/average value×100 [%]   Expression (4)

<<Coefficient of Variation of Twisted Angle>>

"A": The coefficient of variation is less than 2%.

"B": The coefficient of variation is 2% or more and less than 4%.

"C": The coefficient of variation is 4% or more and less than 7%.

"D": The coefficient of variation is 7% or more and less than 10%.

"E": The coefficient of variation is 10% or more.

<<Change of Alignment Before and After Exposure to Light>>

Regarding the alignment state (twisted alignment or homogeneous alignment) of the optically anisotropic layer, a case where the twisted angle is approximately 0° in the measurement result of the twisted angle by AxoScan (manufactured by Axometrics, Inc.) is defined as the homogeneous alignment, a case where the twisted angle is positive is defined as the right twisted alignment, and a case where the twisted angle is negative is defined as the left twisted alignment.

Table 2 is shown below.

TABLE 2

|  | Example | | | | | | | |
|---|---|---|---|---|---|---|---|---|
|  | 1 | 2 | 3 | 4 | 5 | 6 | 7 | 8 |
| Weighted average helical twisting power before exposure to light | A | A | A | A | B | B | A | A |

TABLE 2-continued

| | | | | | | | | |
|---|---|---|---|---|---|---|---|---|
| Amount of change in weighted average helical twisting power | A | A | A | A | A | B | A | A |
| Coefficient of variation of twisted angle | A | B | A | A | A | A | B | B |
| Change of alignment before and after exposure to light | Homogeneous alignment ↓ Twisted alignment (left) | Homogeneous alignment ↓ Twisted alignment (left) | Homogeneous alignment ↓ Twisted alignment (left) | Homogeneous alignment ↓ Twisted alignment (left) | Twist alignment (right) ↓ Twisted alignment (right) | Twist alignment (right) ↓ Twisted alignment (right) | Homogeneous alignment ↓ Twisted alignment (left) | Homogeneous alignment ↓ Twisted alignment (left) |

| | Example | | | | Comparative Example | | | |
|---|---|---|---|---|---|---|---|---|
| | 9 | 10 | 11 | 12 | 1 | 2 | 3 | 4 |
| Weighted average helical twisting power before exposure to light | A | A | A | B | A | A | A | A |
| Amount of change in weighted average helical twisting power | B | C | B | A | A | A | B | C |
| Coefficient of variation of twisted angle | C | C | B | A | D | E | E | E |
| Change of alignment before and after exposure to light | Homogeneous alignment ↓ Twisted alignment (left) | Homogeneous alignment ↓ Twisted alignment (left) | Homogeneous alignment ↓ Twisted alignment (left) | Twist alignment (right) ↓ Twisted alignment (left) | Homogeneous alignment ↓ Twisted alignment (left) | Homogeneous alignment ↓ Twisted alignment (left) | Homogeneous alignment ↓ Twisted alignment (left) | Homogeneous alignment ↓ Twisted alignment (right) |

From the results in Table 1, it is clear that the optically anisotropic layers formed by the liquid crystal compositions of Examples have a small coefficient of variation of the twisted angle.

In addition, upon comparing Example 1, Example 2, Comparative Example 1, and Comparative Example 2, it can be seen that the coefficient of variation of the twisted angle decreases as the formulation amount of the optically active compound A decreases.

Examples 5 and 6 are aspects of the case in which the helical direction of the helix induced by the optically active compound A and the helical direction of the helix induced by the optically active compound B are the same direction. In this case, the change of alignment before and after exposure to light is a change from twisted alignment to twisted alignment. It can be seen that the amount of change in the weighted average helical twisting power of the liquid crystal composition can be controlled by changing the formulation ratio of the optically active compound A and the optically active compound B.

Example 12 is an aspect of the case in which the helical direction of the helix induced by the optically active compound A and the helical direction of the helix induced by the optically active compound B are opposite to each other, and the weighted average helical twisting power before exposure to light is 0.5 $\mu m^{-1}$ or more. In this case, the change of alignment before and after exposure to light is a change from twisted alignment to twisted alignment, but the helical direction before and after exposure to light is changed unlike Examples 5 and 6. In other words, according to the liquid crystal composition of Example 12, it can be seen that the alignment can be changed to the twisted alignment in which the helical direction is reversed after exposure to light (note that, depending on the types and formulation ratios of the optically active compound A and the optically active compound B, the alignment can be changed to the twisted alignment in which the helical direction is the same, as in Examples 5 and 6.).

In addition, Examples other than Examples 5, 6 and 12 are aspects of the case in which the helical direction of the helix induced by the optically active compound A and the helical direction of the helix induced by the optically active compound B are opposite to each other, and the weighted average helical twisting power before exposure to light is less than 0.5 $\mu m^{-1}$. In a case of the above aspects, it can be seen that a change from homogenous alignment to twisted alignment can occur.

In addition, from the results of Examples 9 and 10, it can be seen that, in a case where the molar absorption coefficient of the optically active compound A with respect to light having a wavelength of 365 nm is small, the amount of change in the weighted average helical twisting power of the liquid crystal composition becomes small and the coefficient of variation of the twisted angle becomes large.

Figure 14:
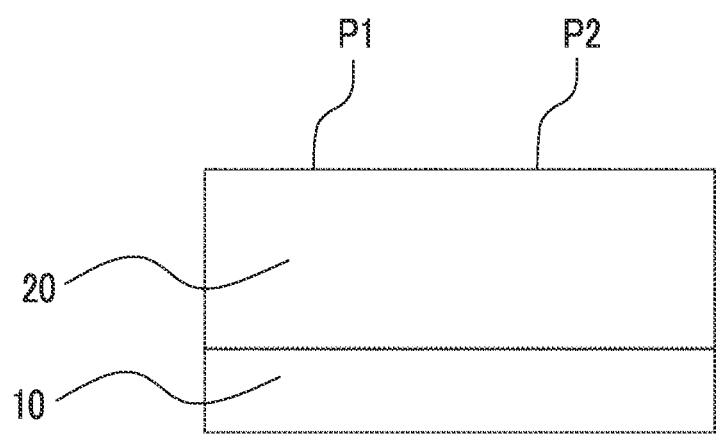
FIG. 14 is a cross-sectional view for explaining a coefficient of variation of a twisted angle.

On the other hand, it was confirmed that the optically anisotropic layers formed by the liquid crystal compositions of Comparative Examples had a large coefficient of variation of the twisted angle in an in-plane direction. The coefficient of variation of the twisted angle in the in-plane direction of the optically anisotropic layer in Comparative Examples is large means that the twisted angles are significantly different at different positions (P1 and P2) in the in-plane direction of the optically anisotropic layer, for example, as shown in FIG. 14.

[Preparation of Optical Film]
[Preparation of Cellulose Acylate Film (Substrate)]

The following composition was put into a mixing tank, stirred, and further heated at 90° C. for 10 minutes. Then, the obtained composition was filtered through a filter paper having an average pore diameter of 34 μm and a sintered metal filter having an average pore diameter of 10 μm to prepare a dope. The concentration of solid contents of the dope is 23.5% by mass, the amount of the plasticizer added is a proportion relative to cellulose acylate, and the solvent of the dope is methylene chloride/methanol/butanol=81/18/1 (in terms of a mass ratio).

| Cellulose acylate dope | |
|---|---|
| Cellulose acylate (acetyl substitution degree: 2.86, viscosity average degree of polymerization: 310) | 100 parts by mass |
| Sugar ester compound 1 (shown in Chemical Formula (S4)) | 6.0 parts by mass |
| Sugar ester compound 2 (shown in Chemical Formula (S5)) | 2.0 parts by mass |
| Silica particle dispersion (AEROSIL R972, manufactured by Nippon Aerosil Co., Ltd.) | 0.1 parts by mass |
| Solvent (methylene chloride/methanol/butanol) | |

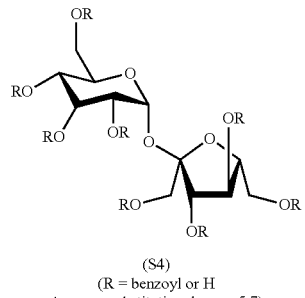

(S4)
(R = benzoyl or H
Average substitution degree: 5.7)

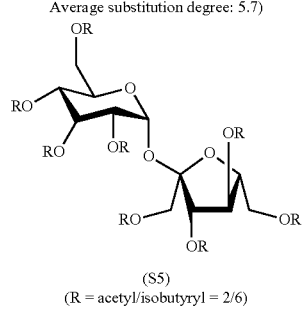

(S5)
(R = acetyl/isobutyryl = 2/6)

The dope prepared above was cast using a drum film forming machine. The dope was cast from a die such that it was in contact with a metal support cooled to 0° C., and then the obtained web (film) was stripped off. The drum was made of SUS.

The web (film) obtained by casting was peeled off from the drum and then dried in a tenter device for 20 minutes at 30° C. to 40° C. during film transport, using the tenter device that clips both ends of the web with clips to transport the film. Subsequently, the web was post-dried by zone heating while being rolled. The obtained web was knurled and then wound up.

The obtained cellulose acylate film had a film thickness of 40 μm, an in-plane retardation Re (550) of 1 nm at a wavelength of 550 nm, and a thickness direction retardation Rth (550) of 26 nm.

(Formation of Optically Anisotropic Layer)

The above prepared cellulose acylate film was continuously subjected to a rubbing treatment. At this time, the longitudinal direction and the transport direction of the elongated film were parallel, and the angle between the film longitudinal direction (transport direction) and the rubbing roller rotation axis was 76.0°. In a case where the film longitudinal direction (transport direction) is 90° and the clockwise direction is represented by a positive value with reference to a film width direction as a reference (0°) in a case of being observed from the film side, the rotation axis of the rubbing roller is at 14.0°. In other words, the position of the rotation axis of the rubbing roller is a position rotated by 76.0° counterclockwise with reference to the longitudinal direction of the film.

Using the rubbing-treated cellulose acylate film as a substrate, a composition (1) for forming an optically anisotropic layer containing a rod-like liquid crystal compound having the following composition was applied using a Geeser coating machine to form a composition layer. The absolute value of the weighted average helical twisting power of the chiral agent in the composition layer in the step 1 was 0.0 μm$^{-1}$.

Next, the obtained composition layer was heated at 80° C. for 60 seconds. This heating resulted in alignment of the rod-like liquid crystal compound of the composition layer in a predetermined direction.

This was followed by irradiation with ultraviolet rays (70 mJ/cm$^2$) using a 365 nm LED lamp (manufactured by AcroEdge Co., Ltd.) at 30° C. under oxygen-containing air.

Subsequently, the obtained composition layer was heated at 80° C. for 10 seconds.

This was followed by nitrogen purging and then irradiation with ultraviolet rays (500 mJ/cm$^2$) using a metal halide lamp (manufactured by Eye Graphics Co., Ltd.) at 80° C. with an oxygen concentration of 100 ppm by volume to form an optically anisotropic layer in which the alignment state of the liquid crystal compound was fixed. An optical film (F-1) was prepared in this manner.

| Composition of composition (1) for forming optically anisotropic layer | |
|---|---|
| Rod-like liquid crystal compound (A) given below | 100 parts by mass |
| Ethylene oxide-modified trimethylolpropane triacrylate (V# 360, manufactured by Osaka Organic Chemical Industry Ltd.) | 4 parts by mass |

-continued

| Composition of composition (1) for forming optically anisotropic layer | |
|---|---|
| Photopolymerization initiator (Irgacure 907, manufactured by BASF SE) | 6 parts by mass |
| Chiral agent (A-1) given above | 0.48 parts by mass |
| Chiral agent (B-1) given above | 0.58 parts by mass |
| Polymerizable monomer (A) given below | 5 parts by mass |
| Polymerizable monomer (B) given below | 5 parts by mass |
| Polymer (A) given below | 0.25 parts by mass |
| Polymer (B) given below | 0.10 parts by mass |
| Butyl acetate | 325 parts by mass |

Rod-like liquid crystal compound (A)

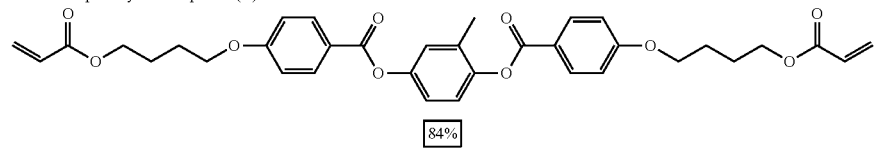

84%

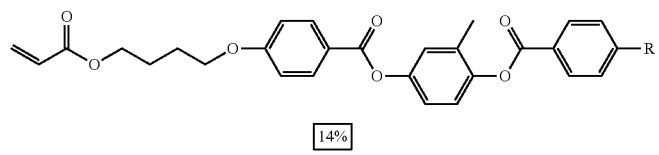

14%

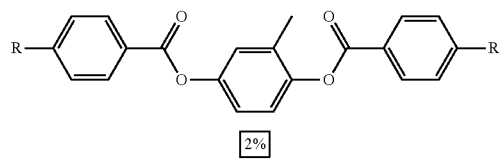

2%

Polymerizable monomer (A)

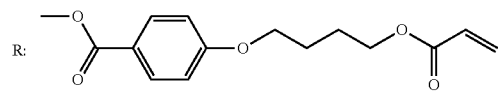

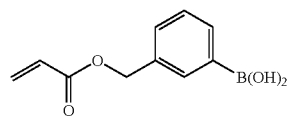

Polymerizable monomer (B)

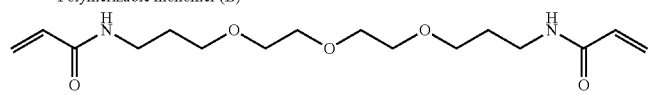

Polymer (A) (In the formula, the numerical value described in each repeating unit represents the content (% by mass) of each repeating unit with respect to all the repeating units).

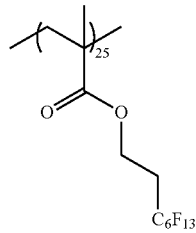 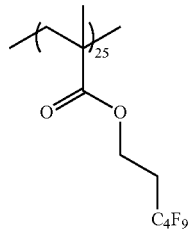

-continued

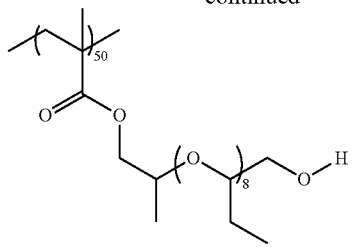

Polymer (B) (In the formula, the numerical value described in each repeating unit represents the content (% by mass) of each repeating unit with respect to all the repeating units).

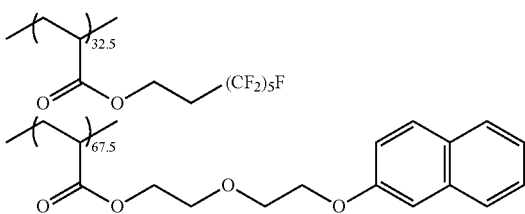

The above prepared optical film (F-1) was cut in parallel with the rubbing direction, and the optically anisotropic layer was observed from the cross-sectional direction with a polarization microscope. The thickness of the optically anisotropic layer was 2.2 μm, the region (second region) having a thickness of 1.2 μm on the optically anisotropic layer on the substrate side had a homogeneous alignment without a twisted angle, and the region (first region) having a thickness of 1.1 μm on the air side (side opposite to the substrate) of the optically anisotropic layer had a twisted alignment of the liquid crystal compound.

The optical properties of the optical film (F-1) were determined using Axoscan of Axometrics, Inc. and analysis software (Multi-Layer Analysis) of Axometrics, Inc. In the second region, the Δn2d2 at a wavelength of 550 nm was 168 nm, the twisted angle of liquid crystal compound was 0°, and the alignment axis angle of liquid crystal compound with respect to a long longitudinal direction was −14.0° on the side in contact with the substrate and −14.0° on the side in contact with the first region.

In addition, in the first region, the Δn1d1 was 164 nm, the twisted angle of liquid crystal compound was 81°, and the alignment axis angle of liquid crystal compound with respect to a long longitudinal direction was −14.0° on the side in contact with the second region and −95.0° on the air side.

The alignment axis angle of the liquid crystal compound contained in the optically anisotropic layer is expressed as negative in a case where it is clockwise (right-hand turning) and positive in a case where it is counterclockwise (left-hand turning) with the longitudinal direction of the substrate as a reference of 0°, upon observing the substrate from the surface side of the optically anisotropic layer.

In addition, the twisted structure of the liquid crystal compound here is expressed as negative in a case where the alignment axis direction of the liquid crystal compound on the substrate side (back side) is clockwise (right-hand turning) and positive in a case where it is counterclockwise (left-hand turning) with reference to the alignment axis direction of the liquid crystal compound on the surface side (front side), upon observing the substrate from the surface side of the optically anisotropic layer.

(Preparation of Polarizer)

A polyvinyl alcohol (PVA) film having a thickness of 80 μm was dyed by immersing it in an iodine aqueous solution having an iodine concentration of 0.05% by mass at 30° C. for 60 seconds. Next, the obtained film was machine-direction stretched 5 times its original length while immersed in a boric acid aqueous solution having a boric acid concentration of 4% by mass for 60 seconds, and then dried at 50° C. for 4 minutes to obtain a polarizer having a thickness of 20 μm.

(Preparation of Polarizer Protective Film)

A commercially available cellulose acylate-based film FUJITAC TG40UL (manufactured by FUJIFILM Corporation) was prepared and immersed at 1.5 mol/liter in a sodium hydroxide aqueous solution at 55° C., and then the sodium hydroxide was thoroughly washed away with water. Thereafter, the obtained film was immersed at 0.005 mol/liter in a dilute sulfuric acid aqueous solution at 35° C. for 1 minute, and then immersed in water to thoroughly wash away the dilute sulfuric acid aqueous solution. Finally, the obtained film was sufficiently dried at 120° C. to prepare a polarizer protective film whose surface was subjected to a saponification treatment.

(Preparation of Circularly Polarizing Plate)

The above prepared optical film (F-1) was subjected to a saponification treatment in the same manner as in the preparation of a polarizer protective film described above. Using a polyvinyl alcohol-based adhesive, the above-mentioned polarizer and the above-mentioned polarizer protective film were continuously bonded to the substrate surface contained in the optical film (F-1) to prepare a long circularly polarizing plate (P-1). That is, the circularly polarizing plate (P-1) had a polarizer protective film, a polarizer, a substrate, and an optically anisotropic layer in this order.

The absorption axis of the polarizer coincided with the longitudinal direction of the circularly polarizing plate, the rotation angle of the in-plane slow axis of the second region with respect to the absorption axis of the polarizer was 14.0°, and the rotation angle of the in-plane slow axis of the surface of the first region opposite to the second region side with respect to the absorption axis of the polarizer was 95.0°.

The rotation angle of the in-plane slow axis is represented by a positive angle value in a case where it is counterclockwise and a negative angle value in a case where it is clockwise with the longitudinal direction of the substrate as a reference of 0°, upon observing the optically anisotropic layer from the polarizer side.

<Preparation of Organic EL Display Device and Evaluation of Display Performance>

(Mounting on Display Device)

The SAMSUNG GALAXY S4 equipped with an organic EL panel was disassembled, a circularly polarizing plate was peeled off, and the circularly polarizing plate (P-1) prepared in the foregoing Example was attached to the display device such that the polarizer protective film was placed on the outside. As a result of displaying in black on the organic EL display device and observing from front and oblique directions under bright light, variations in reflectivity and tint were not observed in the panel surface, and the reflectivity and tint were uniform and good antireflection performance by the circularly polarized plate was confirmed.

EXPLANATION OF REFERENCES

10: substrate
12, 120: composition layer
12A, 120A: lower region
12B, 120B: upper region
20: optically anisotropic layer
22: another optically anisotropic layer
24: laminate
26: polarizer
28: optically anisotropic layer with polarizer
P1, P2: certain position of optically anisotropic layer in in-plane direction

What is claimed is:
1. A liquid crystal composition comprising:
a liquid crystal compound,
an optically active compound A which is a photosensitive optically active compound whose helical twisting power changes upon irradiation with light and has a molar absorption coefficient of 5,000 $M^{-1} \cdot cm^{-1}$ or more with respect to light having a wavelength of 365 nm; and an optically active compound B having a molar absorption coefficient with respect to light having a wavelength of 365 nm smaller than the molar absorption coefficient of the optically active compound A, wherein a mass content ratio of the optically active compound A to the liquid crystal compound is less than 0.01.

2. The liquid crystal composition according to claim 1, wherein the optically active compound A has a molar absorption coefficient of 15,000 $M^{-1} \cdot cm^{-1}$ or more with respect to light having a wavelength of 365 nm.

3. The liquid crystal composition according to claim 2, wherein the optically active compound B has a molar absorption coefficient of less than 1,000 $M^{-1} \cdot cm^{-1}$ with respect to light having a wavelength of 365 nm.

4. The liquid crystal composition according to claim 2, wherein the liquid crystal compound is a polymerizable liquid crystal compound.

5. The liquid crystal composition according to claim 2, wherein a helical direction of a helix induced by the optically active compound A is opposite to a helical direction of a helix induced by the optically active compound B.

6. The liquid crystal composition according to claim 1, wherein the optically active compound B has a molar absorption coefficient of less than 1,000 $M^{-1} \cdot cm^{-1}$ with respect to light having a wavelength of 365 nm.

7. The liquid crystal composition according to claim 1, wherein the liquid crystal compound is a polymerizable liquid crystal compound.

8. The liquid crystal composition according to claim 1, wherein a helical direction of a helix induced by the optically active compound A is opposite to a helical direction of a helix induced by the optically active compound B.

9. The liquid crystal composition according to claim 1, wherein an absolute value of a weighted average helical twisting power based on all the optically active compounds contained in the liquid crystal composition is 0.0 $\mu m^{-1}$ or more and less than 0.5 $\mu m^{-1}$.

10. The liquid crystal composition according to claim 1, wherein the helical twisting power of the optically active compound A changes by 20 $\mu m^{-1}$ or more upon irradiation with light having a wavelength of 365 nm at an illuminance of 30 $mW/cm^2$ for 1 second.

11. The liquid crystal composition according to claim 1, wherein the helical twisting power of the optically active compound B does not change by 5 $\mu m^{-1}$ or more upon irradiation with light having a wavelength of 365 nm at an illuminance of 30 $mW/cm^2$ for 1 second.

12. The liquid crystal composition according to claim 1, wherein the optically active compound A and the optically active compound B have a partial structure of any one of a binaphthyl partial structure, an isosorbide partial structure, or an isomannide partial structure.

13. The liquid crystal composition according to claim 1, wherein the optically active compound A has a group containing a photoisomerizable double bond.

14. The liquid crystal composition according to claim 13, wherein the group containing a photoisomerizable double bond is a cyanocinnamoyl group.

15. The liquid crystal composition according to claim 1, wherein a mass content ratio of the optically active compound A to the liquid crystal compound is equal to or less than 0.006.

16. An optical film comprising:
a substrate; and
an optically anisotropic layer formed of the liquid crystal composition according to claim 1 arranged on the substrate.

17. The optical film according to claim 16, wherein the optically anisotropic layer has, along a thickness direction, a first region in which an alignment state of the liquid crystal compound twist-aligned along a helical axis extending along a thickness direction is fixed, and a second region in which an alignment state of a homogeneously aligned liquid crystal compound is fixed.

18. A circularly polarizing plate for an organic EL display, comprising:
the optical film according to claim 16; and
a polarizer.

19. A method for producing an optically anisotropic layer, comprising:
a step 1 of forming a composition layer on a substrate using the liquid crystal composition according to claim 1;
a step 2 of subjecting the composition layer to a heat treatment to align the liquid crystal compound in the composition layer;
a step 3 of subjecting the composition layer to light irradiation under a condition of an oxygen concentration of 1% by volume or more, after the step 2; and
a step 4 of subjecting the light-irradiated composition layer to a curing treatment to fix an alignment state of the liquid crystal compound to form an optically anisotropic layer having a plurality of regions having different alignment states of the liquid crystal compound along a thickness direction,
wherein a step 5 of carrying out the step 3 under heating conditions, or subjecting the composition layer to a heat treatment between the step 3 and the step 4 is further provided.

20. The method for producing an optically anisotropic layer according to claim 19, wherein the optically anisotropic layer has, along a thickness direction, a first region in which the alignment state of the liquid crystal compound twist-aligned along a helical axis extending along a thickness direction is fixed, and a second region in which the alignment state of a homogeneously aligned liquid crystal compound is fixed.

* * * * *